(12) United States Patent
Kajiya et al.

(10) Patent No.: US 8,928,106 B2
(45) Date of Patent: *Jan. 6, 2015

(54) ELECTROCONDUCTIVE ELEMENT, ELECTROCONDUCTIVE ELEMENT MANUFACTURING METHOD, WIRING ELEMENT, INFORMATION INPUT DEVICE, DISPLAY DEVICE, AND ELECTRONIC APPARATUS

(75) Inventors: Shunichi Kajiya, Miyagi (JP); Kazuya Hayashibe, Miyagi (JP); Sohmei Endoh, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/090,624

(22) Filed: Apr. 20, 2011

(65) Prior Publication Data

US 2012/0097434 A1   Apr. 26, 2012

(30) Foreign Application Priority Data

Apr. 28, 2010 (JP) ............... P2010-104622
Feb. 7, 2011 (JP) ............... P2011-024256

(51) Int. Cl.

| H01L 31/00 | (2006.01) |
| G02F 1/167 | (2006.01) |
| G02F 1/1343 | (2006.01) |
| G06K 19/077 | (2006.01) |
| H05K 3/00 | (2006.01) |
| H05K 3/06 | (2006.01) |
| G02F 1/1335 | (2006.01) |

(52) U.S. Cl.
CPC .... *G02F 1/13439* (2013.01); *H05K 2201/0326* (2013.01); *G02F 1/167* (2013.01); *H05K 2201/0108* (2013.01); *H05K 2203/0143* (2013.01); *H05K 3/0014* (2013.01); *G02F 2001/1676* (2013.01); *G06K 19/07749* (2013.01); *H05K 3/06* (2013.01); *G02F 1/133502* (2013.01)

USPC .................... 257/459; 257/E31.13

(58) Field of Classification Search
USPC ........... 174/255; 977/742, 773, 932; 257/255, 257/260, 398, 665, 71, E21.012, E31.13, 257/309, 459; 438/71, 255, 260, 665
See application file for complete search history.

(56) References Cited

U.S. PATENT DOCUMENTS 4,556,790 A * 12/1985 Glass et al. .................. 257/431
5,356,488 A * 10/1994 Hezel .......................... 136/256
(Continued)

FOREIGN PATENT DOCUMENTS

EP   0 548 863   6/1993
EP   1 107 320   6/2001
(Continued)

OTHER PUBLICATIONS

European Patent Office, Extended European Search Report issued in connection with European Patent Application No. 11003345.3, dated Mar. 21, 2013. (10 pages).

(Continued)

*Primary Examiner* — William F Kraig
*Assistant Examiner* — Khaja Ahmad
(74) *Attorney, Agent, or Firm* — K&L Gates LLP

(57) ABSTRACT

An electroconductive element includes a substrate having a first wavy surface and a second wavy surface, and an electroconductive layer formed on the first wavy surface, wherein the electroconductive layer forms an electroconductive pattern, and the first wavy surface and the second wavy surface satisfy the following relationship: $0 \leq (Am1/\lambda m1) < (Am2/\lambda m2) \leq 1.8$. $Am1$ is a mean amplitude of vibrations of the first wavy surface, $Am2$ is a mean amplitude of vibrations of the second wavy surface, $\lambda m1$ is a mean wavelength of the first wavy surface, and $\lambda m2$ is a mean wavelength of the second wavy surface.

19 Claims, 33 Drawing Sheets

(56) References Cited

U.S. PATENT DOCUMENTS

| | | | |
|---|---|---|---|
| 6,127,623 A * | 10/2000 | Nakamura et al. | 136/256 |
| 2001/0017154 A1 | 8/2001 | Washio | |
| 2002/0075245 A1* | 6/2002 | Kawashima et al. | 345/173 |
| 2002/0101410 A1 | 8/2002 | Sakata et al. | |
| 2002/0197460 A1 | 12/2002 | Kaneko et al. | |
| 2003/0011315 A1 | 1/2003 | Ito et al. | |
| 2003/0111105 A1* | 6/2003 | Tsukuda et al. | 136/251 |
| 2004/0022932 A1* | 2/2004 | Kum et al. | 427/66 |
| 2004/0104121 A1* | 6/2004 | Kaneko et al. | 205/159 |
| 2005/0184354 A1* | 8/2005 | Chu et al. | 257/458 |
| 2006/0043638 A1 | 3/2006 | Corrigan et al. | |
| 2006/0051048 A1* | 3/2006 | Gardiner et al. | 385/146 |
| 2007/0046874 A1 | 3/2007 | Adachi et al. | |
| 2007/0207694 A1 | 9/2007 | Yoda | |
| 2008/0220559 A1* | 9/2008 | Fujii et al. | 438/72 |
| 2008/0304155 A1* | 12/2008 | Endoh et al. | 359/558 |
| 2009/0267913 A1 | 10/2009 | Suzuki et al. | |
| 2009/0295285 A1* | 12/2009 | Tokunaga et al. | 313/505 |
| 2010/0040887 A1* | 2/2010 | Han et al. | 428/412 |
| 2011/0235181 A1 | 9/2011 | Hayashibe et al. | |

FOREIGN PATENT DOCUMENTS

| | | |
|---|---|---|
| EP | 2 068 328 | 6/2009 |
| EP | 2 154 598 | 2/2010 |
| JP | 06-061515 | 3/1994 |
| JP | 10-307296 | 11/1998 |
| JP | 11-307792 | 11/1999 |
| JP | 2001-223370 | 8/2001 |
| JP | 2002-287902 | 10/2002 |
| JP | 2002-363744 | 12/2002 |
| JP | 2005-149807 | 6/2005 |
| JP | 2007-214409 | 8/2007 |
| JP | 2008-098169 | 4/2008 |
| JP | 2009-266025 | 11/2009 |
| WO | 2010/035855 | 4/2010 |

OTHER PUBLICATIONS

Office action issued in connection with Japanese Patent Application No. 2011-024256, dated Aug. 26, 2014. (5 pages).

* cited by examiner

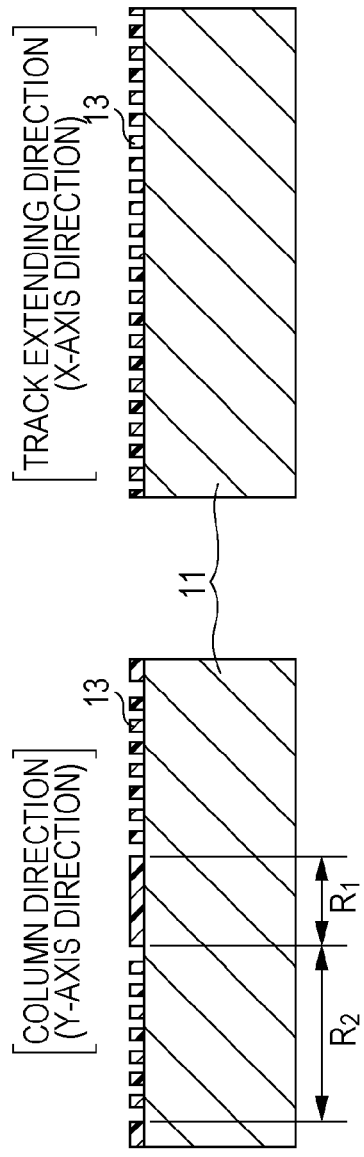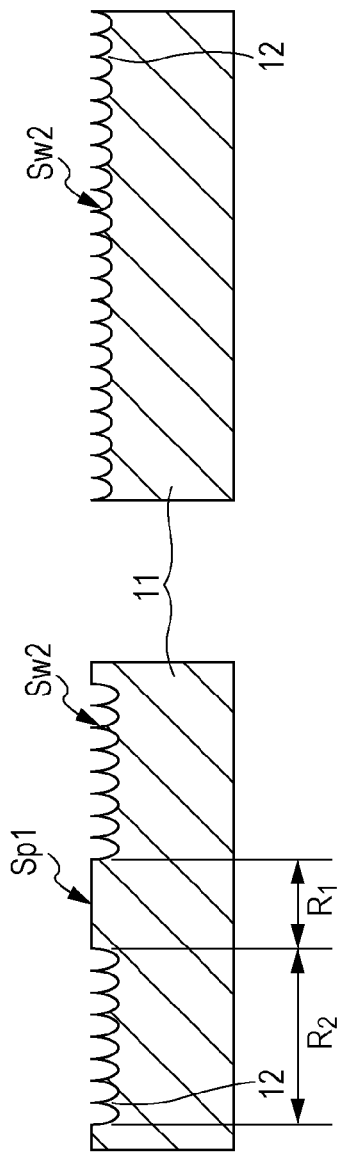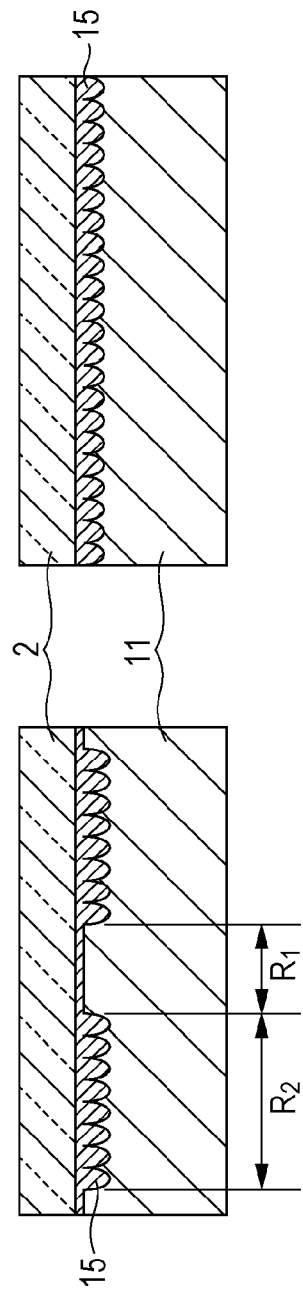

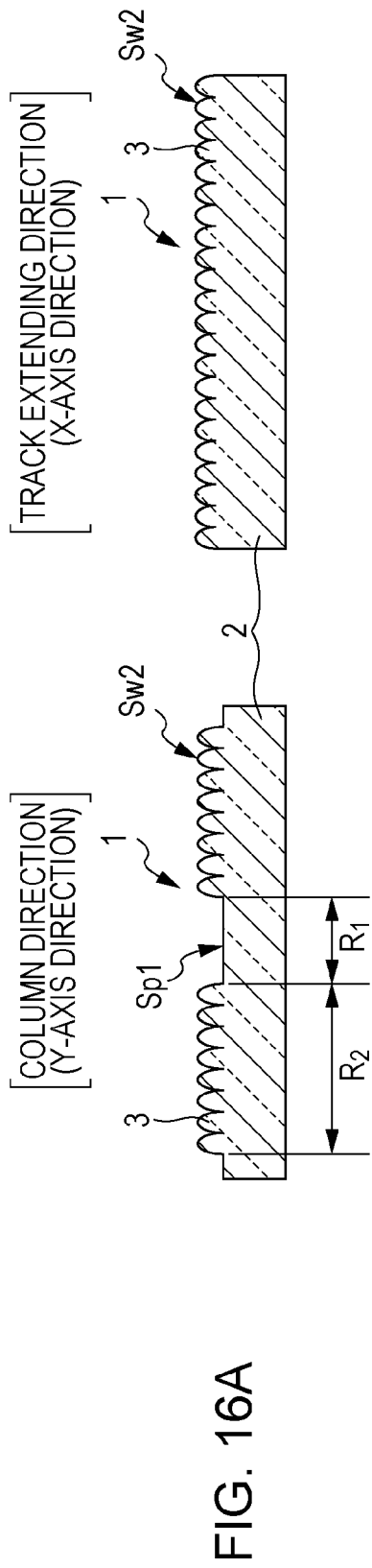
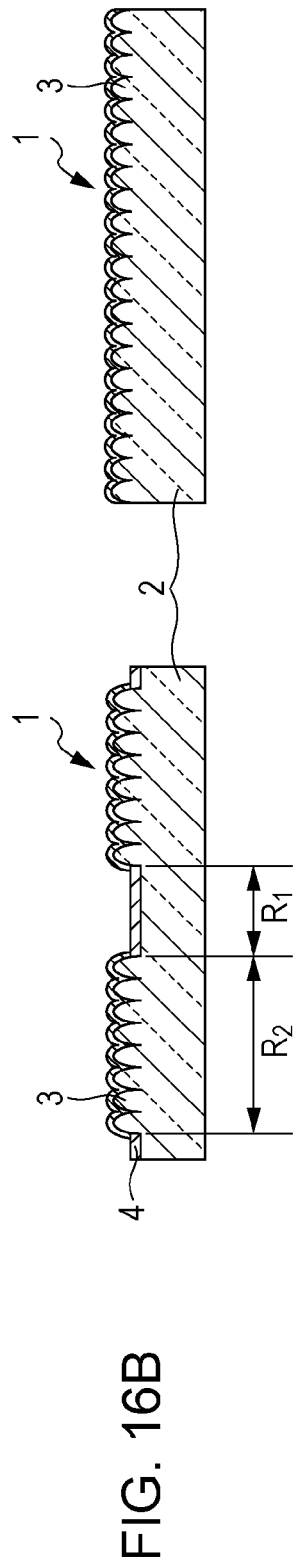
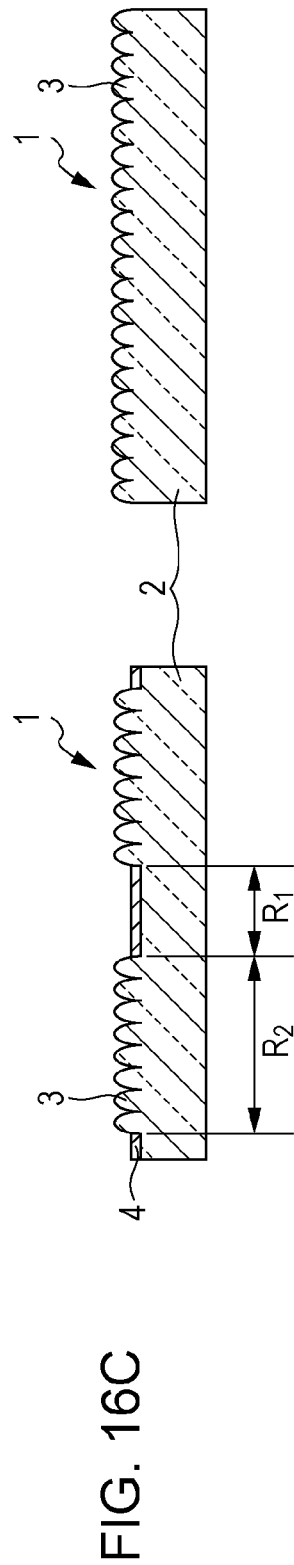
FIG. 16A
FIG. 16B
FIG. 16C

ELECTROCONDUCTIVE ELEMENT, ELECTROCONDUCTIVE ELEMENT MANUFACTURING METHOD, WIRING ELEMENT, INFORMATION INPUT DEVICE, DISPLAY DEVICE, AND ELECTRONIC APPARATUS

CROSS REFERENCES TO RELATED APPLICATIONS

The present application claims priority to that disclosed in Japanese Priority Patent Application JP 2010-104622 filed in the Japan Patent Office on Apr. 28, 2010 and Japanese Priority Patent Application JP 2011-024256 filed in the Japan Patent Office on Feb. 7, 2011, the entire contents of which are hereby incorporated by reference.

BACKGROUND

The present disclosure relates to an electroconductive element, an electroconductive element manufacturing method, a wiring element, an information input device, a display device, and an electronic apparatus. More particularly, the present invention relates to an electroconductive element in which an electroconductive pattern is formed on a substrate surface.

Hitherto, a circuit pattern forming method utilizing photolithography has been widely used as a manner for forming an electroconductive layer in a predetermined circuit pattern on an insulating substrate (base) made of, e.g., glass or plastic. Such a circuit pattern forming method is generally carried out by using a step and repeat process or a process similar to the former. In more detail, according to the step and repeat process, a circuit pattern is formed through steps of "metal layer coating", "resist applying", "exposure", "development", "removing", and "resist peeling". Thus, the circuit pattern forming method utilizing photolithography has a low throughput when it is carried out in practice.

With a view of increasing the throughput, a circuit pattern forming method utilizing screen printing is proposed. According to the circuit pattern forming method utilizing screen printing, an electroconductive layer in a predetermined circuit pattern is formed by coating, e.g., a metal paste on an insulating substrate through a mask by using a squeegee, and then baking the coated metal paste. Because the circuit pattern forming method utilizing screen printing provides a high throughput, its applications to various devices have been studied. For example, Japanese Unexamined Patent Application Publication No. 2009-266025 discloses a method of forming electrodes of a touch panel by utilizing the screen printing. Also, Japanese Unexamined Patent Application Publication No. 2005-149807 discloses a method of forming electrodes of an image display apparatus by utilizing the screen printing.

However, the screen printing has the problems that a mask is expensive, aligning the mask with high accuracy is an intricate operation, and holes formed in the mask are susceptible to clogging. Thus, a circuit pattern forming method capable of realizing a high throughput is demanded instead of the screen printing.

SUMMARY

It is, therefore, desirable to provide an electroconductive element, an electroconductive element manufacturing method, a wiring element, an information input device, a display device, and an electronic apparatus, which can realize an excellent throughput.

According to one embodiment, there is provided an electroconductive element including a substrate having a first wavy surface and a second wavy surface, and an electroconductive layer formed on the first wavy surface, wherein the electroconductive layer forms an electroconductive pattern, and the first wavy surface and the second wavy surface satisfy the following relationship, $$0 \le (Am1/\lambda m1) < (Am2/\lambda m2) \le 1.8$$

(where $Am1$ is a mean amplitude of vibrations of the first wavy surface, $Am2$ is a mean amplitude of vibrations of the second wavy surface, $\lambda m1$ is a mean wavelength of the first wavy surface, and $\lambda m2$ is a mean wavelength of the second wavy surface).

According to another embodiment, there is provided an electroconductive element including a substrate having a first wavy surface and a second wavy surface, each wavy surface having a wavelength not longer than wavelengths of visible light, and an electroconductive layer formed on the first wavy surface of the first and second wavy surfaces, wherein the electroconductive layer forms an electroconductive pattern, and a mean amplitude $Am2$ of vibrations of the second wavy surface is larger than a mean amplitude $Am1$ of vibrations of the first wavy surface.

According to another embodiment, there is provided an electroconductive element manufacturing method including the steps of forming an electroconductive layer on a surface of a substrate having a first wavy surface and a second wavy surface, and removing the electroconductive layer formed on the substrate surface, wherein, in removing the electroconductive layer, an electroconductive pattern made of the electroconductive layer is formed on the first wavy surface of the first and second wavy surfaces, and the first wavy surface and the second wavy surface satisfy the following relationship, $$0 \le (\lambda m1/\lambda m1) < (Am2/\lambda m2) \le 1.8$$

(where $Am1$ is a mean amplitude of vibrations of the first wavy surface, $Am2$ is a mean amplitude of vibrations of the second wavy surface, $\lambda m1$ is a mean wavelength of the first wavy surface, and $\lambda m2$ is a mean wavelength of the second wavy surface).

According to another embodiment, there is provided an electroconductive element manufacturing method including the steps of forming an electroconductive layer on a surface of a substrate having a first wavy surface and a second wavy surface, each wavy surface having a wavelength not longer than wavelengths of visible light, and removing the electroconductive layer formed on the substrate surface, wherein a mean amplitude $Am2$ of vibrations of the second wavy surface is larger than a mean amplitude $Am1$ of vibrations of the first wavy surface, a ratio ($Am2/\lambda m2$) of the mean amplitude $Am2$ of vibrations of the second wavy surface to a mean wavelength $\lambda m2$ of the second wavy surface is 1.8 or below, and, in removing the electroconductive layer, an electroconductive pattern made of the electroconductive layer is formed on the first wavy surface of the first and second wavy surfaces.

In the embodiments, preferably, an area of the electroconductive layer formed on a flat surface (representing one example of the first wavy surface) is larger than that of the electroconductive layer formed on a wavy surface (representing one example of the second wavy surface). Preferably, the electroconductive layer is continuously formed on the flat surface, whereas the electroconductive layer is discontinuously formed on the wavy surface. Preferably, the electroconductive layer formed on the flat surface has a larger thickness than that of the electroconductive layer formed on the wavy surface.

In the embodiments, preferably, surface resistance of the electroconductive layer is 5000Ω/☐ (unit area) or below. The electroconductive layer preferably contains at least one selected from a group including an electroconductive high polymer, metallic nano-particles, and carbon nano-tubes. The electroconductive layer preferably contains a transparent oxide semiconductor. The transparent oxide semiconductor is preferably indium tin oxide or zinc oxide. The electroconductive layer is preferably in a mixed state of an amorphous phase and a polycrystalline phase. The electroconductive pattern is preferably a wiring pattern. Preferably, the wavy surface is a one-dimensionally wavy surface that is formed by arranging many structures in a one-dimensional array, or a two-dimensionally wavy surface that is formed by arranging many structures in a two-dimensional array. The electroconductive element can be suitably applied to a wiring element, an information input device, a display device, and an electronic apparatus.

In the embodiments, preferably, the first wavy surface and the second wavy surface satisfy the following relationships, and the mean wavelength λm2 of the second wavy surface is not longer than wavelengths of visible light, $$(Am1/\lambda m1)=0 \text{ and } 0<(Am2/\lambda m2)\leq 1.8.$$

In the embodiments, preferably, the first wavy surface and the second wavy surface satisfy the following relationship, and the mean wavelength λm1 of the first wavy surface is not longer than wavelengths of visible light, $$0<(Am1/\lambda m1)<(Am2/\lambda m2)\leq 1.8.$$

In the embodiments, preferably, the first wavy surface and the second wavy surface satisfy the following relationships, and the mean wavelength λm2 of the second wavy surface is not shorter than 100 nm, $$(Am1/\lambda m1)=0 \text{ and } 0<(Am2/\lambda m2)\leq 1.8.$$

In the embodiments, preferably, the first wavy surface and the second wavy surface satisfy the following relationship, and the mean wavelength λm1 of the second wavy surface and the mean wavelength λm2 of the second wavy surface are each not shorter than 100 nm, $$0<(Am1/\lambda m1)<(Am2/\lambda m2)\leq 1.8.$$

In the embodiments, preferably, the electroconductive element according further includes a residual film, which is partly formed on the second wavy surface by removing the electroconductive layer coated on the first wavy surface as well as on the second wavy surface, and the electroconductive layer and the residual film satisfy the following relationship, $$S1>S2$$

(where S1 is an area of the electroconductive layer, and S2 is an area of the residual film). In that case, preferably, the electroconductive layer formed on the first wavy surface is continuously formed on the first wavy surface, and the residual film formed on the second wavy surface is discontinuously formed on the second wavy surface.

In the embodiments, preferably, the electroconductive element further includes a residual film, which is partly formed on the second wavy surface by removing the electroconductive layer coated on the first wavy surface as well as on the second wavy surface, and the electroconductive layer and the residual film satisfy the following relationship, $$d1>d2$$

(where d1 is a thickness of the electroconductive layer, and d2 is a thickness of the residual film).

According to the above-described embodiments, a high throughput can be realized.

BRIEF DESCRIPTION OF THE FIGURES

in FIG. 2A;

FIGS. 15A to 15C illustrate successive steps to explain the one example of the method for manufacturing the electroconductive element according to the first embodiment;

FIGS. 16A to 16C illustrate successive steps to explain the one example of the method for manufacturing the electroconductive element according to the first embodiment;

in FIG. 17A;

DETAILED DESCRIPTION

Embodiments will be described below in the following order with reference to the drawings.

1. First embodiment (in which a wiring pattern is formed on a substrate surface by utilizing the presence or absence of a wavy surface: see FIG. 1A)

2. Second embodiment (in which structures are arrayed in a tetragonal lattice pattern: see FIG. 17A)

3. Third embodiment (in which a wiring pattern is formed on the substrate surface by utilizing the difference between two types of wavy surfaces: see FIG. 20A)

4. Fourth embodiment (in which wiring patterns are formed on both substrate surfaces: see FIGS. 22A and 22B)

5. Fifth embodiment (which represents an example of fabricating a disk-shaped master: see FIGS. 23A and 23B)

6. Sixth embodiment (in which the structures are in the recessed form: see FIGS. 25A and 25B)

7. Seventh embodiment (in which the structures are formed at random: see FIGS. 26A and 26B)

8. Eighth embodiment (which represents an application to a display device: see FIG. 27)

9. Ninth embodiment (which represents an application to an information input device: see FIGS. 29A and 30A)

10. Tenth embodiment (which represents an application to an IC card: see FIGS. 31A and 31B)

11. Eleventh embodiment (which represent an application to a display device: see FIGS. 32A to 32C)

1. First Embodiment

[Structure of Electroconductive (Optical) Element]

Figure 1A:
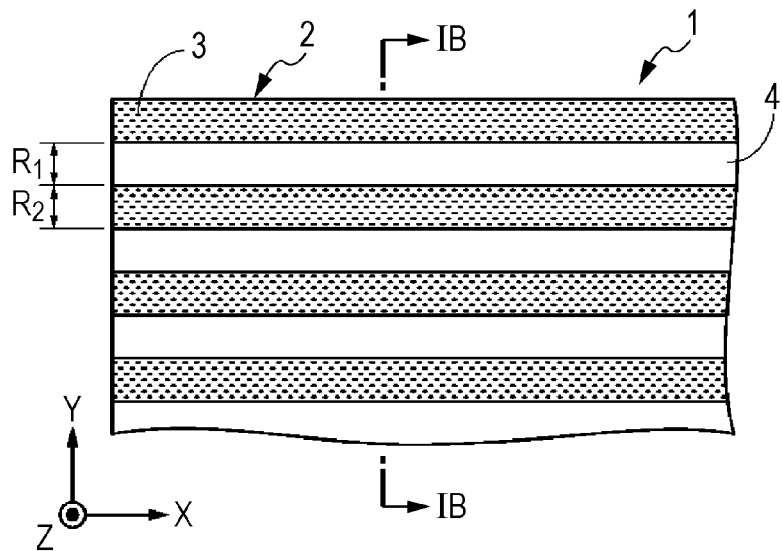
FIG. 1A is a plan view illustrating one example of structure of an electroconductive element according to a first embodiment.
Figure 1B:
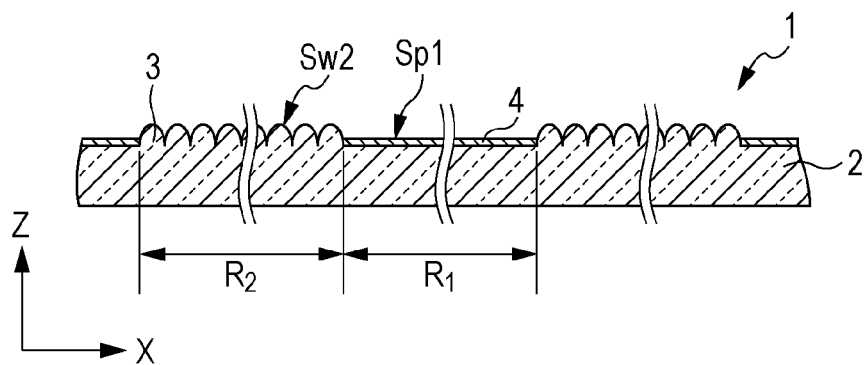
FIG. 1B is a sectional view, taken along line IB-IB in FIG. 1A, illustrating the one example of structure of the electroconductive element according to the first embodiment.
Figure 1C:
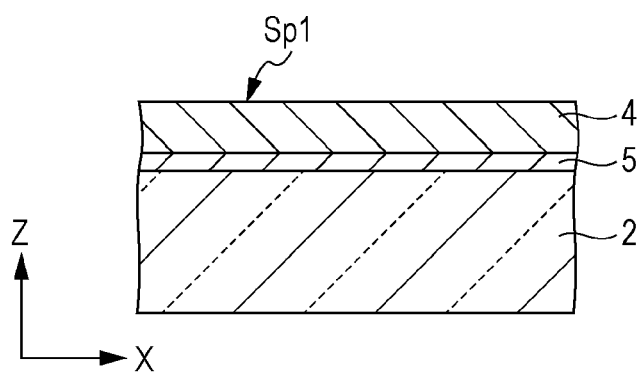
FIG. 1C is a sectional view illustrating a layer structure in a first region of the electroconductive element according to the first embodiment.

FIG. 1A is a plan view illustrating one example of structure of an electroconductive element according to a first embodiment, FIG. 1B is a sectional view, taken along line IB-IB in FIG. 1A, illustrating the one example of structure of the electroconductive element according to the first embodiment, and FIG. 1C is a sectional view illustrating a layer structure in a first region of the electroconductive element according to the first embodiment. In the following description, two directions orthogonal to each other in a plane including a surface of an electroconductive element 1, on which a circuit is formed, are called an X-axis direction and a Y-axis direction, and a direction perpendicular to the surface on which the circuit is formed is called a Z-axis direction.

The electroconductive element 1 according to the first embodiment includes a substrate 2 having a first region $R_1$ and a second region $R_2$, which are alternately formed thereon, and an electroconductive layer 4 continuously formed in one $R_1$ of the first region $R_1$ and the second region $R_2$ so as to provide a wiring pattern (electroconductive pattern). The electroconductive layer 4 is formed of, e.g., a single-layer film having electrical conductivity. The following description is made in connection with the case where the wiring pattern is formed, as one example of the electroconductive pattern, in the first region $R_1$. However, the electroconductive pattern is not limited to the wiring pattern, and it can be provided as suitable one of various types of patterns having electrical conductivity. For example, the electroconductive pattern may be formed as an electrode pattern.

From the viewpoint of reducing surface resistance, as illustrated in FIG. 1C, the electroconductive element 1 preferably further includes a metal layer 5 that is formed on the substrate surface in the first region $R_1$ in a vertically adjacent (or stacked) relation to the electroconductive layer 4. The electroconductive element 1 is practically used to constitute, e.g., a printed circuit board, an image display device, or an information input device. Examples of the printed circuit board include a rigid board, a flexible board, and a rigid-flexible board. Examples of the image display device include a liquid crystal display device and an electroluminescence (EL) device (such as an organic EL device and an inorganic EL device).

(First Region $R_1$ and Second Region $R_2$)

A wavy surface Sw2 having a wavelength not longer than those of visible light, for example, is formed on the substrate surface in the second region $R_2$. Further, on the wavy surface Sw2, the electroconductive layer 4 is not formed at all, or the electroconductive layer 4 is formed in a discontinuous state. The wavy surface Sw2 is a concave-convex surface in which many structures 3 are formed at an array pitch corresponding to a wavelength not longer than those of visible light, for example. On the other hand, a flat surface Sp1, for example, is formed on the substrate surface in the first region $R_1$, and the electroconductive layer 4 is continuously formed on the flat surface Sp1. Thus, the second region $R_2$ functions as an insulating region that establishes insulation between the electroconductive layers 4 formed on the adjacent first regions $R_1$ on both the sides of the second region $R_2$. In contrast, the electroconductive layer 4 continuously formed in the first region $R_1$ has electrical conductivity in the direction in which the first region $R_1$ is extended, and it functions as the wiring pattern (electroconductive pattern).

Preferably, the flat surface Sp1 and the wavy surface Sw2 satisfy the following relationship;

$$(Am1/\lambda m1)=0.0<(Am2/\lambda m2)$$

(where Am1 is a mean amplitude of vibrations of the flat surface Sp1, Am2 is a mean amplitude of vibrations of the wavy surface Sw2, $\lambda m1$ is a mean wavelength of the flat surface Sp1, and $\lambda m2$ is a mean wavelength of the wavy surface Sw2).

Because the flat surface Sp1 can be regarded as a wavy surface in which the mean amplitude of vibrations thereof is "0", the mean vibration amplitude Am1 and the mean wavelength $\lambda m1$ of the flat surface Sp1, as well as a ratio (Am1/$\lambda m1$) can be defined as mentioned above.

In case of the ratio $(Am2/\lambda m2)>1.8$, there is a tendency to cause a peeling failure in the step of transferring the wavy surface Sw2 and to damage the wavy surface Sw2.

The wavy surface Sw2 is a one-dimensionally or two-dimensionally wavy surface having a wavelength not longer than those of visible light, for example. More specifically, the wavy surface Sw2 is a concave-convex surface in which many structures 3 are formed by being arranged in a one-dimensional or two-dimensional pattern at the array pitch corresponding to a wavelength not longer than those of visible light, for example.

The mean wavelength $\lambda m2$ of the wavy surface Sw2 is preferably in the range of not shorter than 100 nm. If the mean wavelength $\lambda m2$ is smaller than 100 nm, there is a tendency to increase a difficulty in forming the wavy surface Sw2.

Further, the mean wavelength $\lambda m2$ of the wavy surface Sw2 is preferably in the range of not longer than 100 μm. If the mean wavelength $\lambda m2$ is longer than 100 gm, a problem may occur in step coverage in the processes of in-printing and film formation, thus giving rise to a defect.

Preferably, the electroconductive layer 4 is not present in the second region $R_2$ at all. However, the electroconductive layer 4 may be present on the second region $R_2$ in such a state as allowing the second region $R_2$ to function as an insulating region. In the latter case, an area of the electroconductive layer 4 formed in the first region $R_1$ is preferably larger than that of the electroconductive layer 4 formed in the second region $R_2$. More specifically, it is preferable that the electroconductive layer 4 is continuously formed in the first region $R_1$, while the electroconductive layer 4 is formed discontinuously, e.g., in a state of islands, in the second region $R_2$. As an alternative, the thickness of the electroconductive layer 4 formed in the second region $R_2$ may be smaller than that of the electroconductive layer 4 formed in the first region $R_1$ to such an extent that the electroconductive layer 4 formed in the second region $R_2$ does not substantially exhibit electrical conductivity and the second region $R_2$ is able to function as an insulating region.

Stated another way, the electroconductive layer 4 or a part thereof is preferably not present as a residual film in the second region $R_2$ at all, but it may be present as a residual film to such an extent that the second region $R_2$ is able to function as an insulating region. When there is present a residual film in the second region $R_2$, the electroconductive layer 4 formed in the first region $R_1$ and the residual film present in the second region $R_2$ preferably satisfy the following relationship;

$$S1>S2$$

(where S1 is an area of the electroconductive layer 4, and S2 is an area of the residual film).

When the above relationship is satisfied, it is preferable that the electroconductive layer 4 is continuously formed in the first region $R_1$, while the residual film is present discontinuously, e.g., in a state of islands, in the second region $R_2$.

Further, when there is present a residual film in the second region $R_2$, the electroconductive layer 4 formed in the first region $R_1$ and the residual film present in the second region $R_2$ preferably satisfy the following relationship;

$$d1>d2$$

(where d1 is a thickness of the electroconductive layer 4, and d2 is a thickness of the residual film).

When the above relationship is satisfied, the thickness of the residual film is preferably smaller than that of the electroconductive layer 4 formed in the first region $R_1$ to such an extent that the residual film does not substantially exhibit electrical conductivity and the second region $R_2$ is able to function as an insulating region.

While FIG. 1A represents the case where the electroconductive layer 4 continuously formed in the first region $R_1$, i.e., the wiring pattern, has a linear shape, the shape of the wiring pattern is not limited to the linear one and the wiring pattern may have a desired shape depending on circuit design, etc. Be it noted that, for example, when the electroconductive layer 4 is discontinuously formed in the second region $R_2$, the electroconductive layer 4 is omitted from the drawings because it does not function as the wiring pattern in that case. In other words, the residual film is not illustrated in the drawings.

A cross-section obtained by cutting the wavy surface Sw2 in one direction including positions, at which the amplitude of vibrations of the wavy surface Sw2 is maximized, has a triangular wave shape, a sine wave shape, a wavy shape repeating a quadratic curve or a part of a quadratic curve, shapes analogous to the former shapes, etc. Examples of the quadratic curve include a circle, an ellipse, and a parabola.

The ratio (Am2/λm2) of the mean amplitude Am2 of vibrations of the wavy surface Sw2 to the mean wavelength λm2 thereof is preferably 1.8 or below. If the ratio (Am2/λm2) exceeds 1.8, there is a tendency to cause a peeling failure in the step of transferring the structures 3 and to damage the structures 3.

Herein, the mean wavelength λm2 of the wavy surface Sw2 and the mean amplitude Am2 of vibrations thereof are determined as follows. First, the electroconductive element 1 is cut in one direction including positions, at which the amplitude of vibrations of the wavy surface Sw2 in the second region $R_2$ is maximized, and a photo of the cut cross-section is taken by a TEM (Transmission Electron Microscope). Then, a wavelength λ2 of the wavy surface Sw2 and an amplitude A2 of vibrations thereof are determined from the taken TEM photo. After repeating the above-described measurement at 10 points selected at random from the electroconductive element 1, the measured values are simply averaged (arithmetically averaged) to obtain the mean wavelength λm2 of the wavy surface Sw2 and the mean amplitude Am2 of vibrations thereof. Then, the ratio (Am2/λm2) of the wavy surface Sw2 is obtained by using the mean wavelength λm2 of the wavy surface Sw2 and the mean amplitude Am2 of vibrations thereof, which have been determined as described above.

The substrate 2, the structure 3, the electroconductive layer 4, and the metal layer 5 of the electroconductive element 1 will be described below one by one.

(Substrate)

The substrate 2 is, for example, a substrate having transparency or opaqueness. The substrate 2 can be made of, for example, an organic material such as a plastic material, or an inorganic material, such as glass.

Examples of the glass usable here include soda lime glass, lead glass, hard glass, quartz glass, and liquid crystal glass (see "Kagaku Binran (Chemical Handbook)" fundamentals, P. I-537, edited by The Chemical Society of Japan). In consideration of not only optical characteristics such as transparency, diffractive index, and dispersion, but also other various characteristics such as impact resistance, heat resistance, and durability, preferable examples of the plastic material include (meth)acrylic resins, e.g., copolymers of polymethyl methacrylate or methyl methacrylate and other vinyl monomers, such as alkyl (meth)acrylate and styrene; polycarbonate resins, such as polycarbonate and diethylene glycol bisaryl carbonate (CR-39); thermosetting (meth)acrylic resins, such as a homopolymer or a copolymer of (brominated) bisphenol A di(meth)acrylate and a polymer or a copolymer of an urethane modified monomer of (brominated) bisphenol A mono(meth) acrylate; and polyesters, in particular polyethylene terephthalate, polyethylene naphthalate, and unsaturated polyesters, as well as an acrylonitrile-styrene copolymer, polyvinyl chloride, polyurethane, epoxy resins, polyarylate, polyether sulfon, polyether ketone, and cycloolefin polymers (trade names: ARTON and ZEONOR). Further, aramid resins in consideration of heat resistance can also be used.

When the plastic material is used as the substrate 2, an undercoat may be formed for surface treatment to improve surface energy, coating properties, slipping properties, flatness, etc. of the plastic surface. Examples of materials for the undercoat include an organoalkoxy metal compound, polyester, acrylic modified polyester, and polyurethane. Alternatively, the surface of the substrate 2 may be treated with corona discharge or UV irradiation in order to obtain an effect equivalent to that obtained with the undercoat.

When the substrate 2 is a plastic film, the substrate 2 can be obtained, for example, by a method of stretching one of the above-mentioned resins, or a method of diluting one of the above-mentioned resins with a solvent, applying the diluted resin in the form of a film, and drying the film. The thickness of the substrate 2 is, for example, about 25 gm to 500 μm.

The substrate 2 may be in the form of, e.g., a film, a plate, or a block, but the form of the substrate 2 is not limited to those particular examples. It is herein defined that the term "film" includes a sheet.

(Structures)

Figure 2A:
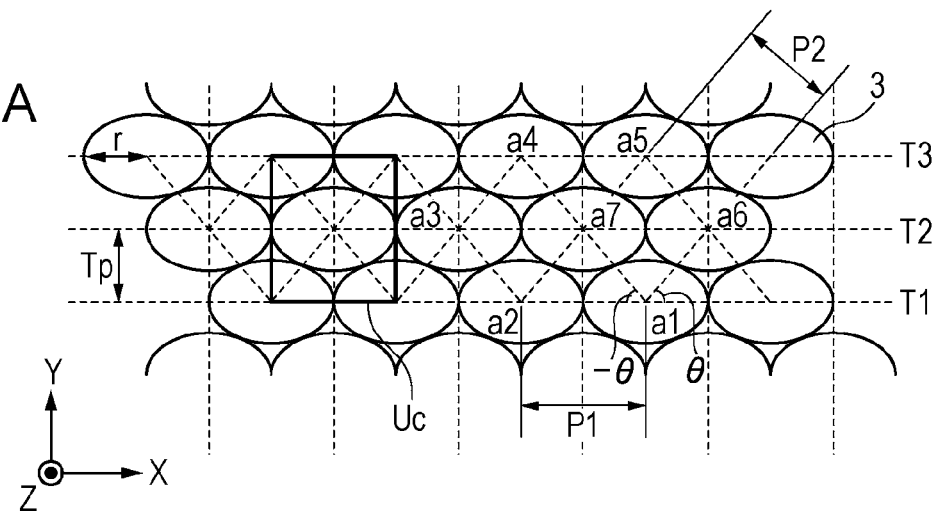
FIG. 2A is an enlarged plan view of a part of a second region illustrated in FIG. 1A.
Figure 2B:
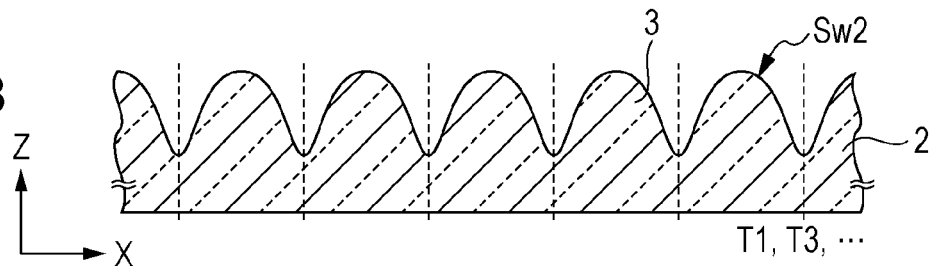
FIG. 2B is a sectional view taken along each of tracks T1, T3, etc. in FIG. 2A.
Figure 2C:
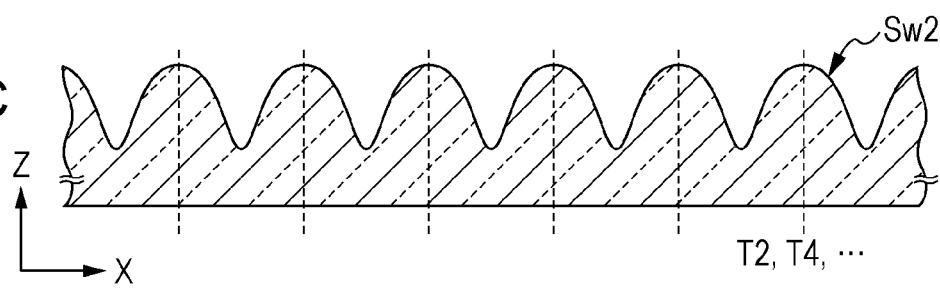
FIG. 2C is a sectional view taken along each of tracks T2, T4, etc. in FIG. 2A.
Figure 2D:
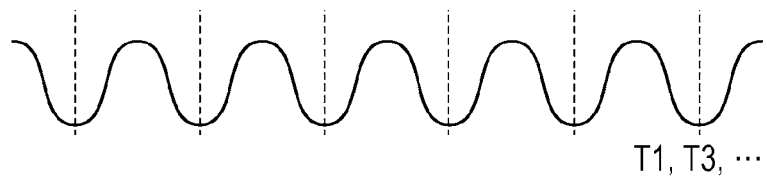
FIG. 2D is a chart illustrating a modulated waveform of a laser beam that is used to form a latent image corresponding to each of the tracks T1, T3, etc. in FIG. 2A.
Figure 2E:
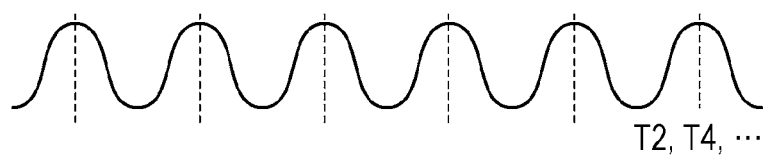
FIG. 2E is a chart illustrating a modulated waveform of a laser beam that is used to form a latent image corresponding to each of the tracks T2, T4, etc.
Figure 3:
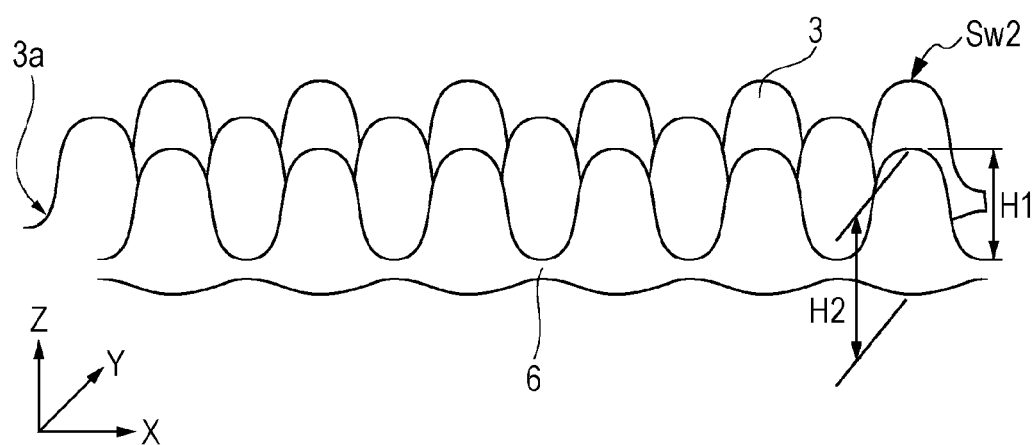
FIG. 3 is an enlarged perspective view of a part of the second region illustrated in FIG. 1A.
Figure 4A:
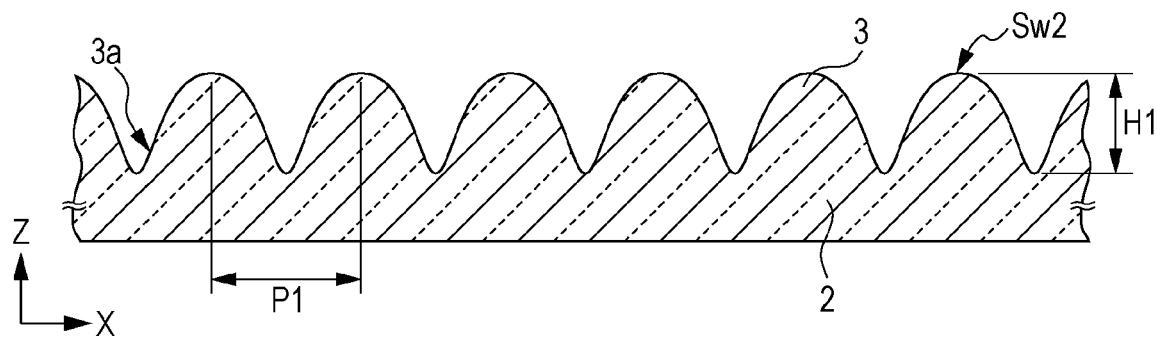
FIG. 4A is a sectional view taken along a track extending direction in the second region illustrated in FIG. 2A.
Figure 4B:
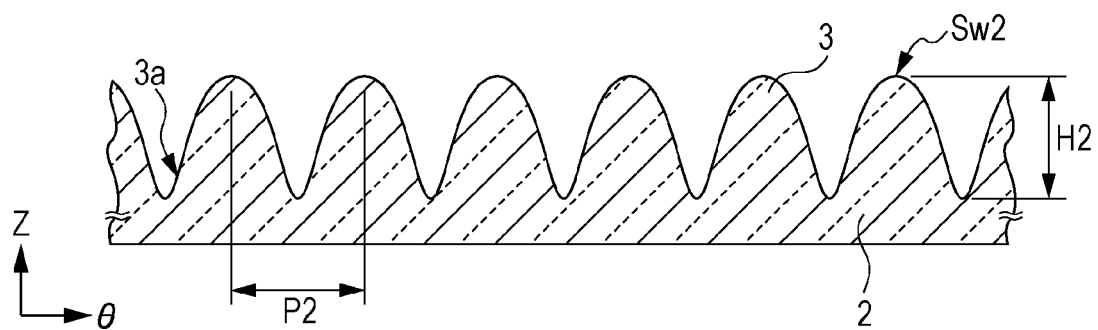
FIG. 4B is a sectional view taken along a θ-direction in the second region illustrated in FIG. 2A.

FIG. 2A is an enlarged plan view of a part of the second region illustrated in FIG. 1A. FIG. 2B is a sectional view taken along each of tracks T1, T3, etc. in FIG. 2A, and FIG. 2C is a sectional view taken along each of tracks T2, T4, etc. in FIG. 2A. FIG. 2D is a chart illustrating a modulated waveform of a laser beam that is used to form a latent image corresponding to each of the tracks T1, T3, etc. in FIG. 2A, and FIG. 2E is a chart illustrating a modulated waveform of a laser beam that is used to form a latent image corresponding to each of the tracks T2, T4, etc. in FIG. 2A. FIGS. 3 and 5 to 7 are each an enlarged perspective view of a part of the second region illustrated in FIG. 1A. FIG. 4A is a sectional view taken along a track extending direction in the second region illustrated in FIG. 2A, and FIG. 4B is a sectional view taken along a θ-direction in the second region illustrated in FIG. 2A.

Many structures 3 each having a convex shape are arrayed on the surface of the substrate 2 in the second region $R_2$. With the presence of the convex structures 3, the wavy surface Sw2 is formed on the surface of the substrate 2 in the second region $R_2$. The structures 3 are formed, for example, separately from the substrate 2 or integral with the substrate 2. When the structures 3 and the substrate 2 are formed separately from each other, a bottom base layer may be formed, as necessary, between the structures 3 and the substrate 2. The bottom base layer is a layer integrally formed with the bottom side of the structures 3 and is formed by curing, e.g., an energy-ray curable resin composition similar to that used for the structures 3. The thickness of the bottom base layer is not limited to a particular value, and it can be optionally selected as desired.

An aspect ratio (Hm/Pm) of the structures 3 preferably satisfies the following relationship;

$$0 < (Hm/Pm) \leq 1.8$$

(where Hm is a mean height of the structures 3, and Pm is a mean array pitch of the structures 3).

In case of (Hm/Pm)>1.8, there is a tendency to cause a peeling failure in the step of transferring the structures 3 and to damage the structures 3.

The many structures 3 can be arranged, for example, in one-dimensional or two-dimensional array. The array of the structures 3 may be, for example, a regular or irregular array. Preferably, suitable one of the regular or irregular array is selected depending on a master fabricating method, etc.

From the viewpoint of reducing reflection of light, it is preferable that the structures 3 are cyclically two-dimensionally arranged at an array pitch corresponding to a wavelength not longer than those of light in a band for which reflection is to be reduced, e.g., at an array pitch corresponding to a wavelength not longer than those of visible light. Herein, the term "array pitch" implies a mean array pitch P. The wavelength band of light for which reflection is to be reduced is, e.g., an ultraviolet wavelength band, a visible wavelength band, or an infrared wavelength band. Herein, the term "ultraviolet wavelength band" implies a wavelength band of 10 nm or longer and 360 nm or shorter. The term "visible wavelength band" implies a wavelength band of 360 nm or longer and 830 nm or shorter. The term "infrared wavelength band" implies a wavelength band of 830 nm or longer and 1 mm or shorter. In practice, the mean array pitch of the structures 3 is in the range of preferably 180 nm or longer and 350 nm or shorter, more preferably 100 nm or longer and 320 nm or shorter, and even more preferably 110 nm or longer and 280 nm or shorter. If the mean array pitch is shorter than 180 nm, there is a tendency to increase a difficulty in fabricating the structures 3. On the other hand, if the mean array pitch exceeds 350 nm, there is a tendency to cause diffraction of visible light.

In the electroconductive element 1, the structures 3 are arrayed so as to form plural rows of tracks T1, T2, T3, etc. (hereinafter collectively referred to as "tracks T") on the surface of the substrate 2. In this specification of the present invention, the term "track" implies an area where the structures 3 are continuously formed in a linear or curved line. Also, the term "column direction" implies a direction perpendicular, in the shaped surface of the substrate 2, to the direction in which the track is extended (e.g., to the X-axis direction).

The structures 3 are arranged at positions shifted by a half pitch between two tracks T adjacent to each other. In more detail, looking at two tracks T adjacent to each other, the structures 3 in the other track (e.g., T2) are arranged at middle positions (positions shifted by a half pitch) between the structures 3 arranged in one track (e.g., T1). Consequently, as illustrated in FIG. 2A, the structures 3 are arrayed in every three rows of adjacent tracks (T1 to T3) so as to form a hexagonal lattice pattern or a quasi-hexagonal lattice pattern in which centers of the structures 3 are positioned at seven points a1 to a7. In this embodiment, the term "hexagonal lattice pattern" implies a regular hexagonal lattice pattern. Also, the term "quasi-hexagonal lattice pattern" implies a hexagonal lattice pattern that is, unlike the regular hexagonal lattice pattern, distorted by being extended in the track extending direction (e.g., the X-axis direction).

When the structures 3 are arrayed in the quasi-hexagonal lattice pattern, it is preferable, as illustrated in FIG. 2A, that an array pitch P1 (e.g., distance between a1 and a2) of the structures 3 in the same track (e.g., the track T1) is longer than an array pitch of the structures 3 between two adjacent tracks (e.g., T1 and T2), i.e., an array pitch P2 (e.g., distance between a1 and a7 and between a2 and a7) of the structures 3 in ±θ-directions with respect to the track extending direction. By arraying the structures 3 as described above, a packing density of the structures 3 can be further increased.

From the viewpoint of easiness in forming the structures 3, the structures 3 preferably have an axis-symmetrical conical shape or a conical shape stretched or contracted in the track direction. When the adjacent structures 3 are joined to each other, the structures 3 preferably have an axis-symmetrical conical shape or a conical shape stretched or contracted in the track direction except for respective lower portions of the structures 3, which are joined to the adjacent structures. Examples of the conical shape include a circular conical shape, a truncated circular conical shape, an elliptic conical shape, and a truncated elliptic conical shape. Herein, the term "conical shape" implies the concept including, as mentioned above, not only the circular conical shape and the truncated circular conical shape, but also the elliptic conical shape and the truncated elliptic conical shape. Further, the term "truncated circular conical shape" implies a shape obtained by cutting off an apex portion of the circular conical shape, and the term "truncated elliptic conical shape" implies a shape obtained by cutting off an apex portion of the elliptic conical shape.

Figure 5:
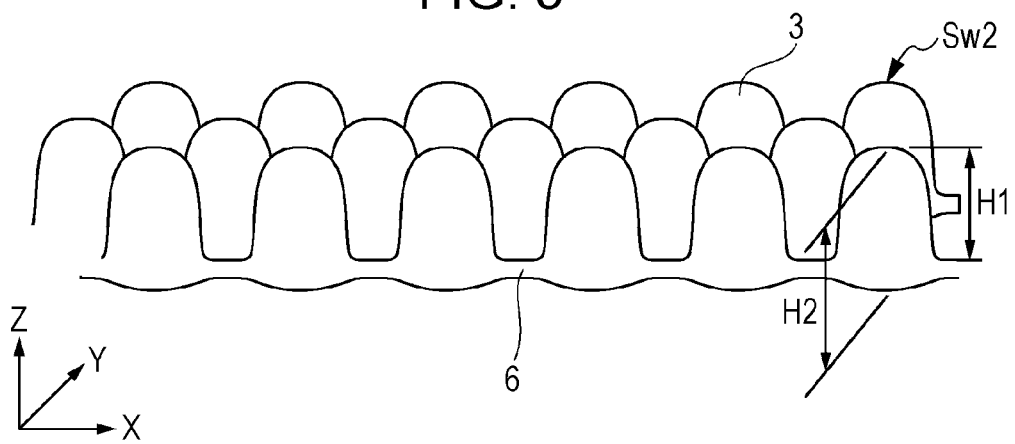
FIG. 5 is an enlarged perspective view of a part of the second region illustrated in FIG. 1A.
Figure 6:
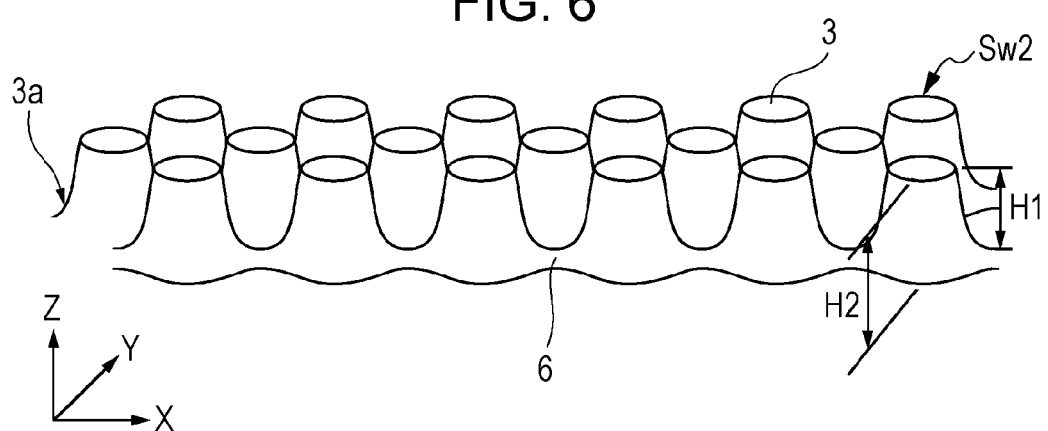
FIG. 6 is an enlarged perspective view of a part of the second region illustrated in FIG. 1A.

Preferably, the structure 3 has a conical shape having a bottom surface in which a width of the structure 3 in the track extending direction is larger than that in the column direction perpendicular to the track extending direction. In more detail, as illustrated in FIGS. 3 and 5, the structure 3 preferably has such an elliptic conical shape that a bottom surface is elliptic, oblong, or oval with a major axis and a minor axis, and that an apex portion has a curved surface. As an alternative, as illustrated in FIG. 6, the structure 3 preferably has such a truncated elliptic conical shape that a bottom surface is elliptic, oblong, or oval with a major axis and a minor axis, and that an apex portion has a flat surface. The structures 3 each having such a shape can be arrayed at a higher packing rate in the column direction.

From the viewpoint of improving a reflection characteristic, the structure 3 preferably has such a conical shape (see FIG. 5) that the slope of an apex portion is a gentle and the slop becomes gradually steeper from a middle portion to a bottom portion. From the viewpoint of improving a reflection characteristic and a transmission characteristic, the structure 3 preferably has such a conical shape (see FIG. 3) that the slope of a middle portion is steeper than the slopes of a bottom portion and an apex portion, or such a truncated conical shape (see FIG. 6) that an apex portion has a flat surface. When the structure 3 has an elliptic conical shape or a truncated elliptic conical shape, the direction of the major axis of its bottom surface is preferably parallel to the track extending direction. In FIG. 3, etc., the structures 3 have the same shape. However, the shape of the structures 3 is not limited to one type in one electroconductive element 1, and the structures 3 having two or more shapes may be formed on the substrate surface. Further, the structures 3 may be formed integrally with the substrate 2.

Figure 7:
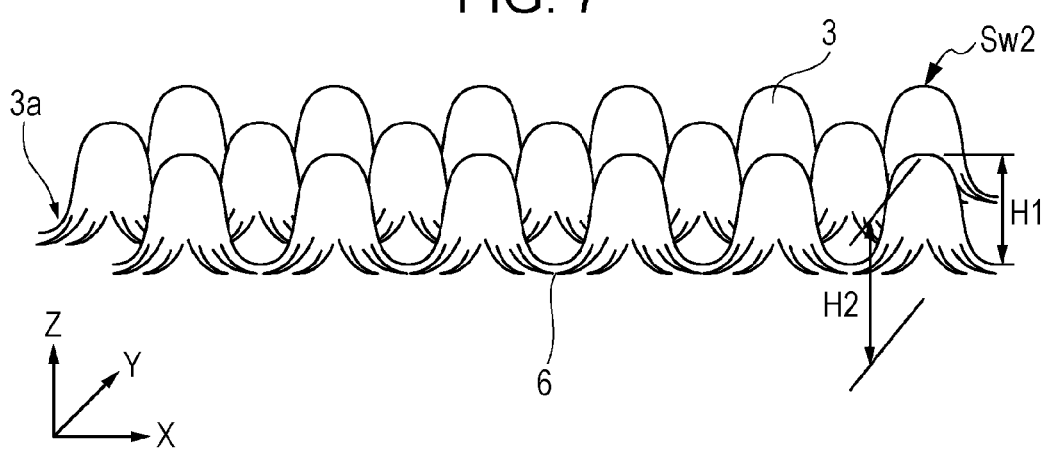
FIG. 7 is an enlarged perspective view of a part of the second region illustrated in FIG. 1A.

As illustrated in FIGS. 3 and 5 to 7, a projected portion 6 is preferably formed partly or entirely at the periphery of the structure 3. With the presence of the projected portion 6, reflectivity can be held low even when the packing rate of the structures 3 is low. In more detail, as illustrated in FIGS. 3, 5 and 6, the projected portion 6 is formed between the structures 3 adjacent to each other. Alternatively, as illustrated in FIG. 7, an elongate projected portion 6 may be formed partly or entirely at the periphery of the structure 3. For example, the elongate projected portion 6 is extended from an apex portion to a lower portion of the structure 3. The projected portion 6 may have, e.g., a triangular or rectangular shape in cross-section. However, the shape of the projected portion 6 is not limited to such a particular shape, and it can be optionally selected in consideration of, e.g., easiness in forming the projected portion 6. Further, the peripheral surface of the structure 3 may be partly or entirely roughed so as to form fine ruggedness. In practice, for example, the surface between the structures 3 adjacent to each other may be roughed so as to form fine ruggedness. As an alternative, fine holes may be formed in the surface of the structure 3, e.g., in the apex portion thereof.

A height H1 of the structure 3 from the bottom located in the track extending direction is preferably smaller than a height H2 of the structure 3 from the bottom located in the column direction. In other words, the heights H1 and H2 of the structure 3 preferably satisfy the relationship of H1<H2. The reason is that, if the structures 3 are arrayed in the relationship of H1≥H2, the array pitch P1 of the structures 3 in the track extending direction is increased and the packing rate of the structures 3 in the track extending direction is reduced. A reduction of the packing rate causes degradation of the reflection characteristic.

The mean height Hm, the mean array pitch Pm, and the mean aspect ratio (Hm/Pm) of the structures 3 are preferably similar to the mean vibration amplitude Am, the mean wavelength λm, and the ratio (Am/λm) of the wavy surface Sw2, respectively.

Herein, the mean aspect ratio is defined by the following formula (1);

$$\text{mean aspect ratio} = Hm/Pm \quad (1)$$

where Hm is the mean height of the structures, and Pm is the mean array pitch (mean cycle).

The mean array pitch Pm is defined by the following formula (2);

$$\text{mean array pitch } Pm = (p_1 + p_2 + \ldots + p_{10})/10 \quad (2)$$

where $p_1, p_2 \ldots p_{10}$ each represent the array pitch P1 or P2 of ten sets of structures 3 selected at random from the structures 3 on the substrate surface. Herein, P1 is the array pitch in the track extending direction (i.e., the cycle in the track extending direction), and P2 is the array pitch in the ±θ-directions (θ=60°−δ, where δ satisfies preferably 0°<δ≤11° and more preferably 3°≤δ≤6°) with respect to the track extending direction (i.e., the cycle in the θ-direction).

The mean array pitch Pm, the mean height Hm, and the mean aspect ratio (Hm/Pm) are determined as follows. First, the electroconductive element 1 is cut along a cross-section including the apex portions of the structures 3, and a photo of the cut cross-section is taken by a TEM (Transmission Electron Microscope). Then, the array pitch P (array pitch P1 or P2) of the structures 3 and the heights H of the structures 3 are determined from the taken TEM photo. After repeating the above-described measurement at 10 points selected at random from the electroconductive element 1, the measured values are simply averaged (arithmetically averaged) to obtain the mean array pitch Pm and the mean height Hm. Then, the mean aspect ratio (Hm/Pm) is obtained by using the mean array pitch Pm and the mean height Hm, which have been determined as described above.

The aspect ratio may be not the same for all the structures 3, and the structures 3 may be formed to have a certain height distribution. With the structures 3 having the height distribution, the dependency of the reflection characteristic upon wavelength can be reduced. It is hence possible to realize the electroconductive element 1 having an excellent antireflection characteristic.

Herein, the term "height distribution" implies that the structures 3 having two or more different heights (depths) are formed on the surface of the substrate 2. In other words, the term "height distribution" implies that the structures 3 having a reference height and the structures 3 having a height differing from the reference height are formed on the surface of the substrate 2. The structures 3 having the height differing from the reference height are formed, for example, cyclically or non-cyclically (at random) on the surface of the substrate 2. In the former case, the cyclic direction is, for example, the track extending direction or the column direction.

A foot (root) portion 3a is preferably formed at the periphery of the structure 3. With the presence of the foot portions 3a, the structures 3 can be more easily peeled from a mold, for example, in a process of manufacturing the electroconductive (optical) element 1. Herein, the foot portion 3a implies a projected portion formed at the periphery of the lower portion of the structure 3. From the viewpoint of improving the peeling characteristic, the foot portion 3a preferably has a curved surface having a height that is gradually reduced in the direction toward the lower portion from the apex portion of the structure 3. The foot portion 3a may be formed only in a part of the periphery of the structure 3. From the viewpoint of improving the peeling characteristic, however, the foot portion 3a is preferably formed over the entire periphery of the structure 3. When the structure 3 is in the form of a recess, the foot portion is provided as a curved surface formed at the periphery of an opening of the recess that serves as the structure 3.

When the structures 3 are arrayed in the hexagonal lattice pattern or the quasi-hexagonal lattice pattern, the height H of the structure 3 is defined as the height of the structure 3 from the bottom located in the column direction. The height of the structure 3 from the bottom located in the track extending direction (X-direction) is smaller than that of the structure 3 from the bottom located in the column direction (Y-direction), and the height of the structure 3 from the bottom in an area other than the track extending direction is substantially the same as that from the bottom located in the column direction. Therefore, the height of the sub-wavelength structure is represented by the height from the bottom located in the column direction. When the structure 3 is in the form of a recess, the height H of the structure 3 in the above-mentioned formula (1) is provided as a depth H of the structure 3.

Given that the array pitch of the structures 3 in the same track is P1 and the array pitch of the structures 3 between two adjacent tracks is P2, a ratio P1/P2 satisfies preferably the relationship of 1.00≤P1/P2≤1.2 or 1.00<P1/P2≤1.2 and more preferably the relationship of 1.00≤P1/P2≤1.1 or 1.00<P1/P2≤1.1. By setting the ratio P1/P2 to satisfy such a numerical range, it is possible to increase the packing rate of the structures 3 having the elliptic conical shape or the truncated elliptic conical shape, and to improve the antireflection characteristic.

The packing rate of the structures 3 in the substrate surface is 65% or above, preferably 73% or above, and more preferably 86% or above with 100% being an upper limit. By setting the packing rate to fall in such a range, the antireflection characteristic can be improved. In order to increase the packing rate, it is preferable that the structures 3 are distorted by joining the lower portions of the adjacent structures 3 to each other, or by adjusting the ellipticity of the bottom surface of the structure 3.

Herein, the packing rate (mean packing rate) of the structures 3 is determined as follows.

First, a photo of the surface of the electroconductive element 1 is taken as a "Top View" by using a Scanning Electron Microscope (SEM). After selecting unit lattices Uc at random from the taken SEM photo, an array pitch P1 of the unit lattices Uc and a track pitch Tp are measured (see FIG. 2A). Further, an area S of the bottom surface of the structure 3 positioned at the center of the relevant unit lattice Uc is measured through image processing. Then, the packing rate is determined from the following formula (3) by using the measured array pitch P1, track pitch Tp, and area S of the bottom surface:

Packing rate=(S(hex.)/S(unit))×100   (3)

Area of unit lattice: S(unit)=P1×2Tp

Area of bottom surface of structure positioned inside unit lattice: S(hex.)=2S

The above-described process of calculating the packing rate is performed on 10 unit lattices that are selected at random from the taken SEM photo. Further, the measured values are simply averaged (arithmetically averaged) to obtain a mean value of the packing rate, and the mean value is provided as the packing rate of the structures 3 in the substrate surface.

When the structures 3 are overlapped with each other, or when a sub-structure, such as the projected portion 6, is present between the structures 3, the packing rate can be obtained by a method of determining an area ratio while setting a threshold at a level corresponding to 5% of the height of the structure 3.

Figure 8:
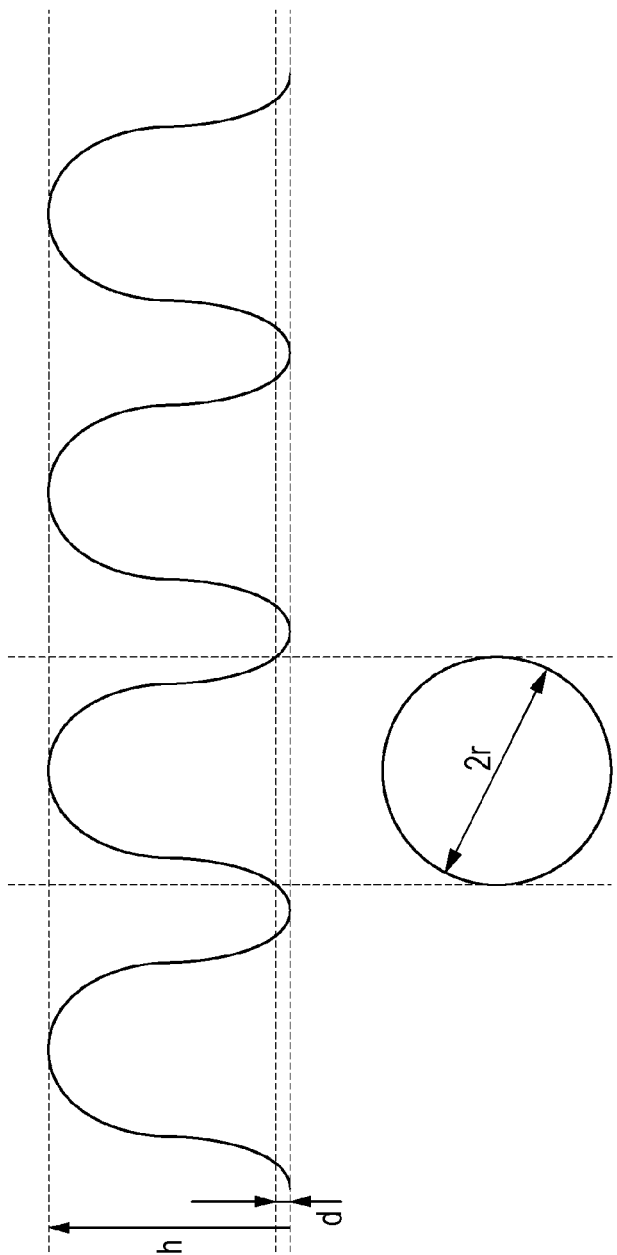
FIG. 8 is an illustration to explain a manner of setting bottom surfaces of structures when the boundary between the structures is unclear.
Figure 9A:
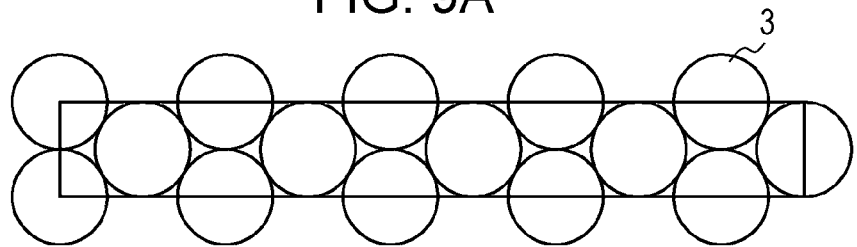
FIGS. 9A to 9D illustrate the shapes of the bottom surfaces of the structures when ellipticity of the bottom surface is changed.
Figure 9B:
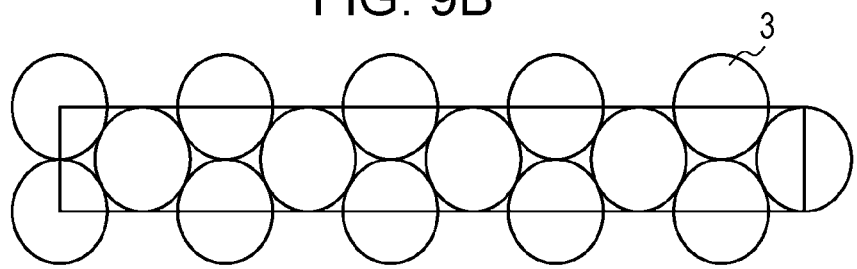
Figure 9C:
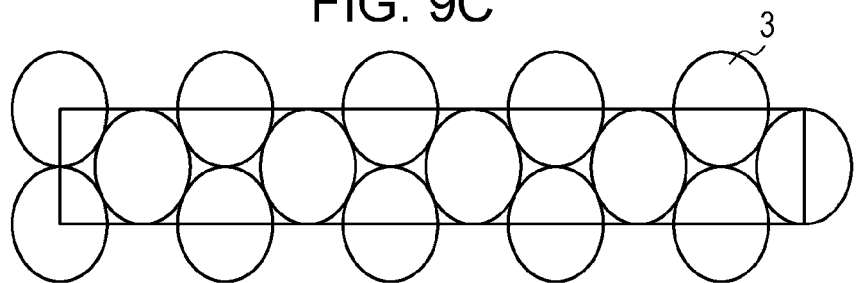
Figure 9D:
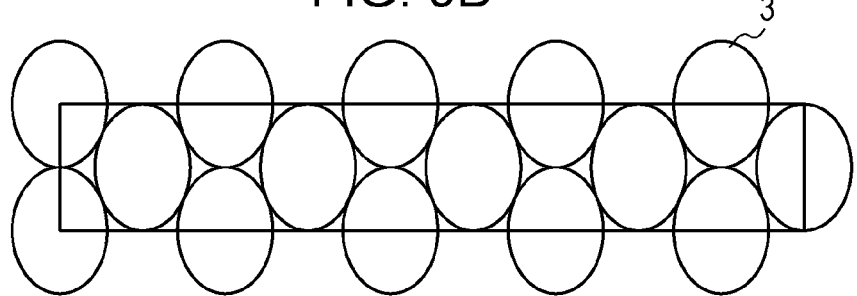

FIG. 8 is an illustration to explain a manner of calculating the packing rate when the boundary between the structures 3 is unclear. When the boundary between the structures 3 is unclear, the packing rate is determined by setting, based on the photo of the cross-section observed with the SEM, a threshold at a level corresponding to 5% (=(d/h)×100) of the height h of the structure 3, as illustrated in FIG. 8, and by calculating a diameter of the structure 3 at the height d. When the bottom surface of the structure 3 has an elliptic shape, the above-mentioned process is similarly performed for each of the major axis and the minor axis of the elliptic shape.

FIGS. 9A to 9D illustrate the shapes of the bottom surfaces of the structures 3 when ellipticity of the bottom surface is changed. Ellipses illustrated in FIGS. 9A to 9D have ellipticity of 100%, 110%, 120%, and 141%, respectively. By changing the ellipticity in such a way, the packing rate of the structures 3 in the substrate surface can be changed. When the structures 3 are formed in the quasi-hexagonal lattice pattern, the bottom surface of the structure 3 preferably has ellipticity e in the range of 100%<e≤150%. By setting the ellipticity e to fall in such a range, the packing rate of the structures 3 can be increased and an excellent antireflection characteristic can be obtained.

Given that the length of an axis of the bottom surface of the structure 3 in the track direction (X-direction) is a and the length of an axis thereof in the column direction (Y-direction) perpendicular to the track direction is b, the ellipticity e is defined as (a/b)×100. The lengths a and b of the axes of the structure 3 are determined as follows. First, a photo of the surface of the electroconductive element 1 is taken as a "Top View" by using a Scanning Electron Microscope (SEM), and ten structures 3 are extracted at random from the taken SEM photo. Then, the lengths a and b of the axes of the bottom surface for each of the extracted structure 3 are measured. Further, the measured values of a and b are simply averaged (arithmetically averaged) to obtain respective mean values of the lengths a and b, and the mean values are provided as the lengths a and b of the axes of the structures 3.

Figure 10A:
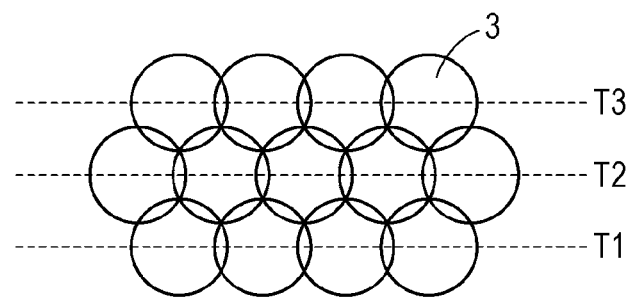
FIG. 10A illustrates one example of an array of structures each having a circular conical shape or a truncated circular conical shape.
Figure 10B:
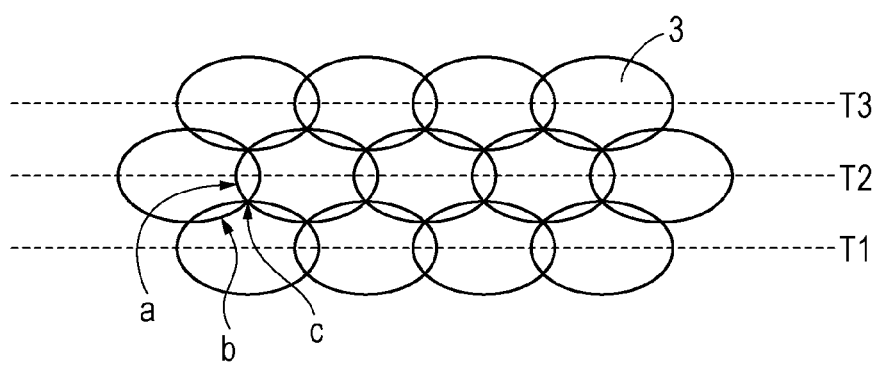
FIG. 10B illustrates one example of an array of structures each having an elliptic conical shape or a truncated elliptic conical shape.

FIG. 10A illustrates one example of an array of structures 3 each having a circular conical shape or a truncated circular conical shape, and FIG. 10B illustrates one example of an array of structures 3 each having an elliptic conical shape or an elliptic truncated conical shape. As illustrated in FIGS. 10A and 10B, the structures 3 are preferably arrayed such that their lower portions are joined to each other in an overlapped relation. In more detail, the lower portion of one structure 3 is preferably joined to the lower portion(s) of part or all of other adjacent structures 3. In even more detail, the lower portions of the adjacent structures 3 are preferably joined to each other in either the track direction or the θ-direction, or in both of those directions. FIGS. 10A and 10B illustrate an example in which the lower portions of all the adjacent structures 3 are joined to each other. By joining the structures 3 to each other in such a way, the packing rate of the structures 3 can be increased. More specifically, the structures 3 are preferably joined to each other at their lower portions corresponding to ¼ or below of a maximum value in a wavelength band of light under environment for use in terms of optical length taking into consideration the refractive index. As a result, an excellent antireflection characteristic can be obtained.

As illustrated in FIG. 10B, the lower portions of the structures 3 adjacent to each other in the same track are overlapped to form a first joined portion a, and the lower portions of the structures 3 adjacent to each other between the adjacent tracks are overlapped to form a second joined portion b. An intersecting portion c is formed at an intersection between the first joined portion a and the second joined portion b. The position of the intersecting portion c is, for example, lower than the positions of the first joined portion a and the second joined portion b. When the lower portions of the structures 3 having the elliptic conical shape or the truncated elliptic conical shape are joined to each other, the heights of the first joined portion a, the second joined portion b, and the intersecting portion c are reduced, for example, in the order named.

A ratio of a length or diameter 2r (see FIG. 8) to the array pitch P1 (i.e., (2r/P1)×100) is 85% or above, preferably 90% or above, and more preferably 95% or above. By setting the ratio to fall in such a range, the packing rate of the structures 3 can be increased and the antireflection characteristic can be improved. If the ratio ((2r/P1)×100) is increased and the structures 3 are excessively overlapped with each other, the antireflection characteristic tends to degrade. Accordingly, an upper limit of the ratio ((2r/P1)×100) is preferably set such that the structures 3 are joined to each other at their lower portions corresponding to ¼ or below of a maximum value in a wavelength band of light under environment for use in terms of optical length taking into consideration the refractive index. Herein, the array pitch P1 represents the array pitch of the structures 3 in the track direction, and the length 2r represents the length of an axis of the bottom surface of the structure 3 in the track direction. More specifically, the length 2r is provided as a diameter when the bottom surface of the structure 3 is circular, and it is provided as the length of a major axis when the bottom surface of the structure 3 is elliptic.

(Electroconductive Layer)

The electroconductive layer 4 is, for example, a transparent electroconductive layer. The transparent electroconductive layer is, for example, an inorganic transparent electroconductive film. Further, the electroconductive layer 4 is formed of, e.g., a single-layer film.

The inorganic transparent electroconductive film preferably contains, as a main component, a transparent oxide semiconductor. Examples of the transparent oxide semiconductor usable here include binary compounds, such as $SnO_2$, $InO_2$, ZnO and CdO, ternary compounds containing at least one of Sn, In, Zn and Cd, which are constituent elements of the binary compounds, and multi-component (composite) oxides. Practical examples of the transparent oxide semiconductor include indium tin oxide (ITO), zinc oxide (ZnO), aluminum-doped zinc oxide (AZO($Al_2O_3$, ZnO)), SZO, fluorine-doped tin oxide (FTO), tin oxide ($SnO_2$), gallium-doped zinc oxide (GZO), and indium zinc oxide (IZO($In_2O_3$, ZnO)). Among those examples, indium tin oxide (ITO) is particularly preferable from the viewpoint of high reliability and low resistivity. Further, from the viewpoint of increasing electrical conductivity, the material of the inorganic transparent electroconductive film is preferably in the mixed state of an amorphous phase and a polycrystalline phase.

The materials of the electroconductive layer 4 may contain a metal film. The metal film can be made of, for example, at least one selected from a group including Ag, Al, Au, Pt, Pd, Ni, Cr, Nb, W, Mo, Ti and Cu. Further, the electroconductive layer 4 may contain, as a main component, at least one selected from a group including an electroconductive high polymer, metallic nano-particles, and carbon nano-tubes.

The surface resistance of the electroconductive layer 4 in the first region $R_1$ is preferably 5000Ω/(unit area) or below. If the surface resistance exceeds 5000Ω/(unit area), there is a tendency that resistance is too high and the electroconductive layer 4 is no longer used as an electrode.

Structure of Roll-Shaped Master

Figure 11A:
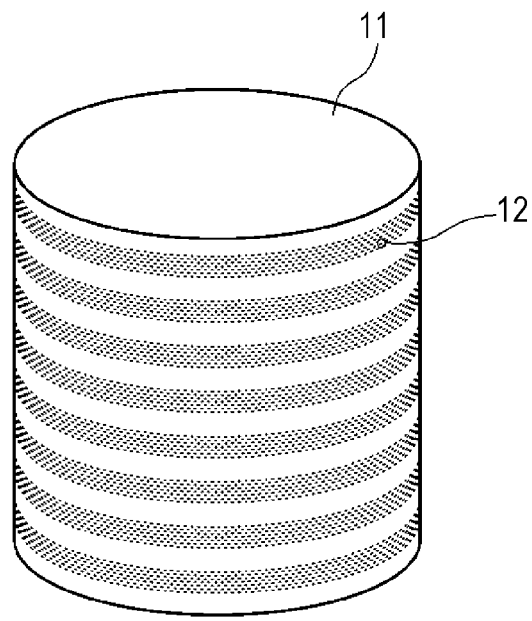
FIG. 11A is a perspective view illustrating one example of structure of a roll-shaped master for fabricating a substrate.
Figure 11B:
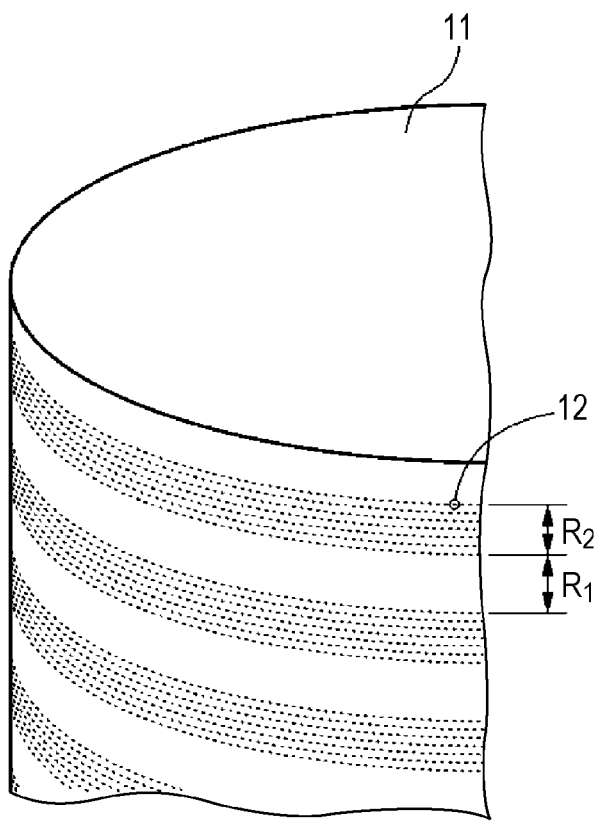
FIG. 11B is an enlarged perspective view illustrating a part of the roll-shaped master illustrated in FIG. 11A.

FIG. 11A is a perspective view illustrating one example of structure of a roll-shaped master 11 for fabricating the substrate, and FIG. 11B is an enlarged perspective view illustrating a part of the roll-shaped master illustrated in FIG. 11A. The roll-shaped master 11 is a master for forming the above-described structures 3 on the substrate surface. The roll-shaped master 11 has, for example, a columnar or cylindrical shape. Many first regions $R_1$ and many second regions $R_2$ are alternately formed in a columnar or cylindrical surface of the roll-shaped master 11. FIGS. 11A and 11B illustrate the case where the first region $R_1$ and the second region $R_2$ are circumferentially formed in ring shapes. However, the shapes of the first region $R_1$ and the second region $R_2$ are not limited to the illustrated one, and they can be selected, as appropriate, depending on the desired shape of a wiring pattern, i.e., the shape of the electroconductive layer 4 to be formed in the first region $R_1$. The roll-shaped master 11 can be made of, e.g., glass, but the material of the roll-shaped master 11 is not particularly limited to glass.

Figure 12A:
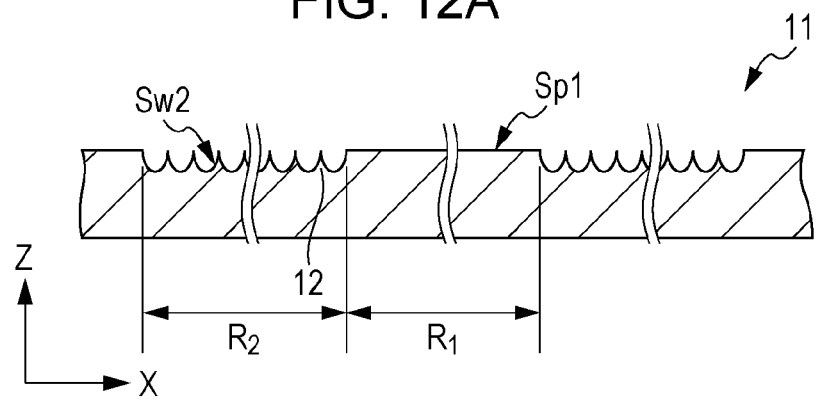
FIG. 12A is an enlarged sectional view illustrating a part of the roll-shaped master illustrated in FIG. 11A.
Figure 12B:
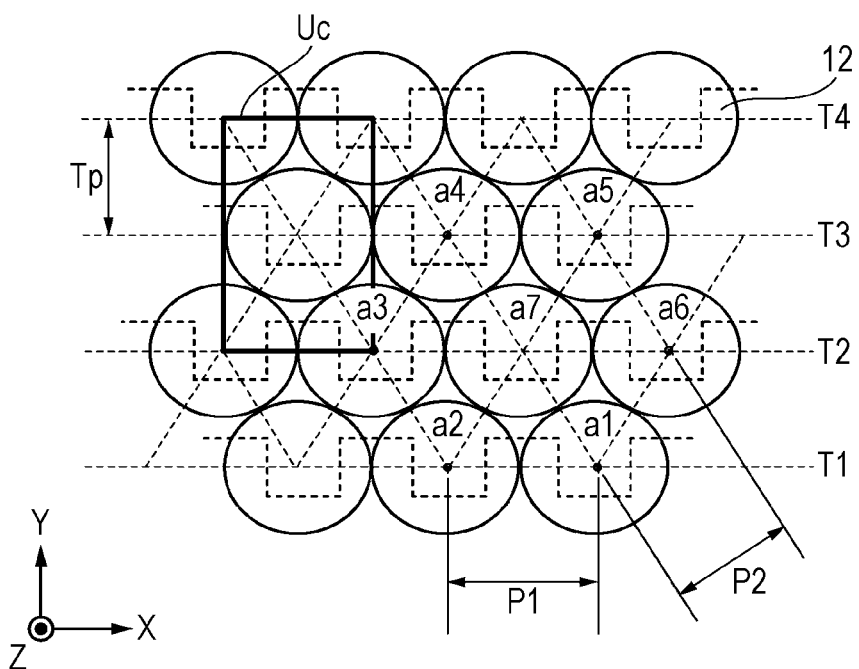
FIG. 12B is an enlarged plan view illustrating a part of the second region illustrated in FIG. 11A.

FIG. 12A is an enlarged sectional view illustrating a part of the roll-shaped master illustrated in FIG. 11A, and FIG. 12B is an enlarged plan view illustrating a part of the second region illustrated in FIG. 11A. In the second region $R_2$ of the roll-shaped master 11, many structures 12 in the form of recesses, for example, are arrayed at an array pitch corresponding to a wavelength not longer than those of visible light. The structures 12 in the form of recesses, for example, are not formed in the first region $R_1$, whereby the first region $R_1$ has a flat surface. The many structures 12 in the second region $R_2$ are arrayed in the hexagonal lattice pattern or the quasi-hexagonal lattice pattern in which centers of the structures 12 are positioned at points a1 to a7 over three tracks (T1 to T3) adjacent to each other. The hexagonal lattice pattern or the quasi-hexagonal lattice pattern can be recorded or drawn by performing patterning with a roll-shaped master exposure apparatus, described later, such that two-dimensional patterns are spatially linked with each other by generating a polarity reversing formatter signal per track in synchronism with a rotation controller for a recording apparatus and feeding the roll-shaped master at an appropriate feed pitch on condition of Constant Angular Velocity (CAV). Thus, by properly setting the frequency of the polarity reversing formatter signal and the number of revolutions of the roll-shaped master, a lattice pattern having a uniform spatial frequency can be formed in the desired recording zone.

[Configuration of Exposure Apparatus]

Figure 13:
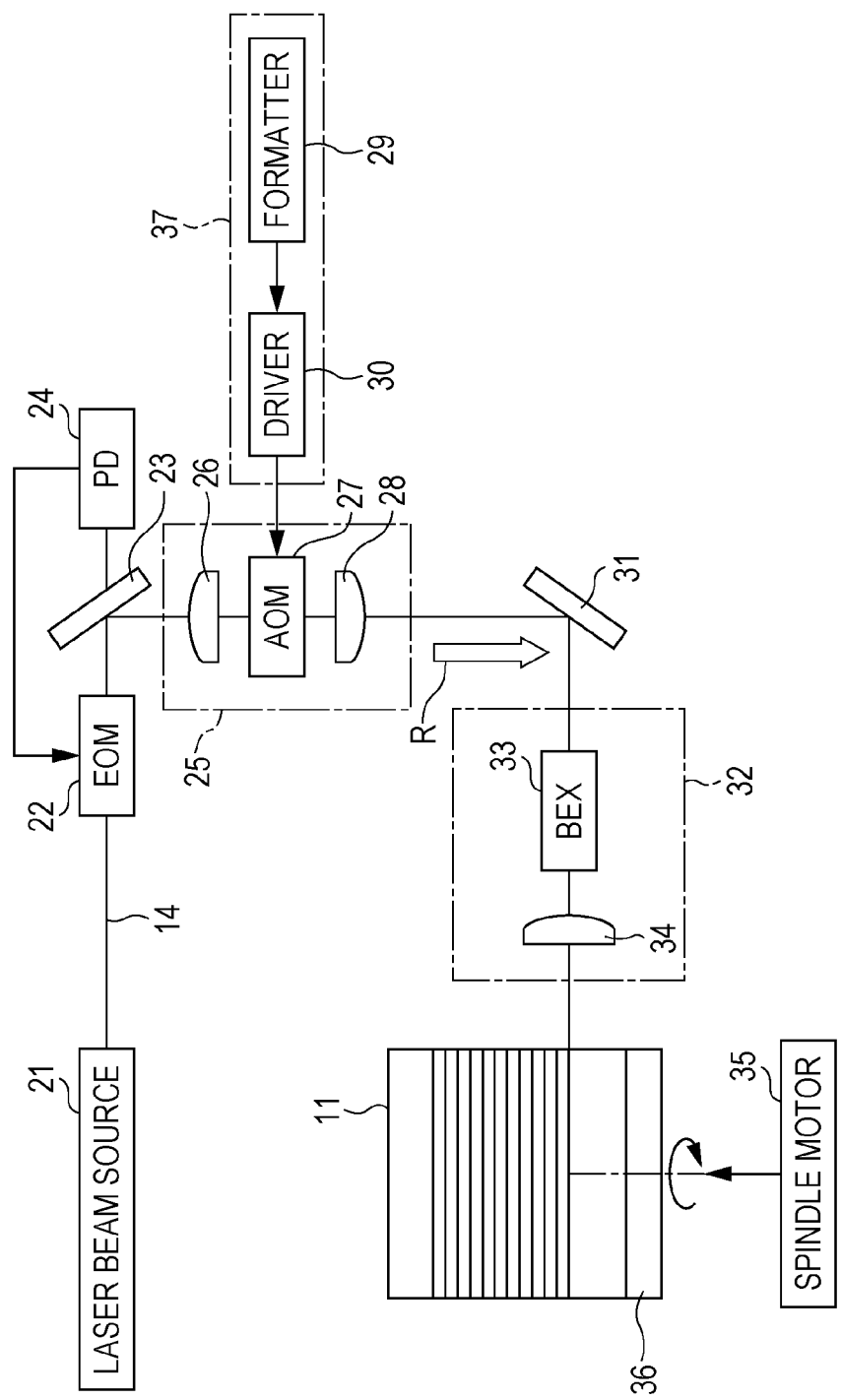
FIG. 13 is a block diagram illustrating one example of configuration of a roll-shaped master exposure apparatus.

FIG. 13 is a block diagram illustrating one example of configuration of the roll-shaped master exposure apparatus. The configuration of the roll-shaped master exposure apparatus will be described below with reference to FIG. 13. The roll-shaped master exposure apparatus illustrated in FIG. 13 can be constructed on the basis of, e.g., an optical disk recording apparatus.

A laser beam source 21 is a light source to expose a resist layer coated on the surface of a master 11, which serves as a recording medium, and it oscillates a laser beam 14 of a wavelength of, e.g., λ=266 nm for the recording purpose. The laser beam 14 emitted from the laser beam source 21 advances straight while keeping the form of a parallel beam and enters an Electro Optical Modulator (EOM) 22. The laser beam 14 having passed through the EOM 22 is reflected by a mirror 23 and is guided to a modulation optical system 25.

The mirror 23 is constituted by a polarization beam splitter and has the function of reflecting one polarized component and transmitting the other polarized component therethrough. The polarized component having passed through the mirror 23 is received by a photodiode (PD) 24, and phase modulation of the laser beam 14 is performed by controlling the EOM 22 in accordance with a signal, which is output from the photodiode 24 and which represents the amount of light received by it.

In the modulation optical system 25, the laser beam 14 is condensed by a condensing lens 26 to an Acousto-Optic Modulator (AOM) 27 made of, e.g., glass ($SiO_2$). After being subjected to intensity modulation by the AOM 27, the diverging laser beam 14 is converted to a parallel beam through a lens 28. The laser beam 14 exiting the modulation optical system 25 is reflected by a mirror 31 and is guided as a horizontal and parallel beam to a movable optical table 32.

The movable optical table 32 includes a beam expander (BEX) 33 and an objective lens 34. The laser beam 14 guided to the movable optical table 32 is shaped by the beam expander 33 into a desired beam shape and is delivered through the objective lens 34 for irradiation of the resist layer on the master 11. The master 11 is placed on a turntable 36 that is coupled to a spindle motor 35. An exposure step for the resist layer is performed by intermittently irradiating the resist layer with the laser beam 14, while the master 11 is rotated and the laser beam 14 is moved in the height direction of the master 11. A latent image formed in the exposure step has a substantially elliptic shape with a major axis extending in the circumferential direction of the master 11. The laser beam 14 is moved by displacing the movable optical table 32 in the direction of an arrow R.

The exposure apparatus includes a control mechanism 37 for forming, in the resist layer, a latent image corresponding to the two-dimensional pattern of hexagonal lattices or the quasi-hexagonal lattices, illustrated in FIG. 2A. The control mechanism 37 includes a formatter 29 and a driver 30. The formatter 29 includes a polarity reversing portion that controls the timing of irradiating the resist layer with the laser beam 14. The driver 30 receives an output from the polarity reversing portion and controls the AOM 27.

In the roll-shaped master exposure apparatus described above, a polarity reversing formatter signal is generated per track in synchronism with a rotation controller for a recording apparatus and the intensity modulation of the laser beam 14 is performed by the AOM 27 such that two-dimensional patterns are spatially linked with each other. The hexagonal lattice pattern or the quasi-hexagonal lattice pattern can be recorded by patterning the resist layer at the appropriate number of revolutions, the appropriate modulation frequency, and the appropriate feed pitch on condition of Constant Angular Velocity (CAV). In order to obtain a pattern cycle of 315 nm in the circumferential direction and a pattern cycle of 300 nm in a direction of about 60° (or a direction of about −60°) with respect to the circumferential direction, for example, the feed pitch is set to 251 nm (based on the Pythagoras' theorem). The frequency of the polarity reversing formatter signal is changed depending on the number of revolutions (e.g., 1800 rpm, 900 rpm, 450 rpm, and 225 rpm) of the roll-shaped master. For example, the frequency of the polarity reversing formatter signal corresponding to the number of revolutions 1800 rpm, 900 rpm, 450 rpm, and 225 rpm of the roll-shaped master is 37.70 MHz, 18.85 MHz, 9.34 MHz, and 4.71 MHz, respectively. In practice, the quasi-hexagonal lattice pattern having a uniform spatial frequency (e.g., a cycle of 315 nm in the circumferential direction and a cycle of 300 nm in the direction of about 60° (or a direction of about −60°) with respect to the circumferential direction) can be obtained by magnifying the beam diameter of a far ultraviolet laser beam 5 times through the beam expander (BEX) 33 on the movable optical table 32, irradiating the resist layer on the master 11 with the magnified laser beam through the objective lens 34 having the numerical aperture (NA) of 0.9, and forming fine latent images in the desired recording area.

[Method of Manufacturing Electroconductive Element]

One example of a method of manufacturing the electroconductive element 1 according to the first embodiment of the present invention will be described below with reference to FIGS. 13 to 16.

(Resist Layer Forming Step)

Figure 14A:
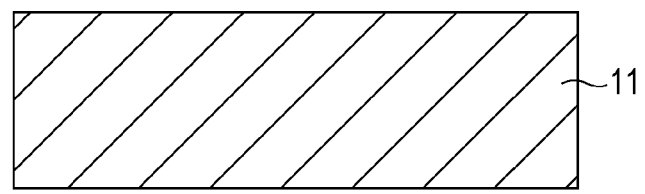
FIGS. 14A to 14C illustrate successive steps to explain one example of a method for manufacturing the electroconductive element according to the first embodiment.
Figure 14B:
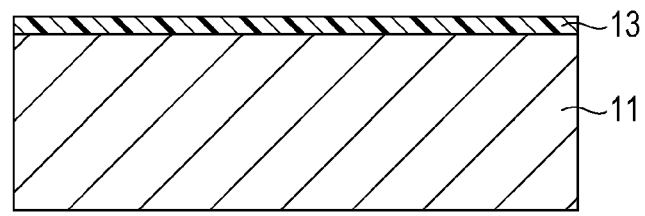

First, the columnar or cylindrical roll-shaped master 11 is prepared as illustrated in FIG. 14A. The roll-shaped master 11 is, for example, a glass-made master. Next, as illustrated in FIG. 14B, a resist layer 13 is formed on the surface of the roll-shaped master 11. The resist layer 13 may be made of, e.g., an organic resist or an inorganic resist. Examples of the organic resist usable here include a novolac-based resist and a chemical amplification-type resist. Also, examples of the inorganic resist usable here include metal compounds containing not only one kind of metal, but also two or more kinds of metals.

(Exposure Step)

Figure 14C:
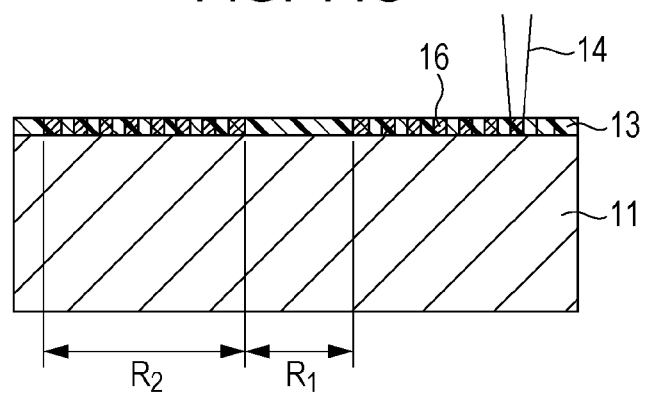

Next, as illustrated in FIG. 14C, the roll-shaped master 11 is rotated and the resist layer 13 is irradiated with the laser beam (exposure beam) 14 by using the roll-shaped master exposure apparatus described above. At that time, the resist layer 13 is irradiated with the laser beam 14 while the laser beam 14 is moved in the height direction of the roll-shaped master 11 (i.e., in a direction parallel to the center axis of the columnar or cylindrical roll-shaped master 11). Further, at that time, latent images 16 are formed only in the second region $R_2$ that corresponds to the insulating region between two wiring pattern zones, thus providing an exposed zone. On the other hand, the first region $R_1$ corresponding to the wiring pattern zone is not exposed and is provided as an unexposed zone. The latent images 16 are formed in accordance with the locus the laser beam 14 at a pitch corresponding to a wavelength not longer than those of visible light, for example.

The latent images 16 are arranged, for example, to form plural rows of tracks in the surface of the roll-shaped master 11 and to provide the hexagonal lattice pattern or the quasi-hexagonal lattice pattern. Each of the latent images 16 has, for example, an elliptic shape having a major axis oriented in the track extending direction.

(Development Step)

Next, as one example of a development step illustrated in FIG. 15A, a developing solution is dropped onto the resist layer 13 to develop the resist layer 13, while the roll-shaped master 11 is rotated. When the resist layer 13 is formed of a positive resist, a dissolution rate with the developing solution is higher in exposed areas having been subjected to the exposure by the laser beam 14 than unexposed areas. Therefore, a pattern corresponding to the latent images (exposed areas) 16 is formed in the resist layer 13, as illustrated in FIG. 15A. As a result, openings in the hexagonal lattice pattern or the quasi-hexagonal lattice pattern, for example, are formed in the resist layer 13 in the second region $R_2$. On the other hand, openings are not formed in the resist layer 13 in the first region $R_1$, and the first region $R_1$ is entirely held in a state covered with the resist layer 13. Stated another way, a mask having an opening pattern only in the second region $R_2$ is formed on the surface of the roll-shaped master 11.

(Etching Step)

Next, the surface of the roll-shaped master 11 is etched by using, as a mask, the pattern of the resist layer 13 (i.e., the resist pattern) formed on the roll-shaped master 11. As a result, in the second region $R_2$ of the surface of the roll-shaped master 11, the etching is progressed through the openings. Thus, as illustrated in FIG. 15B, structures (recesses) 12 each having, e.g., an elliptic conical shape or a truncated elliptic conical shape with a major axis oriented in the track extending direction are formed in the second region $R_2$. On the other hand, in the first region $R_1$ of the surface of the roll-shaped master 11, since the first region $R_1$ is entirely covered with the resist layer 13, the etching is not progressed and the surface of the roll-shaped master 11 is maintained as a flat surface. The etching can be practiced as, for example, dry etching.

Through the above-described steps, the objective roll-shaped master 11 can be obtained.

(Transfer Step)

Next, as one example of a transfer step illustrated in FIG. 15C, the roll-shaped master 11 and the substrate 2, e.g., a film, including a transfer material 15 coated thereon, are brought into close contact with each other. After curing the transfer material 15 by irradiation with, e.g., an ultraviolet ray, the substrate 2 integral with the cured transfer material 15 is peeled from the roll-shaped master 11.

The transfer material 15 contains, for example, an ultraviolet curable material and an initiator. The transfer material 15 may further contain, as necessary, a filler, a functional additive, etc.

The ultraviolet curable material is made of, for example, a monofunctional monomer, a bifunctional monomer, a multifunctional monomer, etc. More specifically, the ultraviolet curable material contains the following materials alone or in a mixed form.

Example of the monofunctional monomer include carboxylic acids (such as acrylic acid), hydroxy compounds (such as 2-hydroxyethyl acrylate, 2-hydroxypropyl acrylate, and 4-hydroxybutyl acrylate), alkyls, alicyclic compounds (such as isobutyl acrylate, t-butyl acrylate, isooctyl acrylate, lauryl acrylate, stearyl acrylate, isobornyl acrylate, and cyclohexyl acrylate), and other functional monomers (such as 2-methoxyethyl acrylate, methoxyethylene glycol acrylate, 2-ethoxyethyl acrylate, tetrahydrofurfuryl acrylate, benzyl acrylate, ethyl carbitol acrylate, phenoxyethyl acrylate, N,N-dimethylaminoethyl acrylate, N,N-dimethylaminopropylacryl amide, N,N-dimethylacryl amide, acryloyl morpholine, N-isopropylacryl amide, N,N-diethylacryl amide, N-vinylpyrrolidone, 2-(perfluorooctyl)ethyl acrylate, 3-(perfluorohexyl)-2-hydroxypropyl acrylate, 3-(perfluorooctyl)-2-hydroxypropyl acrylate, 2-(perfluordecyl)ethyl acrylate, 2-(perfluoro-3-methylbutyl)ethyl acrylate, 2,4,6-tribromophenol acrylate, 2,4,6-tribromophenol methacrylate, 2-(2,4,6-tribromophenoxy)ethyl acrylate, and 2-ethylhexyl acrylate.

Examples of the bifunctional monomer include tri(propylene glycol) diacrylate, trimethylolpropane diaryl ether, and urethane acrylate.

Examples of the multifunctional monomer include trimethylolpropane triacrylate, dipentaerythritol penta-/hexa-acrylate, and ditrimethylolpropane tetracrylate.

Examples of the initiator include 2,2-dimethoxy-1,2-diphenylethane-1-on, 1-hydroxy-cyclohexyl phenyl ketone, and 2-hydroxy-2-methyl-1-phenylpropane-1-on.

The filler used here can be, e.g., inorganic fine particles or organic fine particles. Examples of the inorganic fine particles include metal oxide fine particles, such as $SiO_2$, $TiO_2$, $ZrO_2$, $SnO_2$, and $Al_2O_3$.

Examples of the functional additive include a leveling agent, a surface adjusting agent, and an anti-foaming agent. The materials of the substrate 2 include, for example, a methylmethacrylate (co-)polymer, polycarbonate, a styrene (co-) polymer, a methymethacrylate-styrene copolymer, cellulose diacetate, cellulose triacetate, cellulose acetate butylate, polyester, polyamide, polyimide, polyethersulfone, polysulfone, polypropylene, polymethylpentene, polyvinyl chloride, polyvinyl acetal, polyether ketone, polyurethane, and glass.

A method of forming the substrate 2 is not limited to particular one. For example, an injection molding process, an extrusion molding process, a casting process, etc. can be used to form the substrate 2. Surface treatment, such as corona treatment, may be performed on the substrate surface in case of necessity.

(Metal Layer Forming Step)

Next, the metal layer 5 is formed, as necessary, in the first region $R_1$ and the second region $R_2$ of the substrate surface. The metal layer 5 can be formed, for example, by a CVD (Chemical Vapor Deposition) process (i.e., a technique for precipitating a thin film from a gas phase by utilizing a chemical reaction), such as thermal CVD, plasma CVD, and photo-CVD, and a PVD (Physical Vapor Deposition) process (i.e., a technique for physically aggregating a vaporized material on a substrate in vacuum and forming a thin film), such as vacuum vapor deposition, plasma-aided vapor deposition, sputtering, and ion plating.

(Step of Forming Electroconductive Layer)

Next, as illustrated in FIG. 16B, the electroconductive layer 4 is formed in the first region $R_1$ and the second region $R_2$ of the substrate surface. As a result, the electroconductive layer 4 is formed in different states in the first region $R_1$ and the second region $R_2$. The electroconductive layer 4 can be formed, for example, by a dry process or a wet process. In practice, the electroconductive layer 4 can be formed, for example, by a chemical forming process or a physical forming process. Examples of the chemical forming process include a CVD (Chemical Vapor Deposition) process, such as thermal CVD, plasma CVD, and photo-CVD, a spraying process, dipping process, and a powder applying process. Examples of the physical forming process include a vacuum vapor deposition process, a sputtering process, an ion plating process, and a pulsed-laser vapor deposition process. Further, the electroconductive layer 4 may be formed while the substrate 2 is heated. Next, when necessary, annealing is performed on the electroconductive layer 4. With the annealing, the electroconductive layer 4 is brought into the mixed state of an amorphous phase and a polycrystalline phase.

(Step of Removing Electroconductive Layer)

Next, as illustrated in FIG. 16C, etching is performed on the substrate surface on which the electroconductive layer 4 has been formed. With the etching, the electroconductive layer 4 is removed from the second region $R_2$, whereas the electroconductive layer 4 remains in the first region $R_1$. Accordingly, the electroconductive layer 4 formed in the first region $R_1$ functions as a wiring pattern, whereas the second region $R_2$ functions as an insulating region between the wiring patterns. The etching can be practiced as wet etching or dry etching. Further, the etching may be practiced in combination of wet etching and dry etching. An etchant used in the wet etching can be, for example, one or more of sulfuric acid, hydrochloric acid, nitric acid, and ferric chloride. In addition, oxalic acid, mixed acid of phosphoric acid, acetic acid and nitric acid, or an aqueous solution of ammonium cerium (IV) nitrate may also be used as the etchant. The dry etching can be practiced as plasma etching or Reactive Ion Etching (RIE).

Herein, the expression "remove" implies one of the following three cases; (1) the electroconductive layer 4 is completely eliminated from the second region $R_2$, (2) the electroconductive layer 4 is partly eliminated into such a discontinuous state (e.g., a state of islands) that the electroconductive layer 4 does not exhibit electrical conductivity in the second region $R_2$, or (3) the electroconductive layer 4 is thinned to such an extent that the electroconductive layer 4 does not exhibit electrical conductivity in the second region $R_2$.

(Washing Step)

Next, the substrate surface having been subjected to the etching is washed, as necessary.

Through the above-described steps, the objective electroconductive element 1 is obtained.

In short, according to the first embodiment, the electroconductive layer 4 is formed on the substrate surface having the flat surface Sp1 and the wavy surface Sw2. Then, the electroconductive pattern is formed by processing the electroconductive layers 4 on the flat surface Sp1 and the wavy surface Sw2, based on the difference between respective states of the electroconductive layers 4 formed on the flat surface Sp1 and the wavy surface Sw2, such that the electroconductive layer 4 formed on the wavy surface Sw2 is removed, while the electroconductive layer 4 formed on the flat surface Sp1 remains. Hence, the electroconductive element 1 can be realized with high precision and a high throughput.

(Modifications)

Figure 36A:
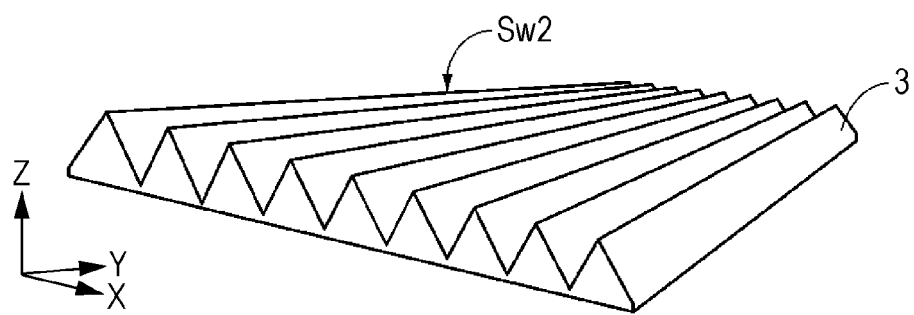
FIG. 36A is an enlarged perspective view illustrating a part of a second region according to a modification.
Figure 36B:
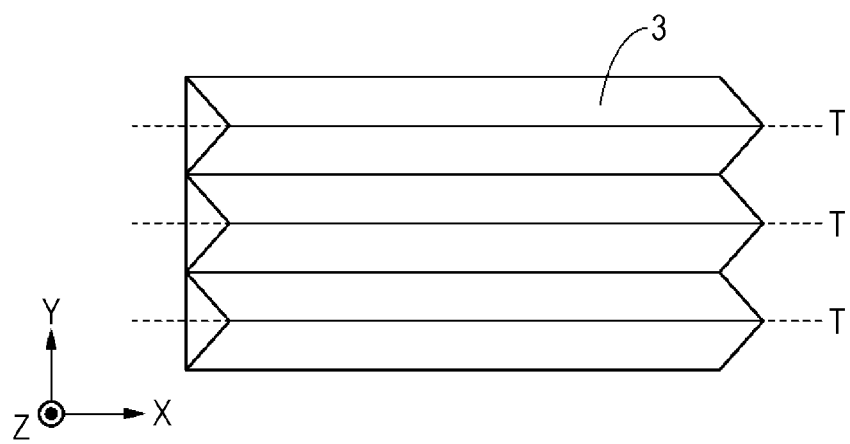
FIG. 36B is an enlarged plan view illustrating the part of the second region illustrated in FIG. 36A.

FIG. 36A is an enlarged perspective view illustrating a part of a second region according to a modification, and FIG. 36B is an enlarged plan view illustrating the part of the second region illustrated in FIG. 36A. As illustrated in FIGS. 36A and 36B, the plural structures 3 may be one-dimensionally arrayed in the second region $R_2$, for example, such that the structures 3 are arranged in plural rows of tracks T to extend respectively along the tracks T, thereby forming the wavy surface Sw2 in a one-dimensional pattern. The track T may have, for example, a linear or circular-arc shape. Further, the track T having a linear or circular-arc shape may be extended in the wobbling form.

The structure 3 is, e.g., a columnar member extending in one direction, and its cross-sectional shape is, e.g., triangular, triangular with an apex portion having a curvature R, polygonal, semicircular, semi-elliptic, or parabolic. However, the cross-sectional shape of the structure 3 is not limited to those ones. Practical examples of the shape of the structure 3 include a lenticular shape and a prism-like shape, but the shape of the structure 3 is not limited to those ones. The height of the structure 3 may be changed along the track extending direction. Further, the structures 3 may be intermittently formed in the track extending direction.

2. Second Embodiment

Structure of Electroconductive (Optical) Element

Figure 17A:
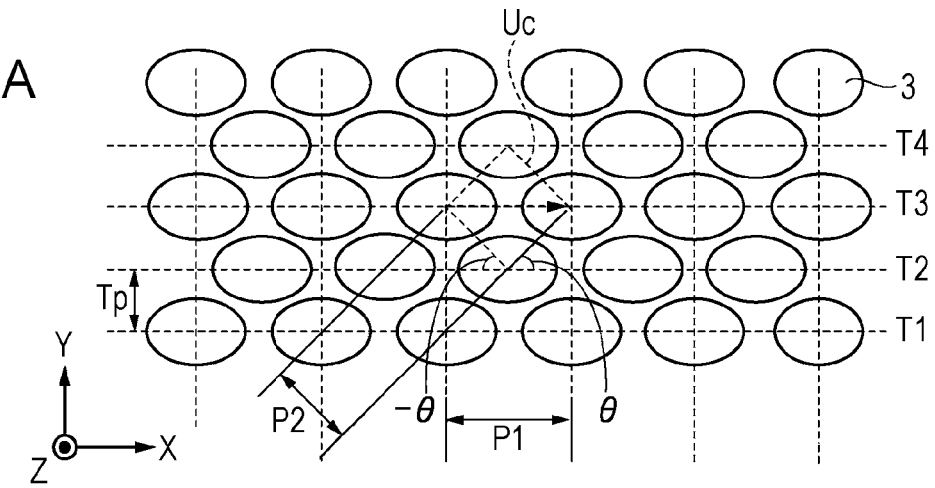
FIG. 17A is an enlarged plan view of a part of a second region of an electroconductive element according to a second embodiment.
Figure 17B:
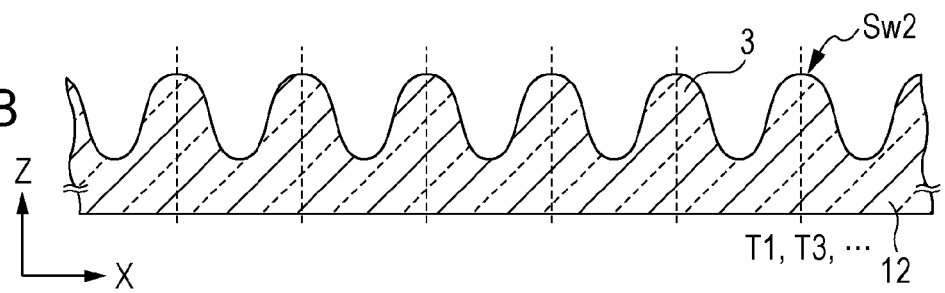
FIG. 17B is a sectional view taken along each of tracks T1, T3, etc. in the second region of the electroconductive element according to the second embodiment.
Figure 17C:
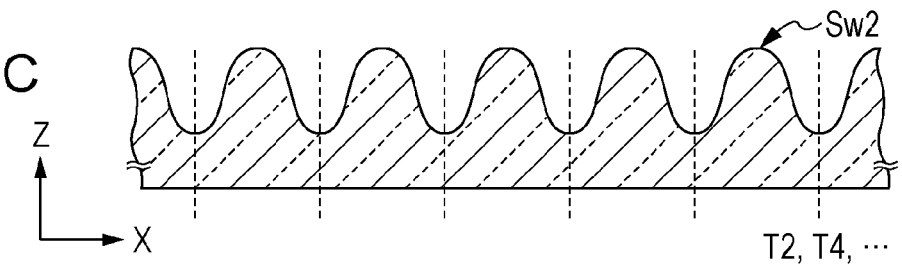
FIG. 17C is a sectional view taken along each of tracks T2, T4, etc. in FIG. 17A.
Figure 17D:
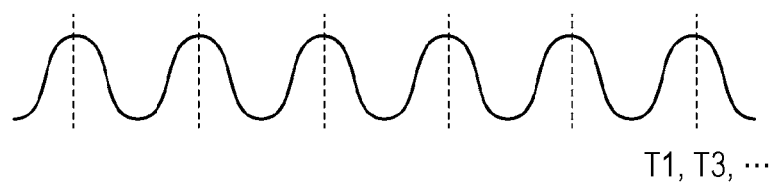
FIG. 17D is a chart illustrating a modulated waveform of a laser beam that is used to form a latent image corresponding to each of the tracks T1, T3, etc. in FIG. 17A.
Figure 17E:
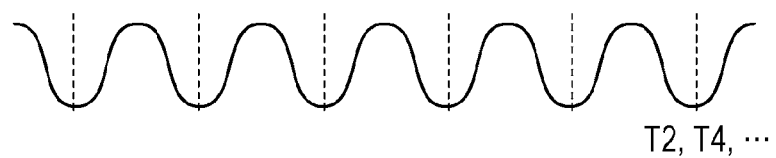
FIG. 17E is a chart illustrating a modulated waveform of a laser beam that is used to form a latent image corresponding to each of the tracks T2, T4, etc.

FIG. 17A is an enlarged plan view of a part of a second region of an electroconductive element according to a second embodiment of the present invention. FIG. 17B is a sectional view taken along each of tracks T1, T3, etc. in the second region of the electroconductive element according to the second embodiment of the present invention, and FIG. 17C is a sectional view taken along each of tracks T2, T4, etc. in FIG. 17A. FIG. 17D is a chart illustrating a modulated waveform of a laser beam that is used to form a latent image corresponding to each of the tracks T1, T3, etc. in FIG. 17A, and FIG. 17E is a chart illustrating a modulated waveform of a laser beam that is used to form a latent image corresponding to each of the tracks T2, T4, etc. in FIG. 17A.

The electroconductive element 1 according to the second embodiment differs from the electroconductive element 1 according to the first embodiment in that many structures 3 formed in the second region $R_2$ are arrayed in every three rows of adjacent tracks so as to form a tetragonal lattice pattern or a quasi-tetragonal lattice pattern. In the second embodiment, the term "quasi-tetragonal lattice pattern" implies a tetragonal lattice pattern that is, unlike the regular tetragonal lattice pattern, distorted by being extended in the track extending direction (X-axis direction).

An array pitch P1 of the structures 3 in the same track is preferably longer than an array pitch P2 of the structures 3 between two adjacent tracks. Further, given that the array pitch of the structures 3 in the same track is P1 and the array pitch of the structures 3 between two adjacent tracks is P2, P1/P2 preferably satisfies the relationship of $1.4 < P1/P2 \leq 1.5$. By setting P1/P2 to satisfy such a numerical range, the packing rate of the structures 3 having the elliptic conical shape or the truncated elliptic conical shape can be increased and the antireflection characteristic can be improved.

A height H2 of the structure 3 from the bottom located in the $\pm\theta$-directions with respect to the track extending direction is preferably smaller than a height H1 of the structure 3 from the bottom located in the track extending direction. In other words, the heights H1 and H2 of the structure 3 preferably satisfy the relationship of H1>H2. When the structures 3 are arrayed in the tetragonal lattice pattern or the quasi-tetragonal lattice pattern, the height H of the structure 3 is defined as the height of the structure 3 from the bottom located in the direction in which the structures 3 are arrayed (i.e., in the track (extending) direction).

Figure 18:
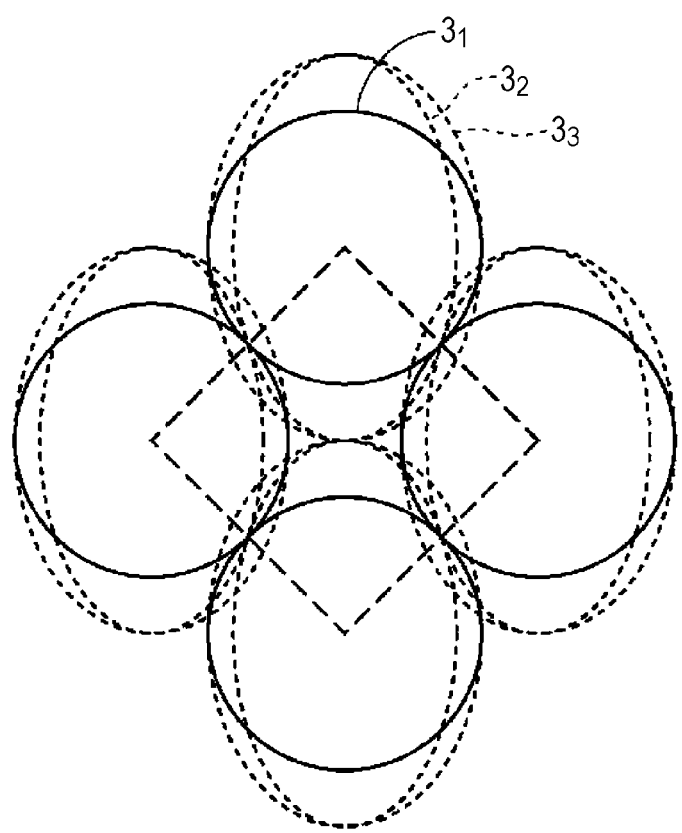
FIG. 18 illustrates the shapes of bottom surfaces of structures when ellipticity of the bottom surface is changed.

FIG. 18 illustrates the shapes of bottom surfaces of the structures 3 when ellipticity of the bottom surface is changed. Three ellipses $3_1$, $3_2$ and $3_3$ have ellipticity of 100%, 163.3% and 141%, respectively. By changing the ellipticity in such a way, the packing rate of the structures 3 in the substrate surface can be changed. When the structures 3 are arrayed in the tetragonal lattice pattern or the quasi-tetragonal lattice pattern, the ellipticity e of the bottom surface of the structure is preferably within the range of $150\% \leq e \leq 180\%$. By setting the ellipticity e to fall in that range, the packing rate of the structures 3 can be increased and an excellent antireflection characteristic can be obtained.

The packing rate of the structures 3 in the substrate surface is 65% or above, preferably 73% or above, and more preferably 86% or above with 100% being an upper limit. By setting the packing rate to fall in such a range, the antireflection characteristic can be improved.

Herein, the packing rate (mean packing rate) of the structures 3 is determined as follows.

First, a photo of the surface of the electroconductive element 1 is taken as a "Top View" by using a Scanning Electron Microscope (SEM). After selecting unit lattices Uc at random from the taken SEM photo, an array pitch P1 of the unit lattices Uc and a track pitch Tp are measured (see FIG. 17A). Further, an area S of the bottom surface of one of four structures 3 positioned inside the relevant unit lattice Uc is measured through image processing. Then, the packing rate is determined from the following formula (4) by using the measured array pitch P1, track pitch Tp, and area S of the bottom surface:

$$\text{Packing rate} = (S(\text{tetra})/S(\text{unit})) \times 100 \quad (4)$$

$$\text{Area of unit lattice: } S(\text{unit}) = 2 \times ((P1 \times Tp) \times (1/2)) = P1 \times Tp$$

$$\text{Area of bottom surface of structure positioned inside unit lattice: } S(\text{tetra}) = S$$

The above-described process of calculating the packing rate is performed on 10 unit lattices that are selected at random from the taken SEM photo. Further, the measured values are simply averaged (arithmetically averaged) to obtain a mean value of the packing rate, and the mean value is provided as the packing rate of the structures 3 in the substrate surface.

A ratio of a length 2r to the array pitch P1 (i.e., $(2r/P1) \times 100$) is 64% or above, preferably 69% or above, and more preferably 73% or above. By setting the ratio to fall in such a range, the packing rate of the structures 3 can be increased and the antireflection characteristic can be improved. Herein, the array pitch P1 represents the array pitch of the structures 3 in the track direction, and the length 2r represents the length of an axis of the bottom surface of the structure 3 in the track direction. More specifically, the length 2r is provided as the diameter when the bottom surface of the structure 3 is circular, and it is provided as the length of a major axis when the bottom surface of the structure 3 is elliptic.

[Structure of Roll-Shaped Master]

Figure 19A:
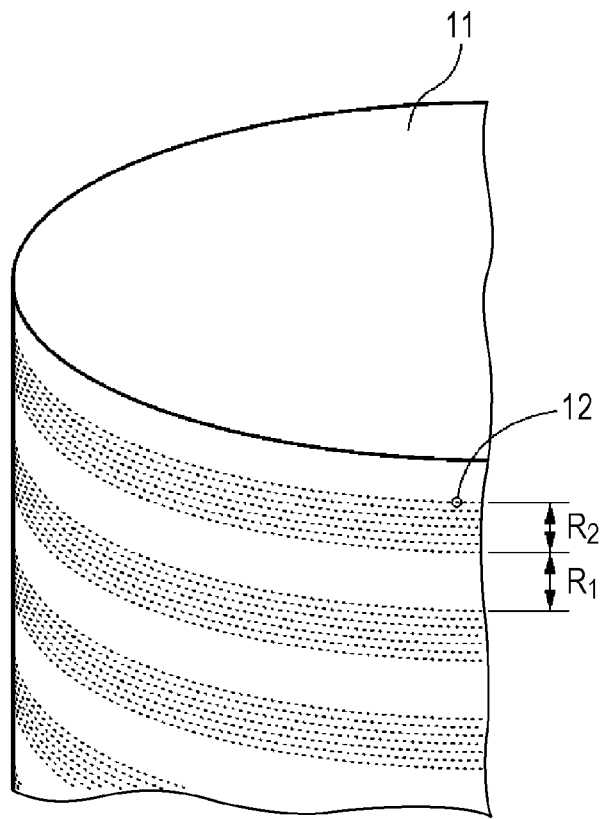
FIG. 19A is an enlarged perspective view illustrating a part of a roll-shaped master for fabricating a substrate.
Figure 19B:
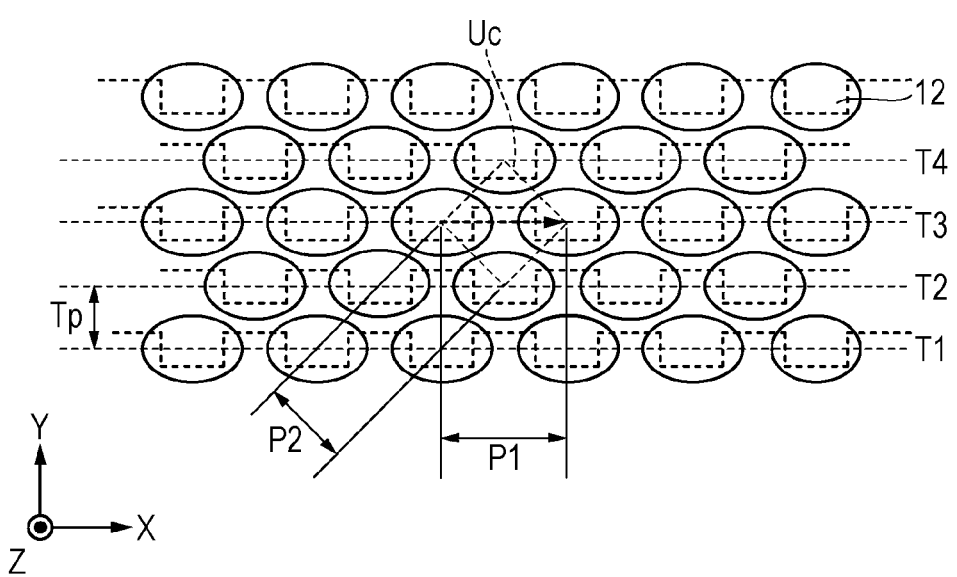
FIG. 19B is an enlarged plan view illustrating a second region illustrated in FIG. 19A.

FIG. 19A is an enlarged perspective view illustrating a part of a roll-shaped master 11 for fabricating a substrate, and FIG. 19B is an enlarged plan view illustrating a second region illustrated in FIG. 19A. The roll-shaped master used in the second embodiment differs from the roll-shaped master used in the first embodiment in that many structures 12 formed in the second region $R_2$ are arrayed in every three rows of adjacent tracks (e.g., tracks T1 to T3) so as to form a tetragonal lattice pattern or a quasi-tetragonal lattice pattern.

The tetragonal lattice pattern or the quasi-tetragonal lattice pattern can be recorded or drawn by performing patterning with the roll-shaped master exposure apparatus such that two-dimensional patterns are spatially linked with each other by generating the polarity reversing formatter signal per track in synchronism with the rotation controller for the recording apparatus and feeding the roll-shaped master at an appropriate feed pitch on condition of Constant Angular Velocity (CAV). Thus, by properly setting the frequency of the polarity reversing formatter signal and the number of revolutions of the roll-shaped master 11, a lattice pattern having a uniform spatial frequency can be formed in the desired recording zone of the resist layer on the roll-shaped master 11 through the irradiation with the laser beam.

The second embodiment can also provide similar advantages to those obtained with the first embodiment.

3. Third Embodiment

[Structure of Electroconductive Element]

Figure 20A:
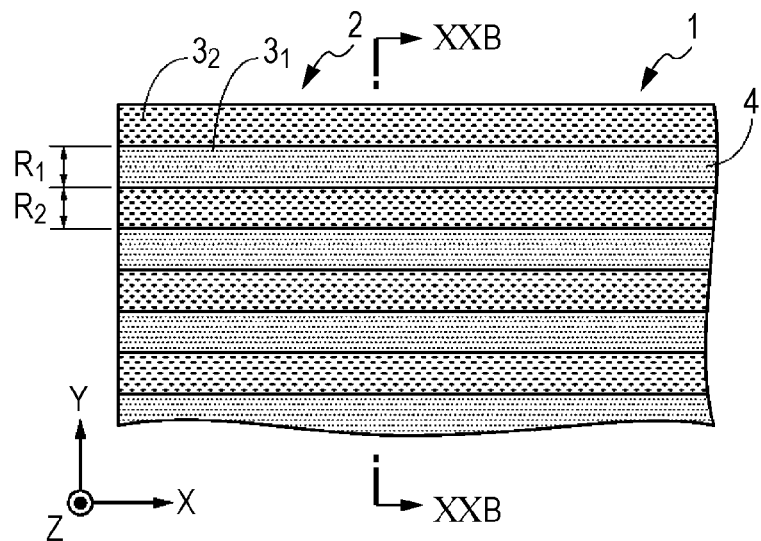
FIG. 20A is a plan view illustrating one example of structure of an electroconductive element according to a third embodiment.
Figure 20B:
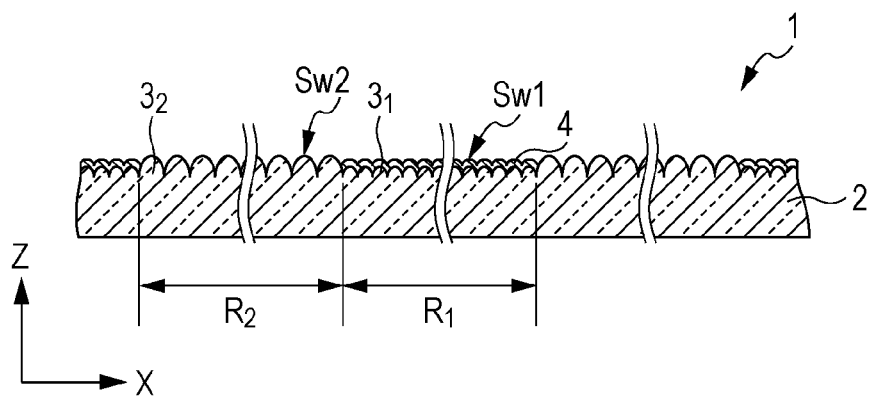
FIG. 20B is a sectional view, taken along line XXB-XXB in FIG. 20A, illustrating the one example of structure of the electroconductive element according to the third embodiment.
Figure 20C:
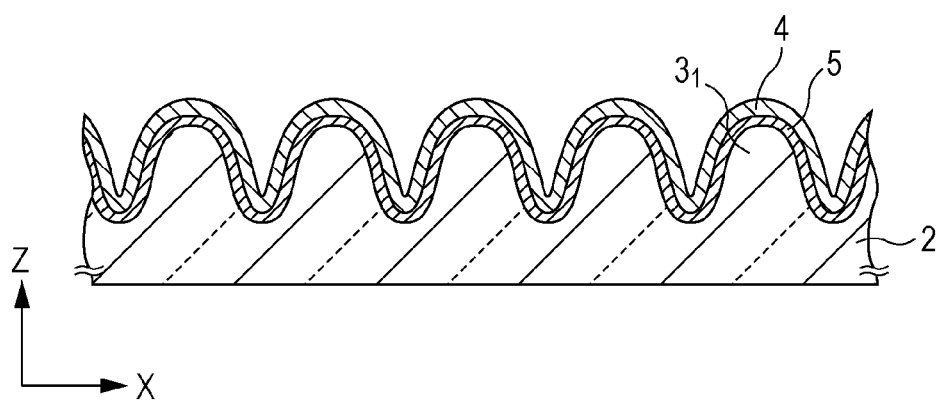
FIG. 20C is a sectional view illustrating a layer structure in a first region of the electroconductive element according to the third embodiment.

FIG. 20A is a plan view illustrating one example of structure of an electroconductive element according to a third embodiment. FIG. 20B is a sectional view, taken along line XXB-XXB in FIG. 20A, illustrating the one example of structure of the electroconductive element according to the third embodiment, and FIG. 20C is a sectional view illustrating a layer structure in a first region of the electroconductive element according to the third embodiment. The electroconductive element 1 according to the third embodiment differs from the electroconductive element 1 according to the first embodiment in that wiring patterns, etc. are formed by making etching rates of the electroconductive layers 4, which are formed in the first region $R_1$ and the second region $R_2$, different from each other by utilizing the difference (m, e.g., mean amplitude of vibrations) between a first wavy surface Sw1 formed in the first region $R_1$ and a second wavy surface Sw2 formed in the second region $R_2$.

(First Region and Second Region)

The second wavy surface Sw2 having wavelengths not longer than those of visible light, for example, is formed on the substrate surface in the second region $R_2$. Further, on the second wavy surface Sw2, the electroconductive layer 4 is not formed at all, or the electroconductive layer 4 is formed in a discontinuous state. Alternatively, the electroconductive layer 4 formed in the second region $R_2$ may have a thickness much smaller than the electroconductive layer 4 formed in the first region $R_1$ to such an extent that the electroconductive layer 4 formed in the second region $R_2$ does not substantially exhibit electrical conductivity and the second region $R_2$ functions as an insulating region. On the other hand, the first wavy surface Sw1 having a wavelength not longer than those of visible light, for example, is formed on the substrate surface in the first region $R_1$, and the electroconductive layer 4 is continuously formed on the first wavy surface Sw1. Thus, the second region $R_2$ functions as an insulating region that establishes insulation between the electroconductive layers 4 formed on the adjacent first regions $R_1$ on both the sides of the second region $R_2$. In contrast, the electroconductive layer 4 continuously formed in the first region $R_1$ has electrical conductivity in the direction in which the first region $R_1$ is extended, and it functions as a wiring pattern (electroconductive pattern).

The first wavy surface Sw1 is a concave-convex surface in which many first structures $3_1$ are formed at an array pitch corresponding to a wavelength not longer than those of visible light, for example. Also, the second wavy surface Sw2 is a concave-convex surface in which many second structures $3_2$ are formed at an array pitch corresponding to a wavelength not longer than those of visible light, for example. From the viewpoint of reducing surface resistance, a metal layer 5 is preferably further formed on the substrate surface as illustrated in FIG. 20C.

Preferably, the electroconductive layer 4 is formed following to the surface shape of the first structures $3_1$ such that the first structures $3_1$ and the electroconductive layer 4 have the surface shapes substantially similar to each other, from the viewpoint of not impeding the antireflection effect provided by the first structures $3_1$ in the first region $R_1$. Thus, by forming the electroconductive layer 4 in such a way, it is possible to suppress change of the refractive index profile, which may be caused with the formation of the electroconductive layer 4, and to maintain an excellent antireflection characteristic and/or an excellent transmission characteristic. The material of the electroconductive layer 4 is preferably in the mixed state of an amorphous phase and a polycrystalline phase. By using that type of material, even when the height of the first structure $3_1$ is reduced, the electroconductive layer 4 can be formed at a film thickness not impeding the antireflection effect of the first structures $3_1$. In other words, even when the height of the first structure $3_1$ is reduced, the electroconductive layer 4 can maintain the form following the shape of the first structures $3_1$.

A ratio (Am2/λm2) of a mean amplitude Am2 of vibrations of the second wavy surface Sw2 to a mean wavelength λm2 thereof is preferably larger than a ratio (Am1/λm1) of a mean amplitude Am1 of vibrations of the first wavy surface Sw1 to a mean wavelength λm1 thereof. Such a condition enables both of optical characteristics and electrical selectivity to be satisfied. The ratio (Am2/λm2) of the mean amplitude Am2 of vibrations of the second wavy surface Sw2 to the mean wavelength λm2 thereof is preferably 1.8 or below. If the ratio (Am2/λm2) exceeds 1.8, there is a tendency to cause a peeling failure in the step of transferring the second structures $3_2$ and to damage the second structures $3_2$. The mean amplitude Am2 of vibrations of the second wavy surface Sw2 is preferably larger than the mean amplitude Am1 of vibrations of the first wavy surface Sw1.

The mean wavelength λm1 of the first wavy surface Sw1 and the mean wavelength λm2 of the second wavy surface Sw2 are each preferably in the range of not shorter than 100 nm. If the mean wavelength λm1 and the mean wavelength λm2 are shorter than 100 nm, fabrication of the wavy surfaces Sw1 and Sw2 tends to be difficult. Further, the mean wavelength λm1 of the first wavy surface Sw1 and the mean wavelength λm2 of the second wavy surface Sw2 are each preferably in the range of not longer than 100 μm. If the mean wavelength λm1 and the mean wavelength λm2 are longer than 100 gm, a problem may occur in step coverage in the processes of in-printing and film formation, thus giving rise to a defect.

A mean aspect ratio of the second structures $3_2$ is preferably larger than that of the first structures $3_1$. The mean array pitch Pm1, the mean height Hm1, and the mean aspect ratio (Hm1/Pm1) of the first structures $3_1$ are preferably similar to the mean wavelength λm1, the mean vibration amplitude Am1, and the ratio (Am1/λm1) of the first wavy surface Sw1, respectively. Also, the mean array pitch Pm2, the mean height Hm2, and the mean aspect ratio (Hm2/Pm2) of the second structures $3_2$ are preferably similar to the mean wavelength λm2, the mean vibration amplitude Am2, and the ratio (Am2/λm2) of the second wavy surface Sw2, respectively.

In practice, as described above, the ratio (Am2/λm2) of the mean amplitude Am2 of vibrations of the second wavy surface Sw2 to the mean wavelength λm2 thereof is preferably larger than the ratio (Am1/λm1) of the mean amplitude Am1 of vibrations of the first wavy surface Sw1 to the mean wavelength λm1 thereof. Such a condition enables both of optical characteristics and electrical selectivity to be satisfied. In more detail, the ratio (Am1/λm1) and the ratio (Am2/λm2) preferably satisfy the following relationship;

$$0 < (Am1/\lambda m1) < (Am2/\lambda m2) \leq 1.8$$

(where Am1 is the mean amplitude of vibrations of the first wavy surface Sw1, Am2 is the mean amplitude of vibrations of the second wavy surface Sw2, λm1 is the mean wavelength of the first wavy surface Sw1, and λm2 is the mean wavelength of the second wavy surface Sw2).

In case of the ratio (Am2/λm2)>1.8, there is a tendency to cause a peeling failure in the step of transferring the second wavy surface Sw2 and to damage the second wavy surface Sw2.

Herein, the ratio (Am1/λm1) of the first wavy surface Sw1 is measured in a similar manner to that for measuring the ratio (Am2/λm2) of the wavy surface Sw2 in the first embodiment.

The shapes, the wavelengths, and the amplitudes of vibrations of the first wavy surface Sw1 and the second wavy surface Sw2 can be selected independently of each other. For example, the first wavy surface Sw1 and the second wavy surface Sw2 can be each independently formed to be a one-dimensional or two-dimensional wavy surface. Further, the wavelengths and the amplitudes of vibrations of the first wavy surface Sw1 and the second wavy surface Sw2 can be independently set to suitable wavelengths or suitable amplitudes of vibrations on the nano or micron order.

Preferably, even a part of the electroconductive layer 4 does not exist as a residual film in the second region $R_2$ at all. However, the electroconductive layer 4 may be present as a residual film in such a state as allowing the second region $R_2$ to function as an insulating region. In the latter case, an area of the electroconductive layer 4 formed in the first region $R_1$ is preferably larger than that of the electroconductive layer 4 or a part thereof formed in the second region $R_2$. More specifically, it is preferable that the electroconductive layer 4 is continuously formed in the first region $R_1$, while the electroconductive layer 4 or a part thereof is formed discontinuously, e.g., in a state of islands, in the second region $R_2$. As an alternative, the thickness of the electroconductive layer 4 or a part thereof formed in the second region $R_2$ may be smaller than that of the electroconductive layer 4 formed in the first region $R_1$ to such an extent that the electroconductive layer 4 or a part thereof formed in the second region $R_2$ does not substantially exhibit electrical conductivity and the second region $R_2$ is able to function as an insulating region.

(Structures)

For example, as with the second structures $3_2$ formed in the second region $R_2$, the first structures $3_1$ formed in the first region $R_1$ are also arrayed in a regular lattice pattern, such as a hexagonal lattice pattern, a quasi-hexagonal lattice pattern, a tetragonal lattice pattern, or a quasi-tetragonal lattice pattern. Alternatively, as described later, the first structures $3_1$ may be arrayed at random. Be it noted that the array pattern of the first structures $3_1$ formed in the first region $R_1$ may be not the same as the array pattern of the second structures $3_2$ formed in the second region $R_2$ and the structures in both the regions may be arranged in different array patterns.

The first wavy surface Sw1 is the concave-convex surface in which many first structures $3_1$ are formed at the array pitch corresponding to a wavelength not longer than those of visible light, for example. Also, the second wavy surface Sw2 is the concave-convex surface in which many second structures $3_2$ are formed at the array pitch corresponding to a wavelength not longer than those of visible light, for example. The mean aspect ratio (Hm2/Pm2) of the second structures $3_2$ is preferably larger than the aspect ratio (Hm1/Pm1) of the first structures $3_1$. In more detail, the first structures $3_1$ and the second structures $3_2$ preferably satisfy the following relationship;

$$0<(Hm1/Pm1)<(Hm2/Pm2) \leq 1.8$$

(where Hm1 is the mean height of the first structures $3_1$, Hm2 is the mean height of the second structures $3_2$, Pm1 is the mean array pitch of the first structures $3_1$, and Pm2 is the mean array pitch of the second structures $3_2$).

In case of the ratio (Hm2/Pm2)>1.8, there is a tendency to cause a peeling failure in the step of transferring the second structures $3_2$ and to damage the second structures $3_2$.

Herein, the aspect ratio (Hm1/Pm1) of the first structures $3_1$ and the aspect ratio (Hm2/Pm2) of the second structures $3_2$ are measured in a similar manner to that for measuring the aspect ratio (Hm/Pm) of the structures 3 in the first embodiment.

Regarding the first structures $3_1$ and the second structures $3_2$, the other points than described above can be designed similarly to the structures 3 in the first embodiment. Be it noted that the array pattern and the shape of the first structures $3_1$ may be not the same as those of the second structures $3_2$ and the structures in both the regions may be arranged in different array patterns and different shapes.

[Structure of Roll-Shaped Master]

Figure 21A:
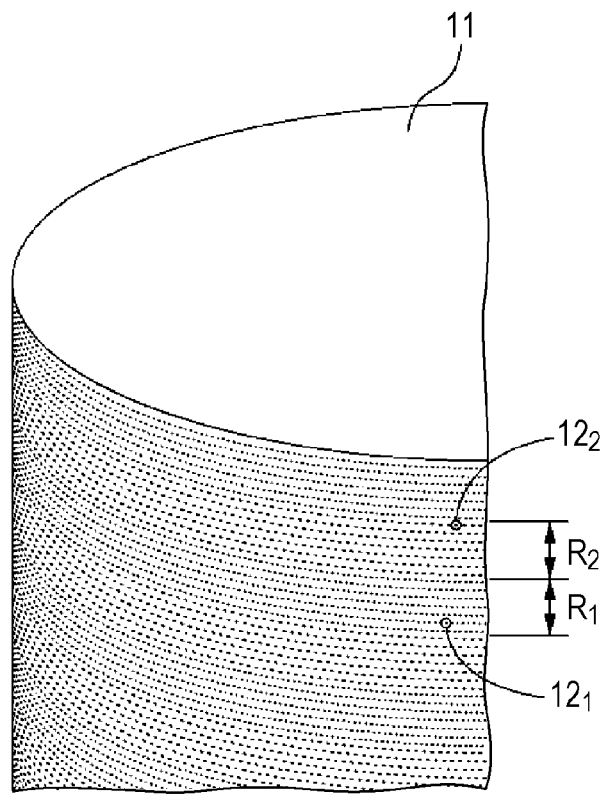
FIG. 21A is an enlarged perspective view illustrating a part of structure of a roll-shaped master for fabricating a substrate.
Figure 21B:
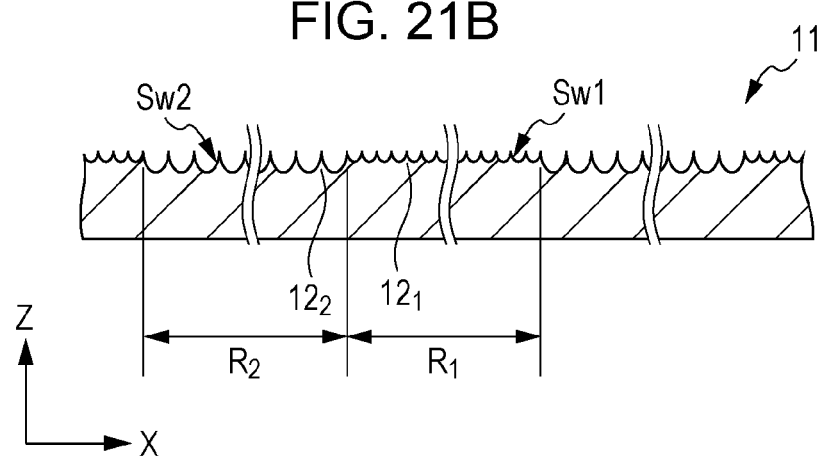
FIG. 21B is an enlarged sectional view illustrating a part of the roll-shaped master for fabricating the substrate.

FIG. 21A is an enlarged perspective view illustrating a part of structure of a roll-shaped master 11 for fabricating a substrate, and FIG. 21B is an enlarged sectional view illustrating a part of the roll-shaped master for fabricating the substrate. The roll-shaped master 11 used in the third embodiment differs from the roll-shaped master used in the first embodiment in that a first wavy surface Sw1 and a second wavy surface Sw2 are formed in a first region $R_1$ and a second region $R_2$, respectively.

The first wavy surface Sw1 of the roll-shaped master 11 is formed by arraying recessed first structures $12_1$ at a pitch corresponding to a wavelength not longer than those of visible light, for example. The second wavy surface Sw2 of the roll-shaped master 11 is formed by arraying recessed second structures $12_2$ at a pitch corresponding to a wavelength not longer than those of visible light, for example. The first wavy surface Sw1 and the second wavy surface Sw2 of the roll-shaped master 11 have concave-convex shapes that are reversed respectively to those of the first wavy surface Sw1 and the second wavy surface Sw2 of the substrate 2.

The first region $R_1$ and the second region $R_2$ of the roll-shaped master 11 correspond to the first region $R_1$ and the second region $R_2$ of the substrate 2, respectively. In other words, the recessed structures $12_1$ formed in the first region $R_1$ of the roll-shaped master 11 are used to form the convex structures $3_1$ formed in the first region $R_1$ of the substrate 2. The recessed structures $12_2$ formed in the second region $R_2$ of the roll-shaped master 11 are used to form the convex structures $3_2$ formed in the second region $R_2$ of the substrate 2. An aspect ratio of the second structures $12_2$ is preferably larger than that of the first structures $12_1$.

In an etching step in the third embodiment, the substrate surface on which the electroconductive layer 4 is formed is etched such that the electroconductive layer 4 is removed from the second structures $3_2$, while the electroconductive layer 4 remains in the first region $R_1$. In more detail, the etching is preferably performed such that, by utilizing the difference in film quality, phase state, etc. between the electroconductive layers 4 formed on the first wavy surface Sw1 and the second wavy surface Sw2, the electroconductive layer 4 formed on the second wavy surface Sw2 is substantially removed, while the electroconductive layer 4 formed on the first wavy surface Sw1 remains in a continuously connected state. As a result, an electroconductive pattern can be selectively formed only on one Sw1 of the first wavy surface Sw1 and the second wavy surface Sw2.

Alternatively, the etching is preferably performed such that, by utilizing the difference in film quality, phase state, etc. between the electroconductive layers 4 formed on the first wavy surface Sw1 and the second wavy surface Sw2, the electroconductive layer 4 formed on the second wavy surface Sw2 is removed into a discontinuous state, e.g., a state of islands, while the electroconductive layer 4 formed on the first wavy surface Sw1 remains in a continuously connected state. As a result, an electroconductive pattern can be selectively formed only on one Sw1 of the first wavy surface Sw1 and the second wavy surface Sw2.

Further, the etching is preferably performed such that, by utilizing the difference in film quality, phase state, etc. between the electroconductive layers 4 formed on the first wavy surface Sw1 and the second wavy surface Sw2, the thickness of the electroconductive layer 4 formed on the second wavy surface Sw2 is reduced to be much smaller than the thickness of the electroconductive layer 4 formed on the first wavy surface Sw1. As a result, an electroconductive pattern can be selectively formed only on one Sw1 of the first wavy surface Sw1 and the second wavy surface Sw2.

According to the third embodiment, since the first structures $3_1$ and the second structures $3_2$ are formed respectively in the first region $R_1$ and the second region $R_2$, the antireflection characteristic of the electroconductive element 1 can be improved. In the third embodiment thus constructed, the electroconductive layer 4 remaining in the first region $R_1$ to function as the wiring pattern is preferably formed in a shape following the shape of the structures $3_1$ formed in the first region $R_1$. Such a feature contributes to suppressing a reduction in the effect of improving the antireflection characteristic and/or the transmission characteristic.

By forming a wavy surface, which is modulated (with, e.g., amplitude modulation and/or frequency modulation), on the substrate surface and by forming an electroconductive layer on the relevant substrate surface, the state of the electroconductive layer can be changed depending on the difference in the modulation applied to the wavy surface of the substrate 2. Accordingly, a dissolution rate of the electroconductive layer 4 with an etchant can be changed depending on the difference in the modulation applied to the wavy surface of the substrate 2. In other words, a desired electroconductive pattern can be formed on the substrate surface by utilizing the difference in the modulation applied to the wavy surface of the substrate 2.

When the wavy surface of the substrate surface is formed of nano-structures, the visibility and the optical characteristics can also be improved. In other words, the desired electrical resistance can be realized without degrading the optical characteristics.

In a related-art information input device (such as a digital resistance touch panel or a capacitance touch panel) in which a wiring pattern made of an electroconductive layer is formed on the substrate surface, quality in displaying an image tends to degrade for the reason that the wiring pattern appears and is visually conspicuous due to the difference in reflectivity between the electroconductive layer and the substrate. In contrast, with an information input device according to the embodiment of the present invention, the wiring pattern can be made visually less conspicuous because low reflection and high transmissivity are realized regardless of the presence or absence of the electroconductive layer.

Fourth Embodiment

Figure 22A:
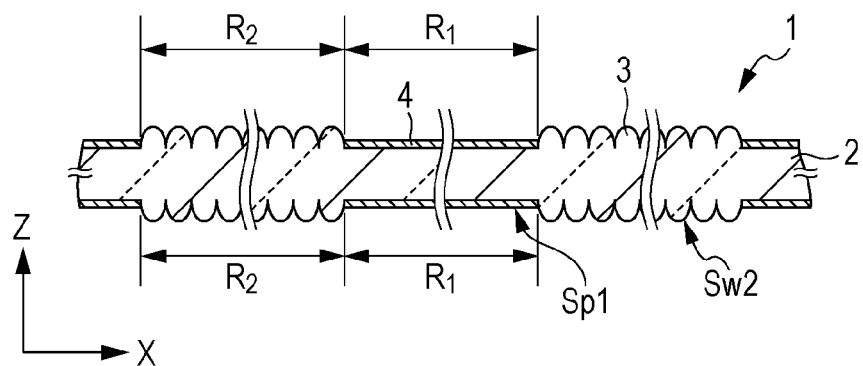
FIG. 22A is a sectional view illustrating one example of structure of an electroconductive element according to a fourth embodiment.
Figure 22B:
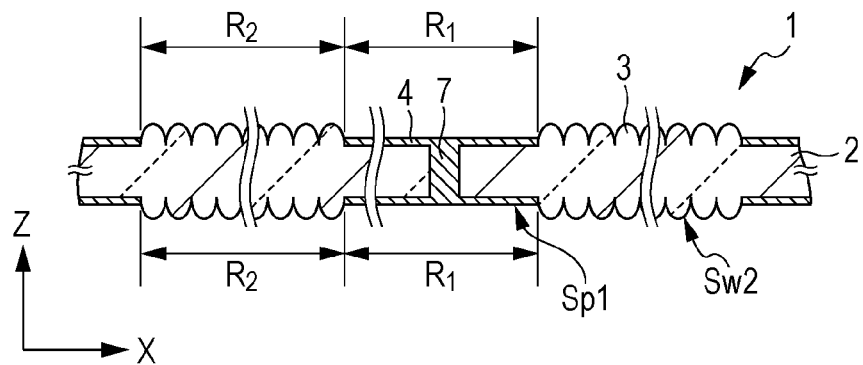
FIG. 22B is a sectional view illustrating a modification of the electroconductive element according to the fourth embodiment.

FIG. 22A is a sectional view illustrating one example of structure of an electroconductive element 1 according to a fourth embodiment. The electroconductive element 1 according to the fourth embodiment differs from the electroconductive element 1 according to the first embodiment in that the first region $R_1$ and the second region $R_2$ are set in each of the opposite principal surfaces of the substrate 2 and the electroconductive layer 4 is continuously formed only in the first region $R_1$ of both the first and second regions, thereby forming wiring patterns on both the principal surfaces of the substrate. The fourth embodiment may be modified, as illustrated in FIG. 22B, such that a through hole (via hole) is formed to penetrate the substrate 2 in the first region $R_1$, and an electroconductive material, such as electroconductive ink, is filled in the through hole to electrically connect circuit wiring patterns, etc. formed on both the principal surfaces of the substrate 2.

According to the fourth embodiment, since the wiring patterns are formed on both the principal surfaces of the substrate 2, circuits can be formed on the electroconductive element 1 in a larger area than that in the first embodiment.

5. Fifth Embodiment

[Structure of Disk-Shaped Master]

Figure 23A:
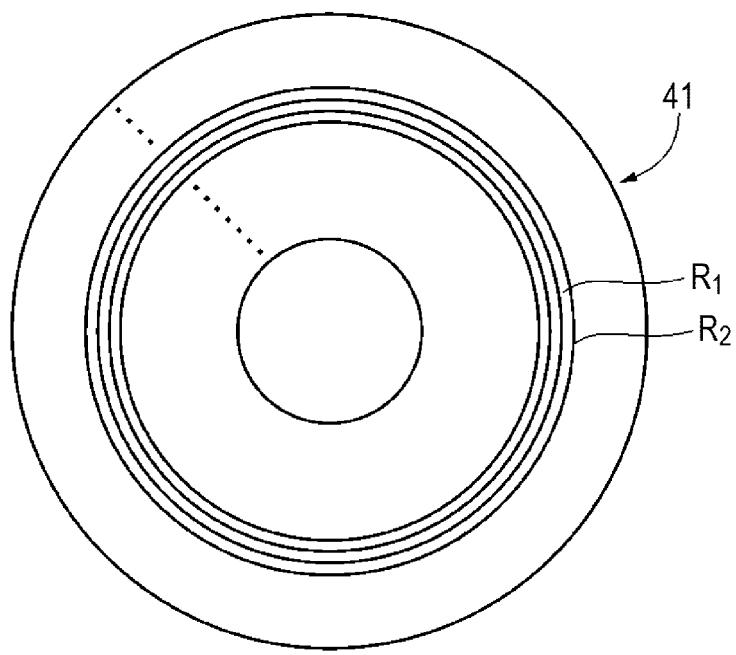
FIG. 23A is a plan view illustrating one example of structure of a disk-shaped master according to a fifth embodiment.
Figure 23B:
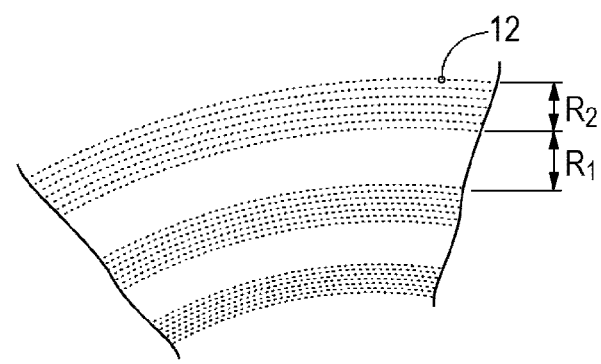
FIG. 23B is an enlarged plan view illustrating a part of the disk-shaped master illustrated in FIG. 23A.

FIG. 23A is a plan view illustrating one example of structure of a disk-shaped master 41 according to a fifth embodiment, and FIG. 23B is an enlarged plan view illustrating a part of the disk-shaped master illustrated in FIG. 23A.

The fifth embodiment differs from the first embodiment in that a first region $R_1$ and a second region $R_2$ are set in a surface of the disk-shaped master 41, and many concave structures 12 are formed in the second region $R_2$. While FIGS. 23A and 23B illustrate an example in which the first region $R_1$ and the second region $R_2$, each having an annular shape, are alternately formed, the shapes of the first region $R_1$ and the second region $R_2$ are not limited to the illustrated one, and both the regions can be optionally set in suitable one of various shapes depending on the desired shape of the wiring pattern.

[Configuration of Exposure Apparatus]

First, an exposure apparatus for fabricating the disk-shaped master 41 having the above-mentioned structure is described with reference to FIG. 24.

A movable optical table 32 includes a beam expander (BEX) 33, a mirror 38, and an objective lens 34. A laser beam 14 guided to the movable optical table 32 is shaped by the beam expander 33 into a desired beam shape and is delivered through the mirror 38 and the objective lens 34 for irradiation of a resist layer on the disk-shaped master 41. The master 41 is placed on a turntable (not shown) that is coupled to a spindle motor 35. A step of exposing the resist layer is performed by irradiating the resist layer on the master 41 with the laser beam 14, while the master 41 is rotated and the laser beam 14 is moved in the radial direction of the rotating master 41. A latent image formed in the exposure step has a substantially elliptic shape with a major axis extending in the circumferential direction of the master 41. The laser beam 14 is moved by displacing the movable optical table 32 in the direction of an arrow R.

Figure 24:
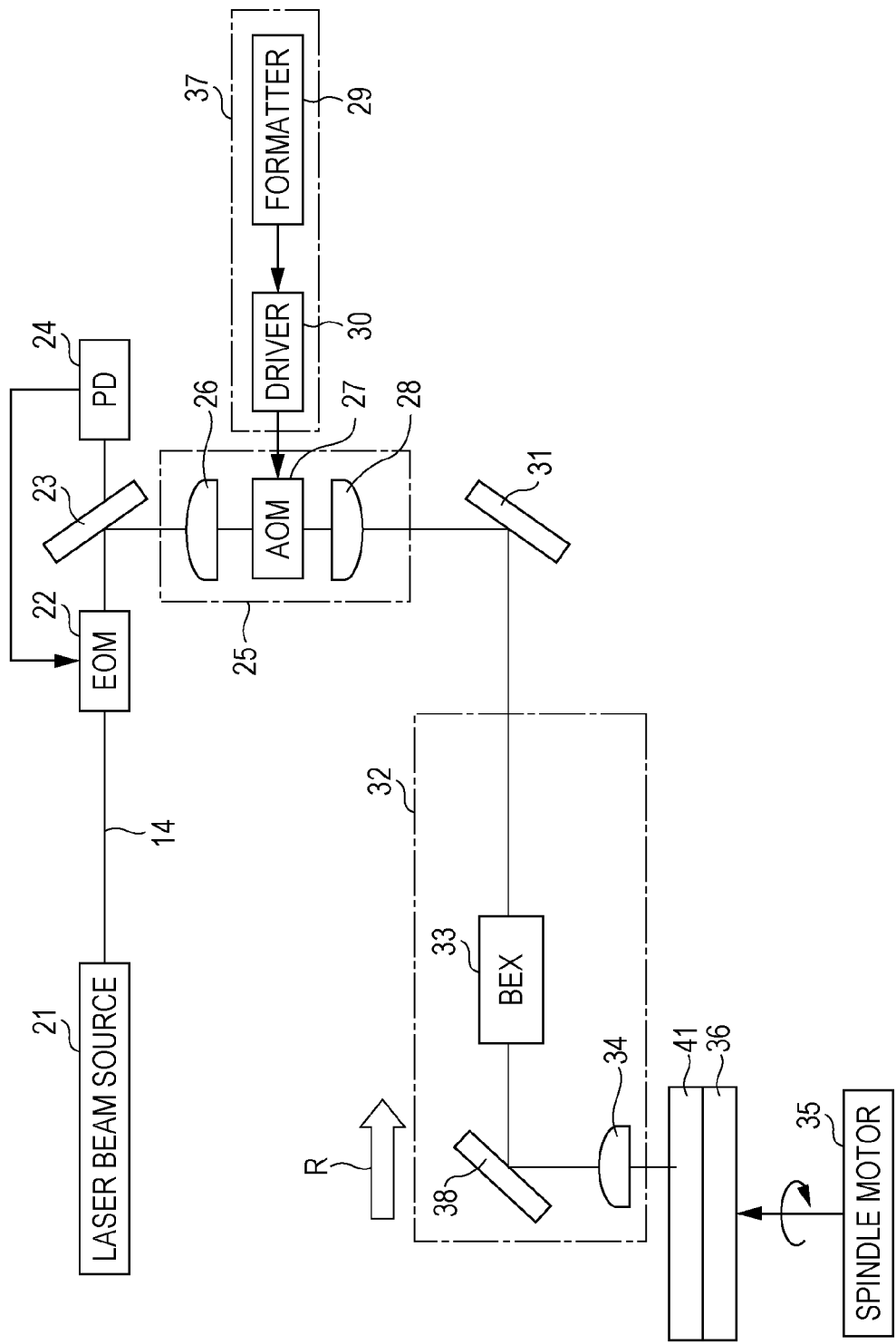
FIG. 24 is a block diagram illustrating one example of configuration of a disk-shaped master exposure apparatus.

The exposure apparatus, illustrated in FIG. 24, includes a control mechanism 37 for forming, in the resist layer, a latent image corresponding to a two-dimensional pattern of hexagonal lattices or quasi-hexagonal lattices. The control mechanism 37 includes a formatter 29 and a driver 30. The formatter 29 includes a polarity reversing portion that controls the timing of irradiating the resist layer with the laser beam 14. The driver 30 receives an output from the polarity reversing portion and controls an Acousto-Optic Modulator (AOM) 27.

The control mechanism 37 synchronizes intensity modulation of the laser beam 14, which is performed by the AOM 27, a rotational speed of the spindle motor 35, and a moving speed of the movable optical table 32 with one another per track such that two-dimensional patterns formed by the latent images are spatially linked with each other. The rotation of the master 41 is controlled on condition of Constant Angular Velocity (CAV). Then, patterning is performed by setting the appropriate number of revolutions of the master 41 with the spindle motor 35, the appropriate frequency modulation of the intensity of the laser beam 14 with the AOM 27, and the appropriate feed pitch of the laser beam 14 with the movable optical table 32. As a result, the latent images in the hexagonal lattice pattern or the quasi-hexagonal lattice pattern are formed in the resist layer.

Further, a control signal for the polarity reversing portion is gradually changed so as to hold constant a spatial frequency (i.e., a pattern density of the latent images). In more detail, the exposure step is carried out while changing the cycle of irradiating the resist layer with the laser beam 14 per track, and the frequency modulation of the laser beam 14 is performed by the control mechanism 37 such that the array pitch P1 is held at a predetermined value (e.g., 330 nm, 315 nm, or 300 nm) for each of the tracks T. Stated another way, the modulation is controlled such that as the track position is located farther away from the center of the disk-shaped master 41, the resist layer is irradiated at a shorter cycle with the laser beam 14. As a result, a nano-pattern can be formed at a uniform spatial frequency over the entire substrate surface.

[Method of Manufacturing Electroconductive Element]

The electroconductive element 1 according to the fifth embodiment can be fabricated in a similar manner to that in the first embodiment except that the resist layer formed on the disk-shaped master 41 is exposed by using the exposure apparatus having the above-described configuration.

The fifth embodiment can also provide similar advantages to those obtained with the first embodiment.

6. Sixth Embodiment

Figure 25A:
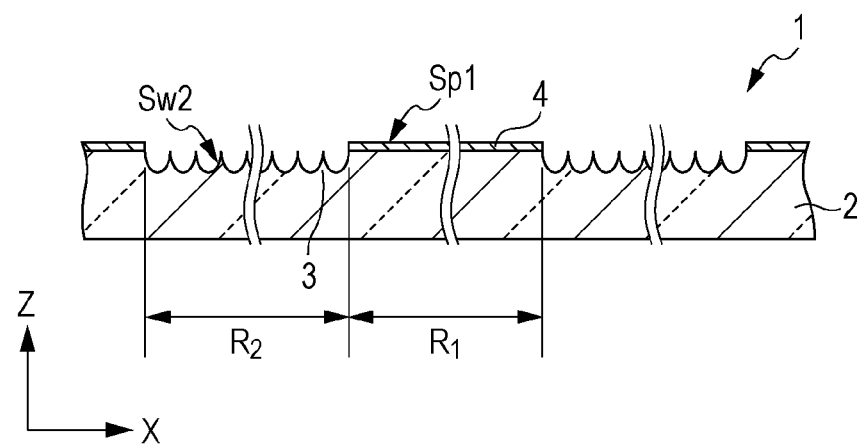
FIG. 25A is a sectional view illustrating one example of structure of an electroconductive element according to a sixth embodiment.
Figure 25B:
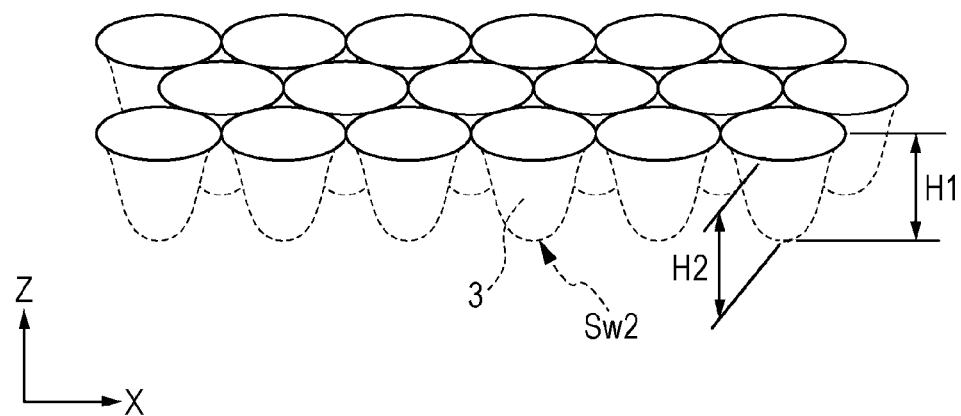
FIG. 25B is an enlarged perspective view illustrating a part of a second region of the electroconductive element according to the sixth embodiment.

FIG. 25A is a sectional view illustrating one example of structure of an electroconductive element 1 according to a sixth embodiment, and FIG. 25B is an enlarged perspective view illustrating a part of a second region of the electroconductive element according to the sixth embodiment. The electroconductive element 1 according to the sixth embodiment differs from the electroconductive element 1 according to the first embodiment in that many structures 3 in the form of recesses are formed in the second region $R_2$ of the substrate surface. The concave shape of the structure 3 in the sixth embodiment is obtained by reversing the convex shape of the structure 3 in the first embodiment. When the structure 3 is in the form of a recess as in the sixth embodiment, an opening portion of the concave structure 3 (i.e., an entrance portion of the recess) is defined as a bottom portion, and a lowermost portion of the concave structure 3 in the depth direction of the substrate 2 (i.e., a deepest portion of the recess) is defined as an apex portion. Thus, the apex portion and the bottom portion of the structure 3 are defined on the basis of an imaginary space representing the actual shape of the structure 3. Further, because the structure 3 is in the form of a recess in the sixth embodiment, the height H of the structure 3, used in the above-mentioned formula (1), etc., is replaced with a depth H of the structure 3.

Details of the sixth embodiment in points other than described above are similar to those in the first embodiment.

Thus, since the convex shape of the structure 3 in the first embodiment is just reversed to the concave shape in the sixth embodiment, the sixth embodiment can also provide similar advantages to those obtained with the first embodiment.

7. Seventh Embodiment

Figure 26A:
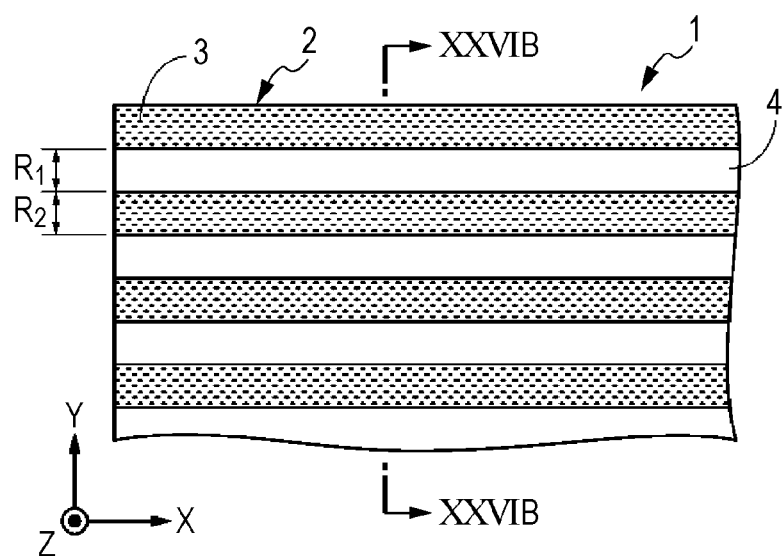
FIG. 26A is a plan view illustrating one example of structure of an electroconductive element according to a seventh embodiment.
Figure 26B:
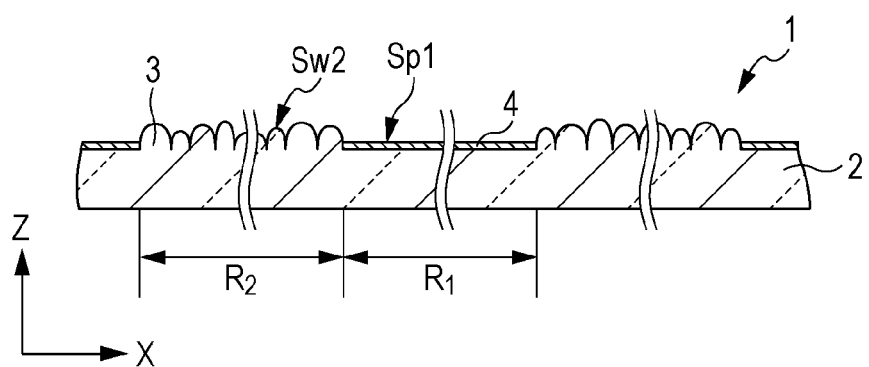
FIG. 26B is a sectional view, taken along line XXVIB-XXVIB in FIG. 26A, illustrating the one example of structure of the electroconductive element according to the seventh embodiment.

FIG. 26A is a plan view illustrating one example of structure of an electroconductive element 1 according to a seventh embodiment, and FIG. 26B is a sectional view, taken along line XXVIB-XXVIB in FIG. 26A, illustrating the one example of structure of the electroconductive element according to the seventh embodiment. The electroconductive element 1 according to the seventh embodiment differs from the electroconductive element 1 according to the first embodiment in that many structures 3 are arranged at random. The array pitch of the structures 3 may be changed at random, but it is preferably changed within a range corresponding to wavelengths not longer than those of visible light. The structures 3 formed on the substrate surface are not limited to have the same size and/or shape, and they may have two or more different sizes and/or shapes. It is preferable that the structures 3 are formed at random two-dimensionally or three-dimensionally. Herein, the expression "at random two-dimensionally" implies that the structures 3 are arranged at random in the in-plane direction of the electroconductive element 1. Also, the expression "at random three-dimensionally" implies that the structures 3 are arranged at random not only in the in-plane direction of the electroconductive element 1, but also in the direction of thickness of the electroconductive element 1.

8. Eighth Embodiment

Figure 27:
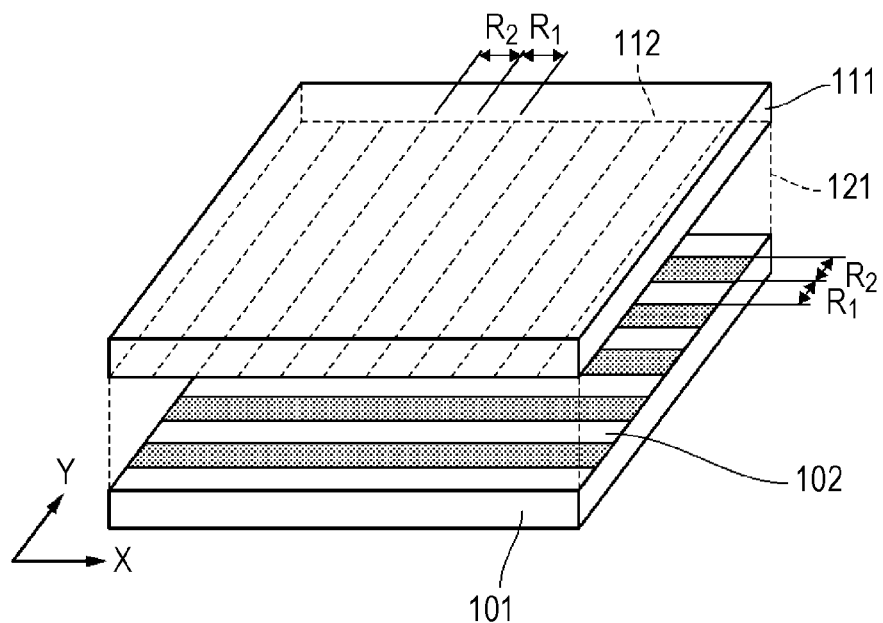
FIG. 27 is a perspective view illustrating one example of structure of a liquid display device according to an eighth embodiment.

FIG. 27 is a perspective view illustrating one example of structure of a liquid display device according to an eighth embodiment. As illustrated in FIG. 27, the liquid display device is a display device of the passive matrix driving type (also called simple matrix driving type). The liquid display device includes a first substrate 101 and a second substrate 111, which are arranged to face each other with a predetermined space left between them, and a liquid crystal layer 121 disposed between the first substrate 101 and the second substrate 111.

A linear first region $R_1$ and a linear second region $R_2$ are alternately repeatedly set in one of opposite principal surfaces of the first substrate 101, which one is positioned to face the second substrate 111. Surface structures of the first substrate 101 in the first region $R_1$ and the second region $R_2$ are similar respectively to those of the substrate in the first and second regions in the electroconductive element according to one of the first to seventh embodiments described above. For example, the surface of the first substrate 101 in the second region $R_2$ is provided as a wavy surface by forming many structures at an array pitch corresponding to a wavelength not longer than those of, e.g., visible light, and a transparent electroconductive layer is formed on the wavy surface discontinuously, e.g., in a state of islands. On the other hand, the surface of the first substrate 101 in the first region $R_1$ is provided as a flat surface without forming structures therein, and a transparent electroconductive layer is continuously formed in the first region $R_1$. Thus, many horizontal (X-) electrodes (first electrodes) 102, each being made of the continuously formed transparent electroconductive layer, are formed in a striped pattern on the one of the opposite principal surfaces of the first substrate 101, which one is positioned to face the second substrate 111.

A linear first region $R_1$ and a linear second region $R_2$ are alternately repeatedly set in one of opposite principal surfaces of the second substrate 111, which one is positioned to face the first substrate 101. Surface structures of the second substrate 111 in the first region $R_1$ and the second region $R_2$ are similar respectively to those of the substrate in the first and second regions in the electroconductive element according to one of the first to seventh embodiments described above. For example, the surface of the second substrate 111 in the second region $R_2$ is provided as a wavy surface by forming many structures at an array pitch corresponding to a wavelength not longer than those of, e.g., visible light, and a transparent electroconductive layer is formed on the wavy surface discontinuously, e.g., in a state of islands. On the other hand, the surface of the second substrate 111 in the first region $R_1$ is provided as a flat surface without forming structures therein, and a transparent electroconductive layer is continuously formed in the first region $R_1$. Thus, many vertical (Y-) electrodes (second electrodes) 112, each being made of the continuously formed transparent electroconductive layer, are formed in a striped pattern on the one of the opposite principal surfaces of the second substrate 111, which one is positioned to face the first substrate 101.

The first regions $R_1$ and the second regions $R_2$ of the first substrate 101 are extended orthogonally to those of the second substrate 111. In other words, the horizontal electrodes 102 on the first substrate 101 and the vertical electrodes 112 on the second substrate 111 are in an orthogonal relation.

According to the eighth embodiment, electrodes of the liquid crystal display device can be fabricated by utilizing, e.g., the presence or absence of the wavy surface, or the presence or absence of the structures. Further, when the wavelength of the wavy surface or the array pitch of the structures is set to be not longer than those of visible light, for example, the antireflection characteristic and/or the transmission characteristic of the liquid crystal display device can be improved.

Alternatively, as in the third embodiment described above, different types of structures differing in the aspect ratio, for example, may be formed respectively in the first region $R_1$ and the second region $R_2$. By forming different types of the structures in the first and second regions, the antireflection characteristic and/or the transmission characteristic of the liquid crystal display device can be further improved. In that case, the transparent electroconductive layers formed in the respective first regions $R_1$ to function as the horizontal electrodes 102 and the vertical electrodes 112 preferably have shapes following the shapes of the structures formed in the first regions $R_1$. Such a feature contributes to suppressing a reduction in the effect of improving the antireflection characteristic and/or the transmission characteristic, which is obtained with the presence of the structures.

9. Ninth Embodiment

Figure 28:
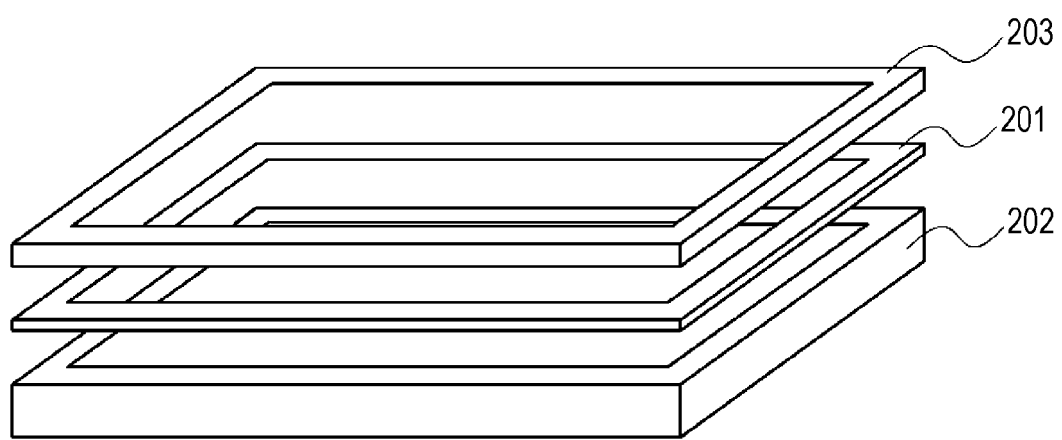
FIG. 28 is a perspective view illustrating one example of structure of a display device provided with a touch panel according to a ninth embodiment.

FIG. 28 is a perspective view illustrating one example of structure of a display device 202 provided with a touch panel 201 according to a ninth embodiment. As illustrated in FIG. 28, the touch panel (information input device) 201 is disposed on the display device 202. The display device 202 and the touch panel 201 are affixed to each other by using, e.g., an adhesive. A front panel (surface member) 203 may be further disposed on the surface of the touch panel 201. The touch panel 201 and the front panel (surface member) 203 are affixed to each other by using, e.g., an adhesive.

The display device 202 can be constituted as suitable one of various types of display devices, including a liquid crystal display, a CRT (Cathode Ray Tube) display, a Plasma Display Panel (PDP), an Electro Luminescence (EL) display, and a Surface-conduction Electron-emitter Display (SED). The touch panel 302 can be constituted as, e.g., a touch panel of the resistance film type or the capacitance type. One example of the touch panel of the resistance film type is a touch panel of the matrix resistance film type. One example of the touch panel of the capacitance type is a touch panel of the projection capacitance type employing a "Wire Sensor" or an "ITO Grid".

Figure 29A:
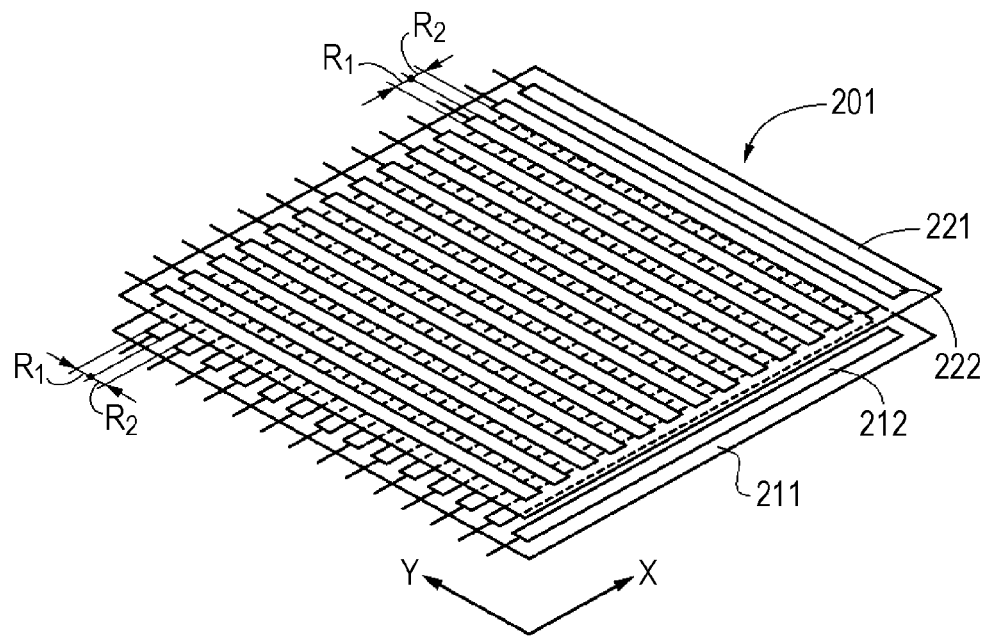
FIG. 29A is a perspective view illustrating a first example of structure of the touch panel according to the ninth embodiment.

FIG. 29A is a perspective view illustrating a first example of structure of the touch panel 201 according to the ninth embodiment. The touch panel 201 illustrated in FIG. 29A is a touch panel of the matrix resistance film type, and it includes a first substrate 211 and a second substrate 221, which are arranged to face each other with a dot spacer (not shown) interposed to maintain a predetermined space therebetween.

Figure 29B:
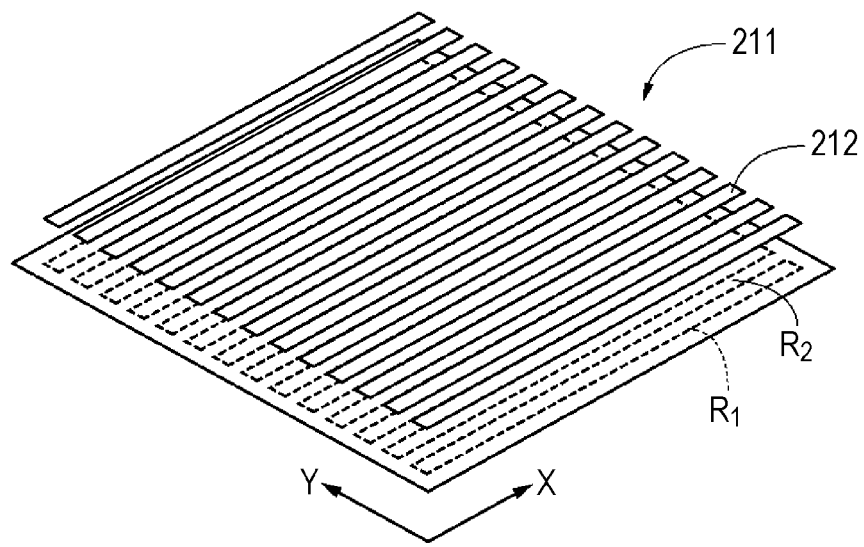
FIG. 29B is an exploded perspective view illustrating one example of structure of a first substrate in the ninth embodiment.

FIG. 29B is an exploded perspective view illustrating one example of structure of the first substrate according to the ninth embodiment. Because the second substrate 221 has substantially the same structure as that of the first substrate 211, an exploded perspective view of the second substrate 221 is omitted. A rectangular first region $R_1$ and a rectangular second region $R_2$ are alternately repeatedly set in one of opposite principal surfaces of the first substrate 211, which one is positioned to face the second substrate 221. Surface structures of the first substrate 211 in the first region $R_1$ and the second region $R_2$ are similar respectively to those of the substrate in the first and second regions in the electroconductive element according to one of the first to seventh embodiments described above. For example, the surface of the first substrate 211 in the second region $R_2$ is provided as a wavy surface by forming many structures at an array pitch corresponding to a wavelength not longer than those of, e.g., visible light, and a transparent electroconductive layer is formed discontinuously, e.g., in a state of islands, on the wavy surface. On the other hand, the surface of the first substrate 211 in the first region $R_1$ is provided as a flat surface without forming structures therein, and a transparent electroconductive layer is continuously formed in the first region $R_1$. Thus, a plurality of horizontal (X-) electrodes (first electrodes) 212, each being made of the continuously formed transparent electroconductive layer, are formed in a striped pattern on the one of the opposite principal surfaces of the first substrate 211, which one is positioned to face the second substrate 221.

A rectangular first region $R_1$ and a rectangular second region $R_2$ are alternately repeatedly set in one of opposite principal surfaces of the second substrate 221, which one is positioned to face the first substrate 211. Surface structures of the second substrate 221 in the first region $R_1$ and the second region $R_2$ are similar respectively to those of the substrate in the first and second regions in the electroconductive element according to one of the first to seventh embodiments described above. For example, the surface of the second substrate 221 in the second region $R_2$ is provided as a wavy surface by forming many structures at an array pitch corresponding to a wavelength not longer than those of, e.g., visible light, and a transparent electroconductive layer is formed discontinuously, e.g., in a state of islands, on the wavy surface. On the other hand, the surface of the second substrate 221 in the first region $R_1$ is provided as a flat surface without forming structures therein, and a transparent electroconductive layer is continuously formed in the first region $R_1$. Thus, a plurality of vertical (Y-) electrodes (second electrodes) 222, each being made of the continuously formed transparent electroconductive layer, are formed in a striped pattern on the one of the opposite principal surfaces of the second substrate 221, which one is positioned to face the first substrate 211.

The first regions $R_1$ and the second regions $R_2$ of the first substrate 211 are extended orthogonally to those of the second substrate 221. In other words, the horizontal electrodes 212 on the first substrate 211 and the vertical electrodes 222 on the second substrate 221 are in an orthogonal relation.

Figure 30A:
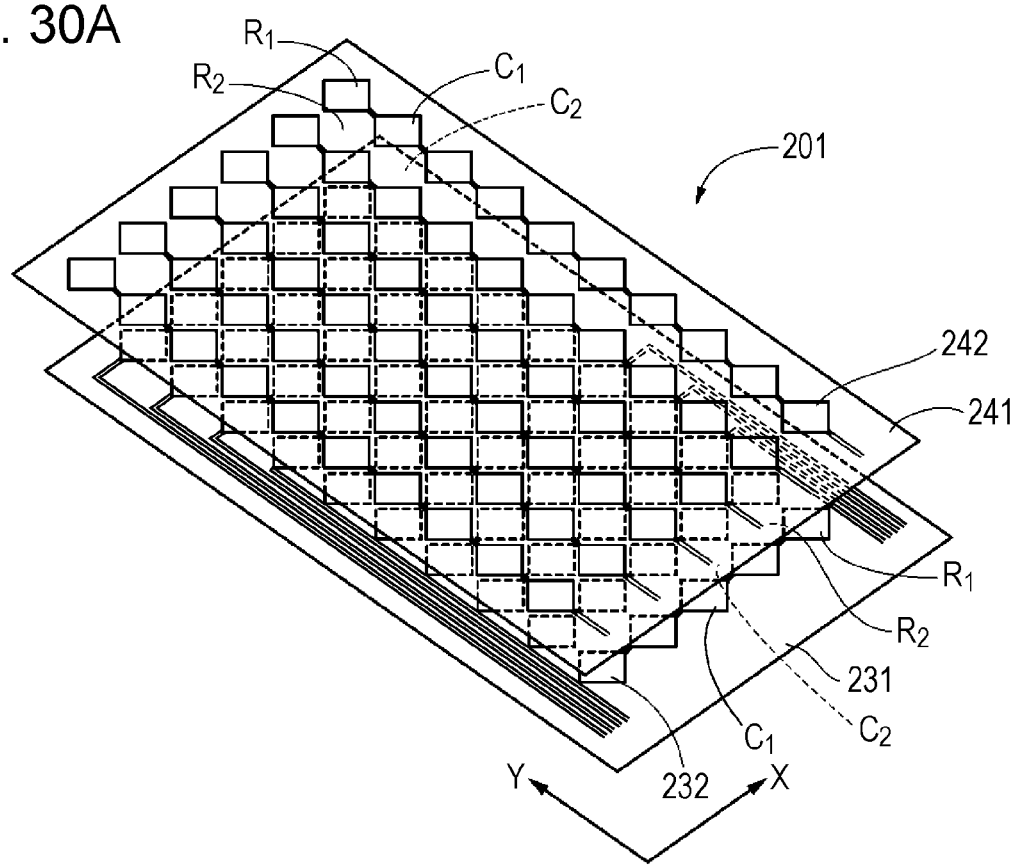
FIG. 30A is a perspective view illustrating a second example of structure of the touch panel according to the ninth embodiment.

FIG. 30A is a perspective view illustrating a second example of structure of the touch panel according to the ninth embodiment of the present invention. The touch panel illustrated in FIG. 30A is a touch panel of the projection capacitance type employing the "ITO Grid", and it includes a first substrate 231 and a second substrate 241, which are stacked one above the other.

Figure 30B:
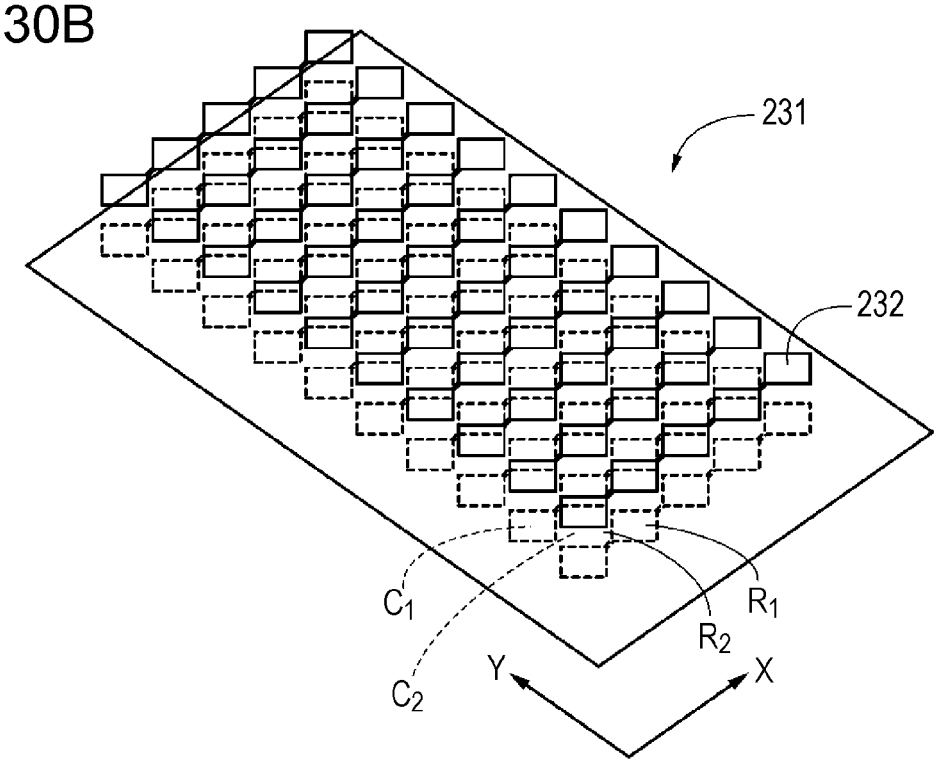
FIG. 30B is an exploded perspective view illustrating one example of structure of the first substrate.

FIG. 30B is an exploded perspective view illustrating one example of structure of the first substrate 231. Because the second substrate 241 has substantially the same structure as that of the first substrate 231, an exploded perspective view of the second substrate 241 is omitted. A first region $R_1$ and a second region $R_2$ are alternately repeatedly set in one of opposite principal surfaces of the first substrate 231, which one is positioned to face the second substrate 241, such that the adjacent first regions $R_1$ are spaced from each other with the second region $R_2$ interposed therebetween. Likewise, a first region $R_1$ and a second region $R_2$ are alternately repeatedly set in one of opposite principal surfaces of the second substrate 241, which one is positioned to face the first substrate 231, such that the adjacent first regions $R_1$ are spaced from each other with the second region $R_2$ interposed therebetween. Surface structures of the first substrate 231 and the second substrate 241 in the first region $R_1$ and the second region $R_2$ are similar respectively to those of the substrate in the first and second regions in the electroconductive element according to one of the first to seventh embodiments described above.

The first region $R_1$ of the first substrate 231 is formed by repeatedly interconnecting unit regions $C_1$, each having a predetermined shape, in the X-axis direction, and the second region $R_2$ of the first substrate 231 is formed by repeatedly interconnecting unit regions $C_2$, each having a predetermined shape, in the X-axis direction. The first region $R_1$ of the second substrate 241 is formed by repeatedly interconnecting the unit regions $C_1$, each having the predetermined shape, in the Y-axis direction, and the second region $R_2$ of the second substrate 241 is formed by repeatedly interconnecting the unit regions $C_2$, each having the predetermined shape, in the Y-axis direction. The shape of each of the unit regions $C_1$ and the unit regions $C_2$ may be, e.g., diamond (rhombic), triangular, or rectangular, but it is not limited to those examples.

The surface of the first substrate 231 and the surface of the second substrate 241 in their second regions $R_2$ are each provided as a wavy surface by forming many structures at an array pitch corresponding to a wavelength not longer than those of visible light, for example, and a transparent electroconductive layer is formed discontinuously, e.g., in a state of islands, on the wavy surface. On the other hand, the surface of the first substrate 231 and the surface of the second substrate 241 in their first regions $R_1$ are each provided as a flat surface without forming structures therein, and a transparent electroconductive layer is continuously formed in each of the first regions $R_1$. Thus, a plurality of horizontal (X-) electrodes (first electrodes) 232, each being made of the transparent electroconductive layer, are arrayed on the one of the opposite principal surfaces of the first substrate 231, which one is positioned to face the second substrate 241. Further, a plurality of vertical (Y-) electrodes (second electrodes) 242, each being made of the transparent electroconductive layer, are arrayed on the one of the opposite principal surfaces of the second substrate 241, which one is positioned to face the first substrate 231. The horizontal electrodes 232 and the vertical electrodes 242 have the same shapes as those of the respective first region $R_1$ of the first substrate 231 and the second substrate 241, respectively.

The horizontal electrodes 232 on the first substrate 231 and the vertical electrodes 242 on the second substrate 241 are in an orthogonal relation. In the state where the first substrate 231 and the second substrate 241 are stacked one above the other, the first region $R_1$ of the first substrate 231 and the second region $R_2$ of the second substrate 241 are positioned in a stacked relation, and the second region $R_2$ of the first substrate 231 and the first region $R_1$ of the second substrate 241 are positioned in a stacked relation. When looking at the touch panel 201 from the input surface side, therefore, the plurality of horizontal (X-) electrodes (first electrodes) 232 and the plurality of vertical (Y-) electrodes (second electrodes) 242 appear as if they are arrayed all over the one principal surface in the closest-packed state without overlapping with each other.

According to the ninth embodiment, electrodes of the touch panel 201 can be fabricated by utilizing, e.g., the presence or absence of the wavy surface, or the presence or absence of the structures. Further, when the wavelength of the wavy surface or the array pitch of the structures is set to be not longer than those of visible light, for example, the antireflection characteristic and/or the transmission characteristic of the touch panel 201 can be improved.

Alternatively, as in the third embodiment described above, different types of structures differing in the aspect ratio, for example, may be formed respectively in the first region $R_1$ and the second region $R_2$. By forming different types of the structures in the first and second regions, the antireflection characteristic and/or the transmission characteristic of the touch panel 201 can be further improved. Hence, the electrodes, for example, can be made less visually recognizable. In that case, the transparent electroconductive layer formed in the first region $R_1$ to function as the electrode preferably has a shape following the shape of the structures formed in the first region $R_1$. Such a feature contributes to suppressing a reduction in the effect of improving the antireflection characteristic and/or the transmission characteristic, which is obtained with the presence of the structures.

10. Tenth Embodiment

Figure 31A:
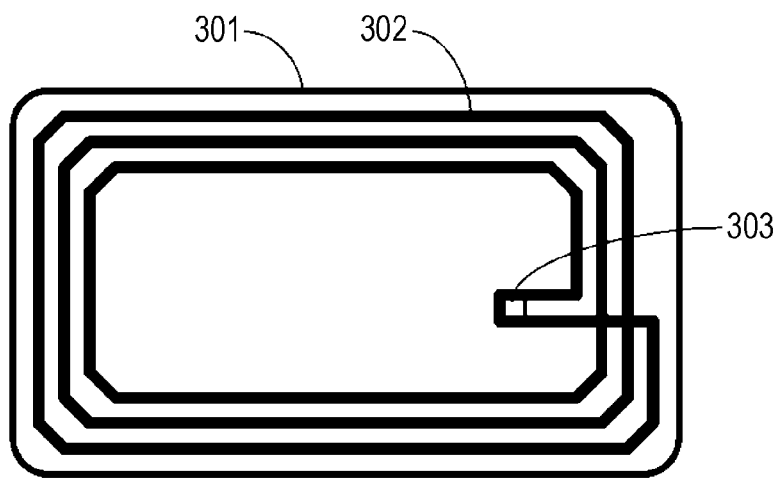
FIG. 31A is a plan view illustrating one example of structure of an IC card according to a tenth embodiment.
Figure 31B:
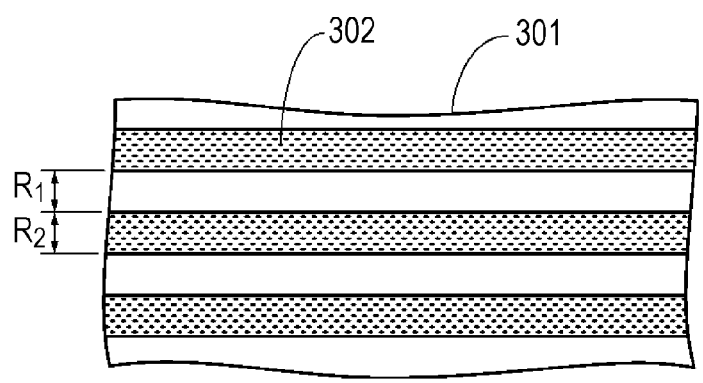
FIG. 31B is an enlarged plan view illustrating a part of the IC card illustrated in FIG. 31A.

FIG. 31A is a plan view illustrating one example of structure of an IC card according to a tenth embodiment, and FIG. 31B is an enlarged plan view illustrating a part of the IC card illustrated in FIG. 31A. The IC card illustrated in FIG. 31A is the so-called non-contact IC card, and it includes a substrate 301, an antenna coil 302, and an IC chip 303. Both the ends of the antenna coil 302 are connected to the IC chip 303. Further, exterior coatings or covers (not shown) are disposed on both the surfaces of the substrate 301.

The substrate 301 can be formed by using a film, a sheet, or a plate. However, the forms of materials for the substrate 301 are not particularly limited to those examples, and other forms of materials can also be optionally used depending on the characteristics demanded for the IC card. From the viewpoint of durability and convenience in use, the substrate 301 is preferably made of a resin material having flexibility. Examples of the resin material usable here include PEN (polyethylene naphthalate), PET (polyethylene terephthalate), polyimide (PI), and polyester. However, the materials of the substrate 301 are not particularly limited to those examples, and other ordinary resin materials can also be optionally used depending on the characteristics demanded for the IC card.

A first region $R_1$ and a second region $R_2$ are alternately formed in, e.g., a spiral shape along peripheral edges of one principal surface of the substrate 301. Surface structures of the substrate 301 in the first region $R_1$ and the second region $R_2$ are similar respectively to those of the substrate in the first and second regions in the electroconductive element according to one of the first to seventh embodiments described above. For example, the substrate surface in the second region R₂ is provided as a wavy surface by forming many structures at a fine pitch, and a transparent electroconductive layer is formed discontinuously, e.g., in a state of islands, on the wavy surface. On the other hand, the substrate surface in the first region R₁ is provided as a flat surface without forming structures therein, and an electroconductive layer is continuously formed in the first region R₁. Thus, the antenna coil 302 made of the continuously formed electroconductive layer is formed along the peripheral edges of the one principal surface of the substrate 301 in shape following that of the first region R₁. Alternatively, as in the third embodiment described above, different types of structures differing in the aspect ratio, for example, may be formed respectively in the first region R₁ and the second region R₂.

The exterior coatings constitute front and rear surfaces of the IC card and contain, as a main component, a high polymeric material, e.g., PET (polyethylene terephthalate), PBT (polybutyl terephthalate), PEG (polyethylene glycol), or oriented PET. However, the materials of the exterior coatings are not particularly limited to those examples, and other ordinary resin materials can also be optionally used depending on the characteristics demanded for the IC card.

The antenna coil 302 is an electromagnetic induction coil, which is formed on the substrate 301 to extend along the peripheral edges thereof plural times in a loop coil shape. Both the ends of the antenna coil 302 are connected to the IC chip 303. The antenna coil 302 receives an AC magnetic field emitted from a reader/writer to induce an AC voltage, and supplies the induced AC voltage to the IC chip 303.

The IC chip 303 is operated with electric power supplied from the antenna coil 302, and it controls various components inside the IC card. For example, the IC chip 303 performs communication with the reader/writer via the antenna coil 302. More specifically, the IC chip 303 performs mutual authentication and transfers data with respect to the reader/writer.

According to the tenth embodiment, the antenna coil 302 of the IC card can be fabricated by utilizing, e.g., the presence or absence of the wavy surface, or the presence or absence of the structures. Thus, since the antenna coil 302 can be fabricated without executing the etching, etc., productivity of the IC card can be improved.

11. Eleventh Embodiment

Figure 32A:
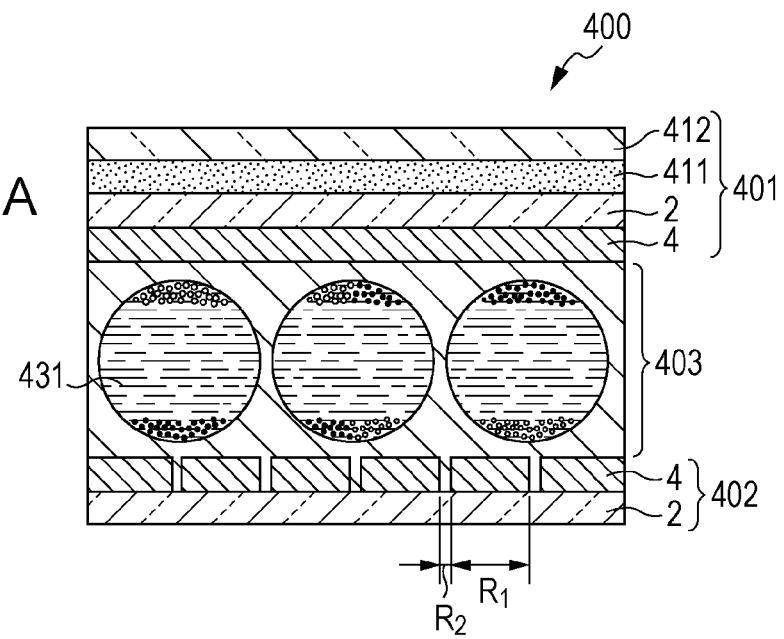
FIG. 32A is a sectional view illustrating one example of structure of a display device according to an eleventh embodiment.
Figure 32B:
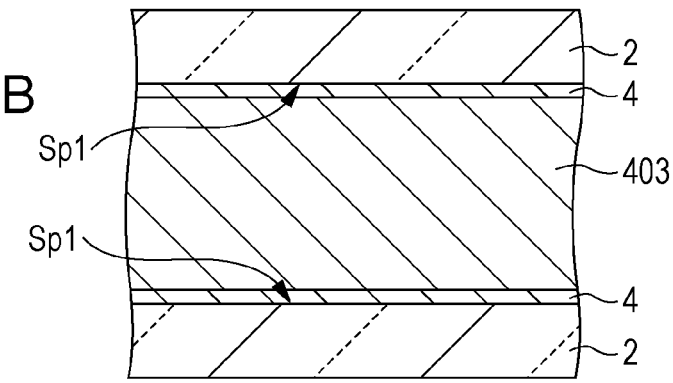
FIG. 32B is an enlarged sectional view illustrating a wiring zone illustrated in FIG. 32A.
Figure 32C:
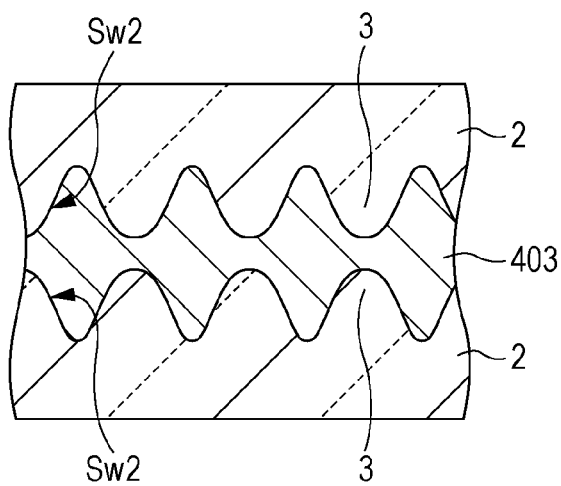
FIG. 32C is an enlarged sectional view illustrating a non-wiring zone illustrated in FIG. 32A.

FIG. 32A is a sectional view illustrating one example of structure of a display device 400 according to an eleventh embodiment, FIG. 32B is an enlarged sectional view illustrating a wiring zone illustrated in FIG. 32A, and FIG. 32C is an enlarged sectional view illustrating a non-wiring zone illustrated in FIG. 32A. In the eleventh embodiment, the same components or corresponding components as or to those in the first embodiment are denoted by the same reference symbols. The display device 400 according to the eleventh embodiment is the so-called electronic paper of the microcapsule electrophoretic type. The display device 400 includes a first electroconductive element 401, a second electroconductive element 402 arranged to face the first electroconductive element 401, and a microcapsule layer (medium layer) 403 disposed between the first and second electroconductive elements. While the eleventh embodiment is described in connection with the application case of the present invention to the electronic paper of the microcapsule electrophoretic type, examples of the electronic paper are not limited to the illustrated one and embodiments of the present invention are applicable to other types of electronic paper as long as they have such a structure that a medium layer is disposed between electroconductive elements arranged to face each other. Herein, the medium includes not only a liquid and a solid, but also gas, e.g., air. Further, capsules, pigments, particles, and other suitable materials may be included in the medium. In addition to the microcapsule electrophoretic type, examples of electronic paper, to which embodiments of the present invention are applicable, include the twist ball type, the thermal rewritable type, the toner display type, the In-Plane electrophoretic type, and the electronic powder and granular type.

The microcapsule layer 403 includes a large number of microcapsules 431. For example, a transparent liquid (dispersion medium) containing black particles and white particles dispersed therein is enclosed in each of the microcapsule 431.

The first electroconductive element 401 includes a substrate 2 having a flat surface Sp1 and a wavy surface Sw2, which are formed on a surface of the first electroconductive element 401 on the side facing the second electroconductive element 402, and an electroconductive layer 4 is formed on the flat surface Sp1 of the substrate 2. The substrate 2 may be affixed, as necessary, to a support 412 made of, e.g., glass with an affixing layer 411, e.g., an adhesive, interposed therebetween. The second electroconductive element 402 includes a substrate 2 having a flat surface Sp1 and a wavy surface Sw2, which are formed on a surface of the second electroconductive element 402 on the side facing the first electroconductive element 401, and an electroconductive layer 4 is formed on the flat surface Sp1 of the substrate 2.

The electroconductive layer 4 provided in each of the first electroconductive element 401 and the second electroconductive element 402 is formed in a predetermined electrode pattern depending on the driving type of the display device (electronic paper) 400. Examples of the driving type of the electronic paper include the simple matrix driving type, the active matrix driving type, and the segment driving type.

Details of the eleventh embodiment in points other than described above are similar to those in the first embodiment.

EXAMPLES

While the present embodiments will be described in more detail in connection with TEST EXAMPLES, practical examples of the present embodiments are not limited to the following TEST EXAMPLES.

In the following TEST EXAMPLES and EXAMPLES, the surface resistance of an electroconductive sheet was measured by using a 4-terminal resistance measuring device. The diameter R of a probe tip needle was set to 100 gm, and the needle pitch was set to 1 mm.

Test Example 1

Transfer Step

First, a quartz master including concave nano-structures formed in a shaped surface thereof was prepared. Next, an ultraviolet curable resin was coated on the quartz master including the concave nano-structures, and a PET (polyethylene terephthalate) sheet including an adhesively attachable layer was brought into close contact with the coated ultraviolet curable resin. In such a state, the ultraviolet curable resin was irradiated with an ultraviolet ray to be cured, while the PET sheet was gradually peeled in time to the progress of the curing step. As a result, an optical sheet including many convex nano-structures formed on the surface of the PET sheet was obtained. The array pitch of the nano-structures was 270 nm, and the height of the nano-structures was 160 nm.

(Film Forming Step)

Next, an ITO film was formed on the optical sheet by sputtering. A degree of ultimate vacuum was set to 0.00015 Pa, and a degree of vacuum during a film forming step was set to 0.24 Pa. During the film forming step, Ar gas and $O_2$ gas were introduced at a mixing ratio of $Ar:O_2=200:13$. Further, film forming conditions were adjusted such that a film thickness of 30 nm in terms of a flat sheet was obtained. Note that the film thickness in terms of a flat sheet is substantially equal to a film thickness in an apex portion of the structure.

(Annealing Step)

Next, the optical sheet including the ITO film formed thereon was subjected to annealing at 150° C. for 30 minutes in the atmosphere. With the annealing, conversion of the ITO film into a polycrystalline state was progressed. Next, the ITO film was measured with X-ray diffraction (XRD) in order to confirm the progress of the conversion into the polycrystalline state. As a result, a peak of $In_2O_3$ was observed. Next, a surface resistance value of the ITO film was measured by the 4-terminal probe method. As a result, the surface resistance value was 350Ω/(unit area).

(Etching Step)

Next, the optical sheet having been subjected to the annealing was dipped in a solution with pH of about 3 for 20 seconds.

(Washing Step)

Next, the optical sheet having been subjected to the etching was washed with pure water. Next, a surface resistance value of the optical sheet was measured by the 4-terminal probe method. As a result, it was confirmed that the sheet surface was insulated.

Through the above-described steps, an objective optical sheet was obtained.

Test Example 2

An optical sheet was obtained in a similar manner to that in TEST EXAMPLE 1 except for setting the array pitch of the nano-structures to 250 nm and the height of the nano-structures to 190 nm. After the annealing step of the ITO film, a surface resistance value of the optical sheet was measured in a similar manner to that in TEST EXAMPLE 1. As a result, the surface resistance value was 550Ω/□. Further, after the washing step, a surface resistance value of the optical sheet was measured in a similar manner to that in TEST EXAMPLE 1. As a result, it was confirmed that the sheet surface was insulated.

Test Example 3

An optical sheet was obtained in a similar manner to that in TEST EXAMPLE 1 except that the ITO film was formed on a flat smooth surface of the PET sheet without forming structures on the PET sheet. After the annealing step of the ITO film, a surface resistance value of the optical sheet was measured in a similar manner to that in TEST EXAMPLE 1. As a result, the surface resistance value was 200Ω/□. Further, after the washing step, a surface resistance value of the optical sheet was measured in a similar manner to that in TEST EXAMPLE 1. As a result, the surface resistance value was 200Ω/□.

(Evaluation of Reflection Characteristic)

Spectral reflectivity was measured on the optical sheet according to TEST EXAMPLE 2 before and after the etching step described above. The measured results are plotted in FIG. 33.

Table 1 lists the structural conditions and the evaluation results of the optical sheets according to TEST EXAMPLES 1 to 3.

TABLE 1

|  | TEST EXAMPLE 1 | TEST EXAMPLE 2 | TEST EXAMPLE 3 |
| --- | --- | --- | --- |
| Array pitch of structures [nm] | 270 | 160 | no structures |
| Height of structure [nm] | 250 | 190 | no structures |
| Shape of structure | truncated conical | truncated conical | truncated conical |
| Array pattern of structures | hexagonal array | hexagonal array | hexagonal array |
| Resistance before etching (Ω/□) | 350 | 550 | 200 |
| Resistance after etching (Ω/□) | insulated | insulated | 200 |

The following points are understood from Table 1.

In TEST EXAMPLES 1 and 2 in which the ITO films are formed on the structures, the surface resistance of the optical sheet is greatly changed between before and after the etching, and the optical sheet surface is changed from the conducted state to the insulated state. On the other hand, in TEST EXAMPLE 3 in which the ITO film is formed on the flat smooth surface, the surface resistance of the optical sheet is not changed between before and after the etching, and the conducted state is maintained.

Figure 33:
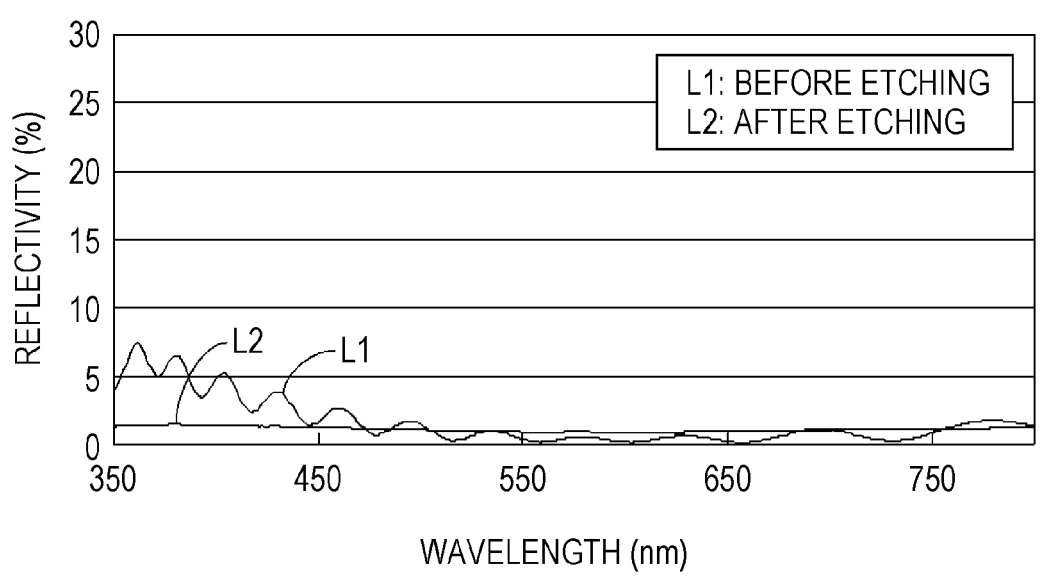
FIG. 33 is a chart illustrating spectral reflectivity of an optical sheet used in TEST EXAMPLE 2 before and after etching.

The following points are understood from FIG. 33.

Before the etching, an increase of reflection in a shorter wavelength band attributable to the ITO film is confirmed. In contrast, after the etching, such an increase of reflection in the shorter wavelength band is not confirmed and a substantially flat spectral curve is obtained in a wavelength band of 350 to 800 nm.

Considering the above-described evaluation results together, in the optical sheets according to TEST EXAMPLES 1 and 2, the ITO film is removed from the optical sheet surface after the etching. In the optical sheet according to TEST EXAMPLE 3, however, the ITO film still remains even after the etching while it maintains the form of a thin film. Accordingly, an electroconductive pattern, such as a wiring pattern, can be formed on the substrate surface by utilizing the presence or absence of the structures on the optical sheet surface. Stated another way, an electroconductive pattern, such as a wiring pattern, can be formed on the substrate surface by utilizing the difference between the wavy surface and the flat surface in the optical sheet surface.

Example 1

Transfer Step

Figure 34A:
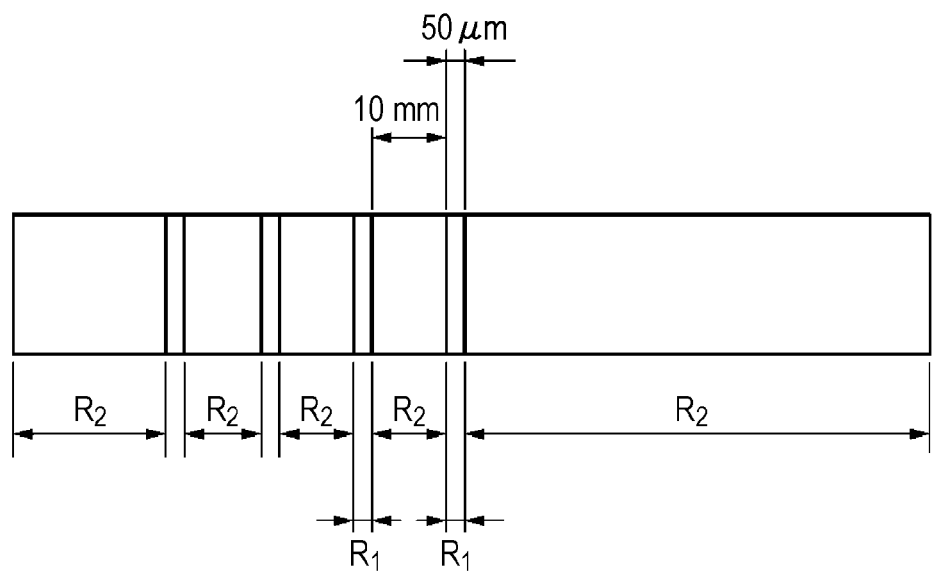
FIG. 34A illustrates a shaping surface of a quartz master used in fabricating a transparent electroconductive sheet according to EXAMPLE 1.

First, as illustrated in FIG. 34A, a quartz master including a nano-structure arrayed region (first region) $R_1$ and a flat region (second region) $R_2$ both formed in a shaped surface thereof in a striped pattern was prepared. Next, an ultraviolet curable resin was coated on the shaped surface of the quartz master, and a PET sheet including an adhesively attachable layer was brought into close contact with the coated ultraviolet curable resin. In such a state, the ultraviolet curable resin was irradiated with an ultraviolet ray to be cured, while the PET sheet was gradually peeled in time to the progress of the curing step. As a result, an optical sheet including many convex nano-structures formed in the nano-structure arrayed region (first region) $R_1$ of the PET sheet and a flat surface formed in the flat region (second region) $R_2$ thereof was obtained. The array pitch of the nano-structures was 250 nm, and the height of the nano-structure was 200 nm. The shape of the nano-structure was truncated-conical, and the array of the nano-structure was hexagonal.

(Film Forming Step)

Next, an ITO film was formed on the shaped surface of the optical sheet by sputtering. A degree of ultimate vacuum was set to 0.00015 Pa, and a degree of vacuum during a film forming step was set to 0.24 Pa. During the film forming step, Ar gas and $O_2$ gas were introduced at a mixing ratio of Ar:$O_2$=200:13. Further, film forming conditions were adjusted such that a film thickness of 30 nm in terms of a flat sheet was obtained. Note that the film thickness in terms of a flat sheet is substantially equal to a film thickness in an apex portion of the structure.

(Annealing Step)

Next, the optical sheet including the ITO film formed thereon was subjected to annealing at 150° C. for 30 minutes in the atmosphere. With the annealing, conversion of the ITO film into a polycrystalline state was progressed. Next, the ITO film was measured with X-ray diffraction (XRD) in order to confirm the progress of the conversion into the polycrystalline state. As a result, a peak of $In_2O_3$ was observed.

(Etching Step)

Next, the optical sheet having been subjected to the annealing was dipped in a solution with pH of about 3 for 20 seconds.

(Washing Step)

Next, the optical sheet having been subjected to the etching was washed with pure water.

Through the above-described steps, an objective transparent electroconductive sheet was obtained.

(Conduction/Non-Conduction Evaluation)

Figure 34B:
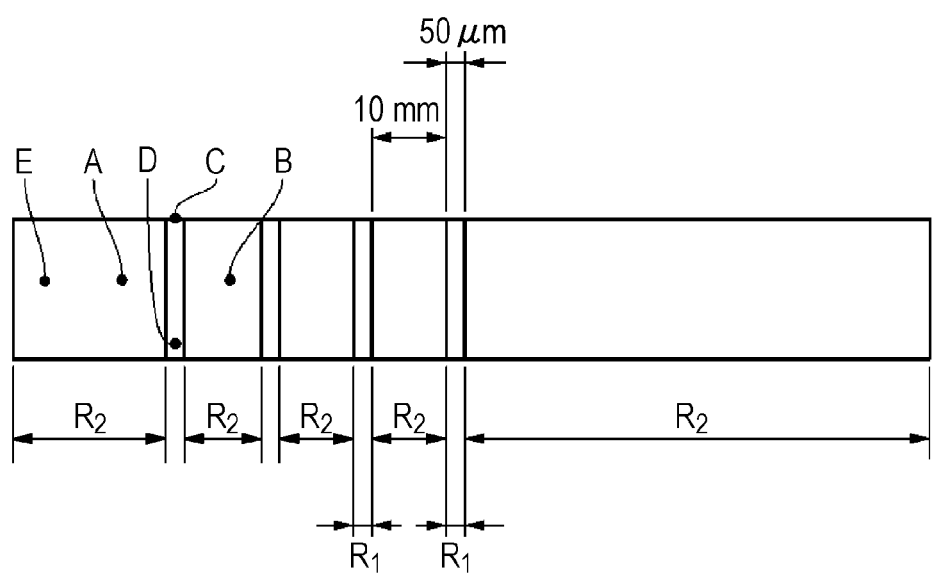
FIG. 34B illustrates points for evaluating conduction/non-conduction of the transparent electroconductive sheet according to EXAMPLE 1.

Conduction/non-conduction was evaluated on the surface of the thus-obtained transparent electroconductive sheet according to EXAMPLE 1 at points, illustrated in FIG. 34B, by using a tester. The evaluated conduction/non-conduction is indicated as "conducted" and "insulated" in Table 2.

Thus, Table 2 represents the evaluation results of the transparent electroconductive sheet according to EXAMPLE 1.

TABLE 2

|  | Between A and B | Between E and A | Between C and D |
|---|---|---|---|
| EXAMPLE 1 | insulated | insulated | 2000 Ω (conducted) |

The following points are understood from Table 2.

Of the surface of the transparent electroconductive sheet, the nano-structure arrayed region (first region) $R_1$ is in the insulated state, whereas the flat surface region (second region) $R_2$ is in the conducted state. Hence, a desired electroconductive pattern, such as a wiring or electrode pattern, can be formed on the substrate surface just by successively carrying out the in-printing step, the film forming step, and the etching step. As a result, the throughput can be increased.

Test Example 4-1

Film Forming Step

First, a PET sheet having a flat smooth surface was prepared. Next, an ITO film was formed on the PET sheet by sputtering. A degree of ultimate vacuum was set to 0.00015 Pa, and a degree of vacuum during a film forming step was set to 0.24 Pa. During the film forming step, Ar gas and $O_2$ gas were introduced at a mixing ratio of Ar:$O_2$=20:1. Further, film forming conditions were adjusted such that the ITO film had a thickness of 30 nm.

(Annealing Step)

Next, the PET sheet including the ITO film formed thereon was subjected to annealing at 150° C. for 60 minutes in the atmosphere. With the annealing, conversion of the ITO film into a polycrystalline state was progressed. Next, the ITO film was measured with X-ray diffraction (XRD) in order to confirm the progress of the conversion into the polycrystalline state. As a result, a peak of $In_2O_3$ was observed.

Through the above-described steps, an objective optical sheet was obtained.

Test Example 4-2

Film Forming Step and Annealing Step

First, a PET film including an annealed ITO film was fabricated by carrying out a film forming step and an annealing step in a similar manner to that in TEST EXAMPLE 4-1.

(Etching Step)

Next, the PET film having been subjected to the annealing was dipped in a solution with pH of about 3 for 10 seconds, thereby etching the ITO film.

(Washing Step)

Next, the PET film having been subjected to the etching was washed by successively using pure water, IPA (isopropyl alcohol), and pure water in the order named.

Through the above-described steps, an objective optical sheet was obtained.

Test Example 4-3

An optical sheet was obtained in a similar manner to that in TEST Example 4-2 except for changing the dipping time to 20 seconds.

Test Example 4-4

An optical sheet was obtained in a similar manner to that in TEST Example 4-2 except for changing the dipping time to 30 seconds.

Test Example 4-5

An optical sheet was obtained in a similar manner to that in TEST Example 4-2 except for changing the dipping time to 40 seconds.

Test Example 4-6

An optical sheet was obtained in a similar manner to that in TEST Example 4-2 except for changing the dipping time to 50 seconds.

Test Example 4-7

An optical sheet was obtained in a similar manner to that in TEST Example 4-2 except for changing the dipping time to 60 seconds.

Test Example 5-1

Transfer Step

First, a quartz master including concave nano-structures formed in a shaped surface thereof was prepared. Next, an ultraviolet curable resin was coated on the quartz master including the concave nano-structures, and a PET sheet including an adhesively attachable layer was brought into close contact with the coated ultraviolet curable resin. In such a state, the ultraviolet curable resin was irradiated with an ultraviolet ray to be cured, while the PET sheet was gradually peeled in time to the progress of the curing step. As a result, the PET sheet including many convex nano-structures formed on its surface was obtained.

Detailed structural data of the nano-structures formed on the surface of the PET sheet are as follows.

Array of the structures: hexagonal lattice array
Concave-convex shape of the structure: convex
Entire shape of the structure: truncated conical
Array pitch of the structures: 250 nm
Height of the structure: 90 nm
Aspect ratio of the structure: 0.36

(Film Forming Step)

Next, an ITO film was formed on the surface of the PET sheet, including the nano-structures formed thereon, by sputtering. A degree of ultimate vacuum was set to 0.00015 Pa, and a degree of vacuum during a film forming step was set to 0.24 Pa. During the film forming step, Ar gas and $O_2$ gas were introduced at a mixing ratio of Ar:$O_2$=20:1. Further, film forming conditions were adjusted such that a film thickness of 30 nm in terms of a flat sheet was obtained. Note that the film thickness in terms of a flat sheet is defined as a film thickness resulting from forming an ITO film on a flat sheet under the same conditions as those when the ITO film is formed on the surface of the PET sheet, including the nano-structures formed thereon. According to the knowledge obtained with experiments conducted by the inventors, the film thickness in terms of a flat sheet is substantially equal to a film thickness in an apex portion of the structure.

(Annealing Step)

Next, the PET sheet including the ITO film formed thereon was subjected to annealing at 150° C. for 60 minutes in the atmosphere. With the annealing, conversion of the ITO film into a polycrystalline state was progressed. Next, the ITO film was measured with X-ray diffraction (XRD) in order to confirm the progress of the conversion into the polycrystalline state. As a result, a peak of $In_2O_3$ was observed.

Through the above-described steps, an objective optical sheet was obtained.

Test Example 5-2

Film Forming Step and Annealing Step

First, a PET film including an annealed ITO film was fabricated by carrying out a film forming step and an annealing step in a similar manner to that in TEST EXAMPLE 5-1.

(Etching Step)

Next, the PET film having been subjected to the annealing was dipped in a solution with pH of about 3 for 10 seconds, thereby etching the ITO film.

(Washing Step)

Next, the PET film having been subjected to the etching was washed by successively using pure water, IPA, and pure water in the order named.

Through the above-described steps, an objective optical sheet was obtained.

Test Example 5-3

An optical sheet was obtained in a similar manner to that in TEST Example 5-2 except for changing the dipping time to 20 seconds.

Test Example 6-1

An optical sheet was obtained in a similar manner to that in TEST Example 5-1 except for setting the array pitch of the structures to 250 nm, the height of the structure to 120 nm, and the aspect ratio of the structure to 0.48.

Test Example 6-2

An optical sheet was obtained in a similar manner to that in TEST Example 5-2 except for setting the array pitch of the structures to 250 nm, the height of the structure to 120 nm, and the aspect ratio of the structure to 0.48.

Test Example 6-3

An optical sheet was obtained in a similar manner to that in TEST Example 5-3 except for setting the array pitch of the structures to 250 nm, the height of the structure to 120 nm, and the aspect ratio of the structure to 0.48.

Test Example 7-1

An optical sheet was obtained in a similar manner to that in TEST Example 5-1 except for setting the array pitch of the structures to 250 nm, the height of the structure to 155 nm, and the aspect ratio of the structure to 0.62.

Test Example 7-2

An optical sheet was obtained in a similar manner to that in TEST Example 5-2 except for setting the array pitch of the structures to 250 nm, the height of the structure to 155 nm, and the aspect ratio of the structure to 0.62.

Test Example 7-3

An optical sheet was obtained in a similar manner to that in TEST Example 5-3 except for setting the array pitch of the structures to 250 nm, the height of the structure to 155 nm, and the aspect ratio of the structure to 0.62.

Test Example 8-1

Film Forming Step and Annealing Step

A prism sheet including an annealed ITO film was fabricated by carrying out a film forming step and an annealing step in a similar manner to that in TEST EXAMPLE 5-1 except for using the following prism sheet.

Through the above-described steps, an objective optical sheet was obtained.

Detailed structural data of the prism sheet are as follows.
Array of prisms (structures): one-dimensional array
Concave-convex shape of the prism: convex
Shape of the prism: columnar shape having an isosceles-triangular cross-section
Array pitch of the prisms: 10 gm
Height of the prism: 5 gm
Aspect ratio of the prism: 0.50

Test Example 8-2

Film Forming Step and Annealing Step

First, a prism sheet including an annealed ITO film was fabricated by carrying out a film forming step and an annealing step in a similar manner to that in TEST EXAMPLE 8-1.
(Etching Step)
Next, the prism sheet having been subjected to the annealing was dipped in a solution with pH of about 3 for 10 seconds, thereby etching the ITO film.
(Washing Step)
Next, the prism sheet having been subjected to the etching was washed by successively using pure water, IPA, and pure water in the order named.
Through the above-described steps, an objective optical sheet was obtained.

Test Example 8-3

An optical sheet was obtained in a similar manner to that in TEST Example 8-2 except for changing the dipping time to 20 seconds.

Test Example 8-4

An optical sheet was obtained in a similar manner to that in TEST Example 8-2 except for changing the dipping time to 30 seconds.

Test Example 8-5

An optical sheet was obtained in a similar manner to that in TEST Example 8-2 except for changing the dipping time to 40 seconds.
(Surface Resistance)
Surface resistance values of the optical sheets, obtained as described above according to TEST EXAMPLES 1-1 to 8-5, were measured by the 4-terminal probe method. The measured results are listed in Table 3.
(Reciprocal of Initial Change Rate)
The reciprocal of an initial change rate (i.e., the change of an imaginary thickness) for each surface of the optical sheets, obtained as described above according to TEST EXAMPLES 1-1 to 8-5, were determined based on the following formula. The measured results are represented in Table 4 and FIG. 35.

TABLE 3

|  | Pitch | Height | Aspect Ratio | Dipping Time (sec) | | | | | | |
|---|---|---|---|---|---|---|---|---|---|---|
|  |  |  |  | 0 | 10 | 20 | 30 | 40 | 50 | 60 |
| TEST EXAMPLES 4-1 TO 4-7 | 0 | 0 | 0.00 | 208 | 187 | 193 | 194 | 197 | 201 | 201.8 |
| TEST EXAMPLES 5-1 TO 5-3 | 250 nm | 90 nm | 0.36 | 228 | 568 | ∞ | — | — | — | — |
| TEST EXAMPLES 6-1 TO 6-3 | 250 nm | 120 nm | 0.48 | 258 | 2900 | ∞ | — | — | — | — |
| TEST EXAMPLES 7-1 TO 7-3 | 250 nm | 155 nm | 0.62 | 309 | 9000 | ∞ | — | — | — | — |
| TEST EXAMPLES 8-1 TO 8-5 | 10 μm | 5 μm | 0.50 | 282 | 634 | 740 | 3000 | ∞ | — | — |

(Reciprocal of initial change rate) = (surface resistance of sample before etching)/(surface resistance of sample after etching)
unit: Ω/□

TABLE 4

|  | Pitch | Height | Aspect Ratio | Dipping Time (sec) | | | | | | |
|---|---|---|---|---|---|---|---|---|---|---|
|  |  |  |  | 0 | 10 | 20 | 30 | 40 | 50 | 60 |
| TEST EXAMPLES 4-1 TO 4-7 | 0 | 0 | 0.00 | 1 | 1.11 | 1.08 | 1.07 | 1.06 | 1.03 | 1.03 |
| TEST EXAMPLES 5-1 TO 5-3 | 250 nm | 90 nm | 0.36 | 1 | 0.40 | 0 | — | — | — | — |
| TEST EXAMPLES 6-1 TO 6-3 | 250 nm | 120 nm | 0.48 | 1 | 0.09 | 0 | — | — | — | — |
| TEST EXAMPLES 7-1 TO 7-3 | 250 nm | 155 nm | 0.62 | 1 | 0.03 | 0 | — | — | — | — |
| TEST EXAMPLES 8-1 TO 8-5 | 10 μm | 5 μm | 0.50 | 1 | 0.44 | 0.38 | 0.09 | 0 | — | — |

(Reciprocal of initial change rate) = (surface resistance of sample before etching)/(surface resistance of sample after etching)

Figure 35:
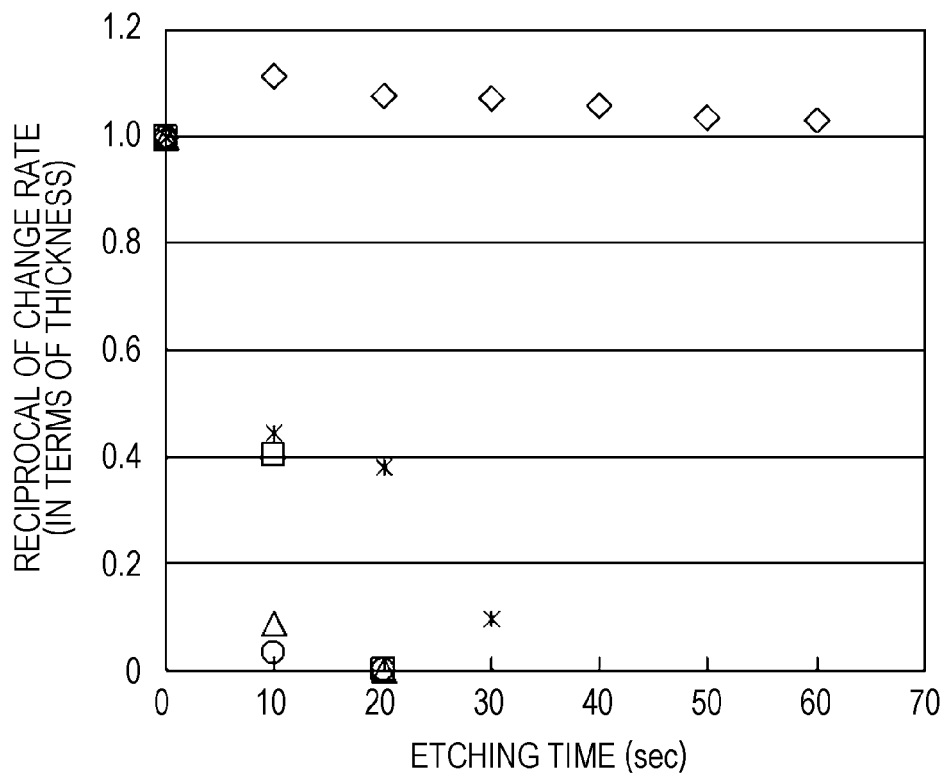
FIG. 35 is a graph plotting the relationship between the reciprocal of a change rate (i.e., change of imaginary thickness) with respect to an initial resistance value and an etching time.

The following points are understood from Table 3, Table 4, and FIG. 35.

In TEST EXAMPLES 4-1 to 4-7 in each of which the ITO film is formed on the flat surface, there is a tendency that the thickness of the ITO film is hardly changed by the etching and the surface resistance is held substantially constant. On the other hand, in TEST EXAMPLES 5-1 to 5-3, 6-1 to 6-3, and 7-1 to 7-3 in each of which the ITO film is formed on the many structures, there is a tendency that the thickness of the ITO film is steeply reduced by the etching and the surface resistance is steeply increased.

In TEST EXAMPLES 8-1 to 8-5 in each of which the many structures are formed at the array pitch on the micron order, there is a similar tendency to that in TEST EXAMPLES 5-1 to 5-3, 6-1 to 6-3, and 7-1 to 7-3 in each of which the many structures are formed at the array pitch on the nano order.

The structures, the methods, the shapes, the materials, the numerical values, etc. mentioned in the foregoing embodiments are to be construed just as illustrative, and different structures, methods, shapes, materials, numerical values, etc. may also be used case by case depending on demands.

Further, the features of the foregoing embodiments can be practiced in a combined manner.

While the forgoing embodiments have been described in connection with the application case of a single-layer electroconductive element in which a wiring pattern is formed on one or both surfaces thereof, embodiments are not limited to that case and are further applicable to a multilayer electroconductive element as well.

While the forgoing embodiments have been described in connection with the application case of a wiring pattern formed on the flat substrate surfaces, the surface on which a wiring pattern is to be formed is not limited to the flat surface, and the wiring pattern may be formed on a curved substrate surface.

While the forgoing embodiments have been described in connection with the application case of a liquid crystal display device, embodiments are not limited to that case and are further applicable to various display devices of the passive matrix driving type (such as an EL device and the so-called electronic paper).

While the forgoing embodiments have been described in connection with the application case of a touch panel of the projection capacitance type in which two substrates are stacked one above the other, embodiments are not limited to that case and are further applicable to, e.g., a touch panel of the projection capacitance type in which electrodes are formed on both opposite surfaces of one substrate.

While the forgoing embodiments have been described in connection with the application case of a display device and an information input device as examples of electronic apparatus, embodiments are not limited to that case and are further applicable to various types of electronic apparatus including a display device, a wiring element (such as a printed circuit board), etc.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The invention is claimed as follows:

1. An electroconductive element comprising: a substrate having a first region with a first wavy surface and a second region with a second wavy surface, which are alternately formed thereon, each wavy surface having a concave-convex surface including a plurality of structures formed with an array pitch corresponding to a wavelength not longer than wavelengths of a visible light; and
an electroconductive layer continuously formed on the first wavy surface, but not formed on the second wavy surface such that the second region functions as an electrically insulating region that establishes electrical insulation between the electroconductive layers formed on the adjacent first regions on both sides of the second region, and
wherein the electroconductive layer forms an electroconductive pattern, and the first wavy surface and the second wavy surface satisfy following relationship, $$0<(Am1/\lambda m1)<(Am2/\lambda m2)\leq 1.8$$

where Am1 is a mean amplitude of vibrations of the first wavy surface, Am2 is a mean amplitude of vibrations of the second wavy surface, $\lambda m1$ is a mean wavelength of the first wavy surface, and $\lambda m2$ is a mean wavelength of the second wavy surface.

2. An electroconductive element comprising: a substrate having a first region with a first wavy surface and a second region with a second wavy surface, which are alternately formed thereon, each wavy surface having a concave-convex surface including a plurality of structures formed with an array pitch corresponding to a wavelength not longer than wavelengths of visible light; and
an electroconductive layer continuously formed on the first wavy surface, but not formed at all or formed in a discontinuous manner on the second wavy surface such that the second region functions as an electrically insulating region that establishes electrical insulation between the electroconductive layers formed on the adjacent first regions on both sides of the second region, and
wherein the electroconductive layer forms an electroconductive pattern, and the first wavy surface and the second wavy surface satisfy following relationship, $$0<(Am1/\lambda m1)<(Am2/\lambda m2)\leq 1.8$$

where $\lambda m1$ is a mean wavelength of the first wavy surface, and $\lambda m2$ is a mean wavelength of the second wavy surface, and a mean amplitude Am2 of vibrations of the second wavy surface is larger than a mean amplitude Am1 of vibrations of the first wavy surface.

3. An electroconductive element according to claim 1, wherein the first wavy surface and the second wavy surface satisfy following relationships, and
the mean wavelength $\lambda m2$ of the second wavy surface is not longer than wavelengths of visible light, $$(Am1/\lambda m1)=0 \text{ and } 0<(Am2/\lambda m2)\leq 1.8.$$

4. The electroconductive element according to claim 1, wherein the first wavy surface and the second wavy surface satisfy following relationship, and
the mean wavelength $\lambda m1$ of the first wavy surface is not longer than wavelengths of visible light, $$0<(Am1/\lambda m1)<(Am2/\lambda m2)\leq 1.8.$$

5. The electroconductive element according to claim 1, wherein the first wavy surface and the second wavy surface satisfy following relationships, and
the mean wavelength $\lambda m2$ of the second wavy surface is not shorter than 100 nm, $$(Am1/\lambda m1)=0 \text{ and } 0<(Am2/\lambda m2)\leq 1.8.$$

6. The electroconductive element according to claim 1, wherein the first wavy surface and the second wavy surface satisfy following relationship, and the mean wavelength λm1 of the second wavy surface and the mean wavelength λm2 of the second wavy surface are each not shorter than 100 nm, $$0<(Am1/\lambda m1)<(Am2/\lambda m2)\leq 1.8.$$

7. The electroconductive element according to claim 1, further comprising a residual film, which is partly formed on the second wavy surface by removing the electroconductive layer coated on the first wavy surface as well as on the second wavy surface, wherein the electroconductive layer and the residual film satisfy following relationship, $$S1>S2$$

wherein S1 is an area of the electroconductive layer, and S2 is an area of the residual film.

8. The electroconductive element according to claim 7, wherein the electroconductive layer formed on the first wavy surface is continuously formed on the first wavy surface, and the residual film formed on the second wavy surface is discontinuously formed on the second wavy surface.

9. The electroconductive element according to claim 1, further comprising a residual film, which is partly formed on the second wavy surface by removing the electroconductive layer coated on the first wavy surface as well as on the second wavy surface, wherein the electroconductive layer and the residual film satisfy following relationship, $$d1>d2$$

wherein d1 is a thickness of the electroconductive layer, and d2 is a thickness of the residual film.

10. The electroconductive element according to claim 1, wherein surface resistance of the electroconductive layer is 5000Ω/□ (unit area) or below.

11. The electroconductive element according to claim 1, wherein the electroconductive layer contains at least one selected from a group including an electroconductive high polymer, metallic nano-particles, and carbon nano-tubes.

12. The electroconductive element according to claim 1, wherein the electroconductive layer contains a transparent oxide semiconductor.

13. The electroconductive element according to claim 1, wherein the transparent oxide semiconductor is indium tin oxide or zinc oxide.

14. The electroconductive element according to claim 1, wherein the electroconductive layer is in a mixed state of an amorphous phase and a polycrystalline phase.

15. The electroconductive element according to claim 1, wherein the electroconductive pattern is a wiring pattern.

16. A wiring element including the electroconductive element according to claim 1.

17. An information input device including the electroconductive element according to claim 1.

18. A display device including the electroconductive element according to claim 1.

19. An electronic apparatus including the electroconductive element according to claim 1.

* * * * *